(12) United States Patent
Hirobe

(10) Patent No.: US 9,053,762 B2
(45) Date of Patent: Jun. 9, 2015

(54) PIPELINE-CONTROLLED SEMICONDUCTOR MEMORY DEVICE WITH REDUCED POWER CONSUMPTION AND MEMORY ACCESS TIME

(75) Inventor: Atsunori Hirobe, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 13/468,626

(22) Filed: May 10, 2012

(65) Prior Publication Data

US 2012/0287729 A1    Nov. 15, 2012

(30) Foreign Application Priority Data

May 10, 2011   (JP) .................................. 2011-105119

(51) Int. Cl.
*G11C 7/10*    (2006.01)
*G11C 11/4076*    (2006.01)

(52) U.S. Cl.
CPC ................ *G11C 7/10* (2013.01); *G11C 7/1066* (2013.01); *G11C 11/4076* (2013.01); *G11C 2207/2272* (2013.01)

(58) Field of Classification Search
CPC .... G11C 7/10; G11C 7/1039; G11C 11/4076; G11C 2207/2272

USPC ............. 365/51, 72, 63, 189.18, 189.19, 194, 365/191, 149, 189.17, 189.05, 233.13, 365/233.18, 233.19
See application file for complete search history.

(56) References Cited

U.S. PATENT DOCUMENTS

| | | | |
|---|---|---|---|
| 6,504,747 B2 * | 1/2003 | Braun et al. | 365/145 |
| 6,577,548 B1 * | 6/2003 | Barth et al. | 365/210.13 |
| 6,643,164 B2 * | 11/2003 | Laurent | 365/149 |
| 6,882,561 B2 * | 4/2005 | Kwon et al. | 365/149 |
| 7,222,224 B2 | 5/2007 | Woo et al. | |

FOREIGN PATENT DOCUMENTS

JP    2008-500668 A    1/2008

* cited by examiner

*Primary Examiner* — Andrew Q Tran
(74) *Attorney, Agent, or Firm* — Foley & Lardner LLP

(57) ABSTRACT

A semiconductor device includes a memory cell array including a plurality of memory array basic units. A first bus for transfer of address/control signals, includes a first buffer circuit operating as a pipeline register. A second bus for bidirectional transfer of write/read data, includes a second buffer circuit operating as a pipeline register. A first control circuit sequentially sends the address/control signals on the first bus, and a second control circuit sequentially sends/receives write/read data on the second bus.

18 Claims, 35 Drawing Sheets

PROTOTYPE

PROTOTYPE

PROTOTYPE

PROTOTYPE

PROTOTYPE

FIG. 9 PROTOTYPE

FIG. 10 PROTOTYPE

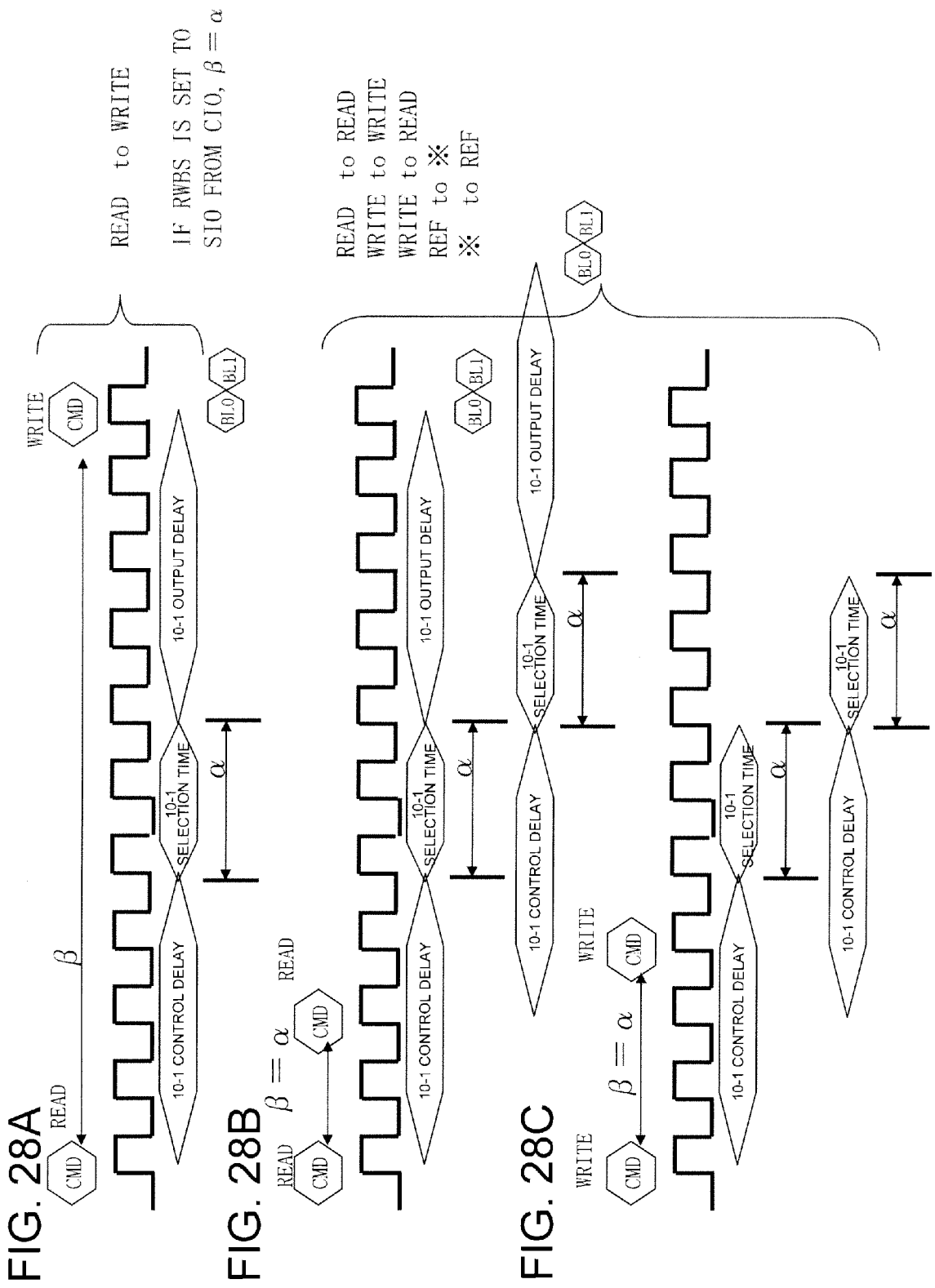

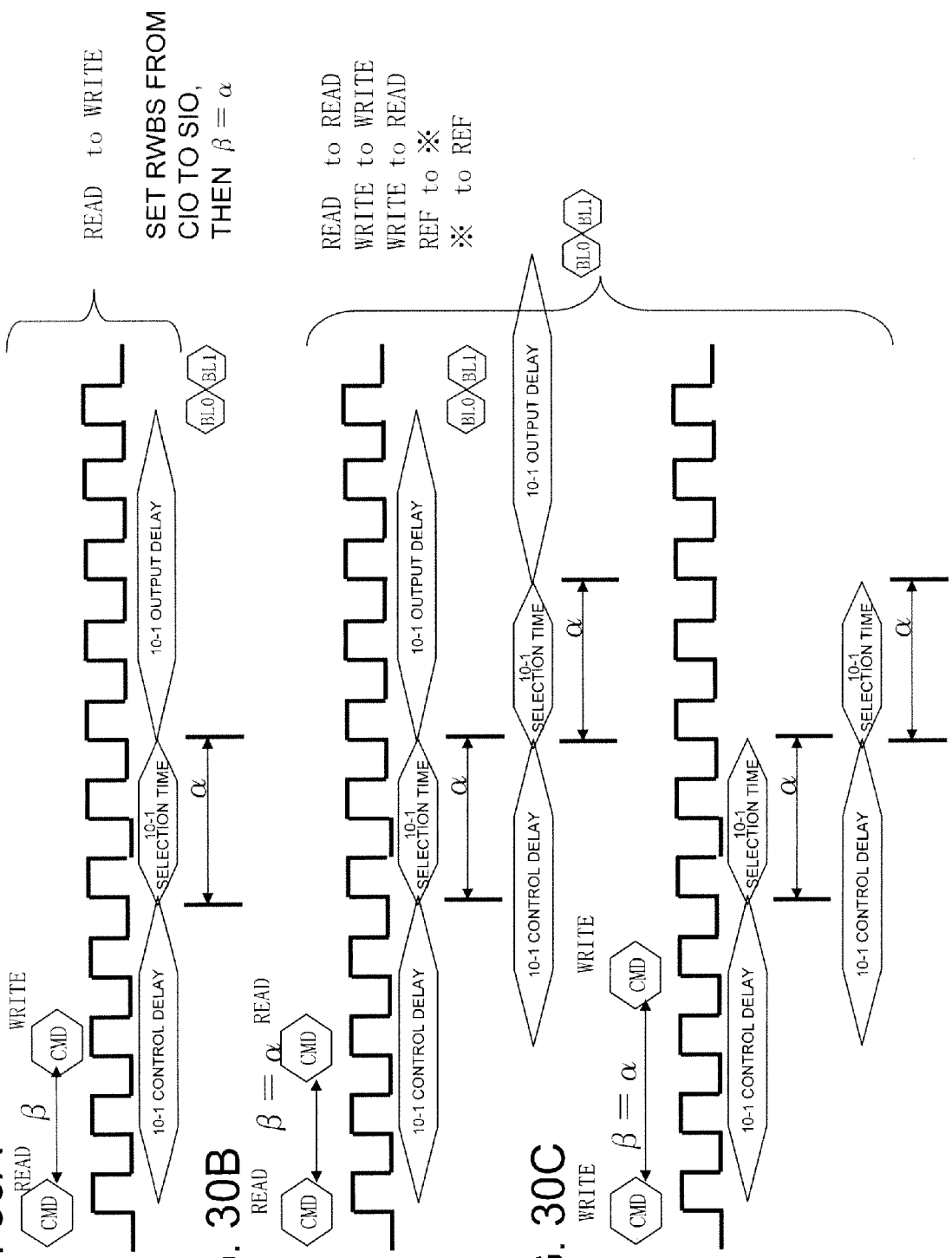

PIPELINE-CONTROLLED SEMICONDUCTOR MEMORY DEVICE WITH REDUCED POWER CONSUMPTION AND MEMORY ACCESS TIME

REFERENCE TO RELATED APPLICATION

This application is based upon and claims the benefit of the priority of Japanese patent application No. 2011-105119, filed on May 10, 2011, the disclosure of which is incorporated herein in its entirety by reference thereto.

TECHNICAL FIELD

This invention relates to a semiconductor device and, more particularly, to a semiconductor device including a memory cell array.

BACKGROUND

The recent tendency in semiconductor memories, such as DRAMs (Dynamic Random Access Memories), is towards more sophisticated function, higher operating speed and larger capacity. In addition, a memory input/output data band width is also appreciably improved with the introduction of an architecture such as DDR (Double Data Rate)/DDR2/DDR3.

To improve memory input/output data band width, the amount of data that may be handled needs to be increased by improving memory READ or WRITE cycle time (tRC: ROW CYCLE TIME) or the number of simultaneous operations (parallel operations) in a memory or increasing the number of banks in the memory cell array. The number of simultaneous operations, or the number of parallel operations, needs to be increased by increasing the number of parallel lines.

In a well-known manner, the consumed power P may be approximated by the following equation (1):

$$n \times c \times f \times V^2 \quad (1)$$

In the equation (1), n is the number of elements, c is capacitance (output load capacitance charged/discharged by the elements), f is the operating frequency, and V is the operating voltage. The derivation of the equation (1) will now be explained briefly. The power P is an average of the power consumed when an element charges/discharges the output load capacitance (dynamic dissipation). With the operating frequency (in actuality, the toggle frequency) f and with the output load capacitance CL, the power may be expressed as the sum of the power when an output of an element Vout rises from Low (0V) to High (VDD) and the power when the output Vout falls from High (VDD) to Low (0V), and may be approximated by $$Pd = \frac{C_L}{tp} \int_0^{V_{DD}} V_{out} dV_{out} + \frac{C_L}{tp} \int_{V_{DD}}^0 (V_{DD} - V_{out}) d(V_{DD} - V_{out})$$
$$= \frac{C_L V_{DD}^2}{2tp} + \frac{C_L V_{DD}^2}{2tp}$$
$$= \frac{C_L V_{DD}^2}{tp}$$
$$= C_L V_{DD}^2 f \quad (2)$$

where tp=1/f.

For n elements (n output lines), the equation (2) is multiplied by n and the capacitance load CL of each output is given a common value c to give the equation (1).

For example, if the data band width (transfer efficiency) is doubled by improving the operating frequency f, the power is also increased. In a memory cell array, it is desired not only to increase the data amount but also to reduce power consumption.

In Patent Document 1, there is disclosed a memory system that supports multiple memory access latency time. FIG. 1 herein shows the configuration of the system disclosed in Patent Document 1 (FIG. 1 is cited from FIG. 2A of Patent Document 1). The configuration of FIG. 1 controls the access to memory devices in the memory system. The memory devices are classed into a group near to a memory controller 202 (latency time group 1) and another group remote from it (latency time group 2). The global access latency is reduced by assigning data frequently accessed data to the group 1 and assigning other data to the group 2.

FIG. 2 illustrates a memory configuration in the case that the configuration of FIG. 1 has been replaced by a state-of-the-art DRAM (FIG. 2 illustrates a reference case (prototype example) prepared by the present inventor).

Referring to FIG. 2, the memory (DRAM core) includes:
a memory cell array 1 which has a multiple-bank configuration and is composed of an array of a plurality of memory cells,
a row decoder (X DEC) 2 that decodes a row address to activate a selected word line,
a column decoder (Y DEC) 3 that decodes a column address to turn on a Y-switch of a selected column (bit line),
a sense amplifier/Y switch 4 that amplifies the potential on the bit line,
a data amplifier/write amplifier (WRITE AMP) 5 that amplifies read data amplified by the sense amplifier of the selected column to output the so amplified data to RWBS (read write bus) to drive write data from the RWBS (read/write bus),
a control circuit (Address Command Timing Controller) 6 that controls the address, command and the timing,
a data control circuit (Data, I/O and Data Mask) 7 that controls the data input/output function to or from a memory cell between a data terminal (not shown) connected to an internal data bus 9 and the RWBS (read write bus) and that manages write mask control to the memory cell by a data mask signal from a data mask terminal (not shown),
an internal data bus 9 that performs an input (clock, address or command input) 8 to the DRAM core, and inputs/outputs data to or from the DRAM core.

FIG. 3 illustrates a portion of a prototype arrangement (layout) of FIG. 2. FIG. 3 is also prepared by the present inventor to explain FIG. 2. Referring to FIG. 3, an area 10 in the memory cell array 1 represents an active area including memory cells being accessed. The reference numeral 11 denotes a memory array or a memory macro (a circuit block used in e.g., a system LSI) that constitutes a memory array basic unit. A memory array basic unit may be abbreviated to a basic unit. The control circuit (address command timing controller) 6 manages control via an address/command bus (ADDRESS/COM BUS) connecting in common to basic units 11 of two memory cell arrays 11 to select the active area 10 to be accessed. The active area 10 is selected by an X decoder (XDEC) 2 that decodes an X-address (row address) of the address signal to activate the selected word line and by a column decoder (YDEC) 3 that decodes a column address to turn on a Y-switch of the selected column. Data (WRITE data and READ data) are inputted/outputted at the data control circuit ((data I/O data mask) 7 and transferred via a read/write bus (RWBS) connecting common to the multiple memory array basic units 11. In FIG. 3, there are 36 data terminals (DQ terminals) connected to the internal data bus 9 that compose a data input to the DRAM core only by way of illustration. A plurality of items of bit data at the DQ terminals 9 are converted by e.g., the data control circuit 7 into parallel data which are then transferred in parallel to the read/write bus (RWBS). It is noted that the plurality of items of bit data are serially inputted/outputted bits corresponding to a burst length (the number of bit data that are able to be inputted/outputted in succession). This read/write bus (RWBS) is extended astride the multiple memory array basic units 11 and connected common to the data amplifier (Data AMP)/write amplifier (WRITE AMP) of each memory array basic unit 11. With the burst length equal to 4, the read/write bus (RWBS) includes four data lines (I/O lines) per data terminal. Hence, with the 36 data terminals, there are provided 36×4=144 data lines (IO) lines).

The IO configuration in the memory cell array is a hierarchical configuration (local IO line/main IO line) or a non-hierarchical configuration. In case the IO configuration is hierarchical, the main IO line connected to the data amplifier/write amplifier (WRITE Amp) is connected via a switch circuit, not shown, to a plurality of local IO lines. These local IO lines are selected by the column decoder (Y DEC) 3 and connected to a bit line of the column selected via the Y switch 4 set in an on state.

In READ operation, data read from a memory cell connected to a word line selected by the Y-decoder 2 (set at High potential) is amplified by the sense amplifier 4. The data is then transferred, via Y switch 4 of the selected column, set in an on state, to the local amplifier, and thence to the data amplifier (Data Amp) 5, and output at the read write bus RWBS. The data control circuit 7 converts the parallel bit data (data composed of a number of bits corresponding to the burst length) into serial data which are then serially output at the data terminal to an internal data bus 9 synchronized with a clock signal. Note that, in the DDR, the serial data are transferred in synchronization with rising and falling edges of the clock signal.

In WRITE operation, the bit data, serially delivered at the data terminal connected to the internal data bus 9, is converted into parallel data by the data control circuit 7 so as to be transferred on the RWBS. The bit data is amplified by the write amplifier (WRITE AMP) 5 and transferred via main IO line, IO line and the selected local IO line to the bit line of the selected column whose Y switch 4 has been turned on.

The data is controlled by the address command timing controller 6 and read (READ) or written (WRITE) in the active area 10 in the selected memory cell array 1.

FIG. 4 which is prepared by the present inventor, illustrates a case 1 in which in FIG. 3, a remote active area (active area 10-1) looking from the side of the address command timing controller 6 and the data IO 7, is selected, and a case 2 in which a near active area (active area 10-2) looking from the same side in FIG. 3 is selected.

FIG. 5, which is prepared by the present inventor, is a timing chart illustrating an access operation for each of cases 1 and 2 in FIG. 4. FIG. 5 schematically illustrates the relationship among a command (CMD), a clock signal (memory CLK), control delays (10-1 control delay and 10-2 control delay), time of selection of the active areas 10-1, 10-2 (10-1 selection time and 10-2 selection time) and output delays for the active areas 10-1 and 10-2 (10-1 output delay and 10-2 output delay), and α, β and θ. It is noted that the control delays (10-1 control delay and 10-2 control delay) are those for the active areas 10-1, 10-2 from the command input for the cases 1 and 2.

α is Row Cycle Time (tRC),
β is Row to Row Delay (tRRD),
γ is control delay or data delay (output delay), and
θ is READ Latency (latency).

γ includes time for the address command timing control circuit 6 (address command timing controller) and the data control circuit 7 to control the active area 10 of the memory cell array and delay time caused in transferring a data signal via read write data bus RWBS to the memory array basic unit. The output delay corresponds to time for data read from the active area 10 to be transferred via RWBS to the data control circuit 7.

α is a cycle relating to the memory cell array operation of the active cell area 10.

β is a time that elapses since the input of a command (CMD) until the input of the next command is enabled.

θ is the number of clock cycles since the READ command is inputted until data is outputted at the data terminal DQ.

In an example of FIG. 5, it holds that
10-1 control delay>10-2 control delay, and
10-1 output delay>10-2 output delay.

The control delay as well as output delay γ in the active areas 10-1 and 10-2 is one clock cycle at the maximum, while tRC(α) is 6 cycles, such that α>>γ, that is, α is appreciably longer than γ. On the other hand α~θ, that is, α is about equal to the latency.

Note that increasing the data band width and improving the memory cycle are synonymous with improving the latency.

In the example of FIG. 5, the ratio of γ to α (time ratio: γ/α) is small. Hence, the delay of γ (control delay and output delay) as well as the power consumed in γ (control delay and output delay) is small as compared to the delay as well as the power in α.

However, if the number of parallel connections of IO in the memory cell array, for example, the number of data lines for parallel transfer of the read write bus, is increased, the ratio of γ to α will increase due to increase in time for parallel conversion of bit data serially inputted from the data terminal. This leads to increased power consumed in γ.

So far, the development in one aspect of the semiconductor memory has been centered on the architecture for reducing tRC(α) and β. Note that α=tRC (row cycle time) is an index for the cycle in which the memory cell array is actually in operation in accessing the memory cell. The memory input/output operating frequency f is determined by the number of data that is read out/written in parallel in one tRC (number of memory cells accessed).

FIG. 6, which is prepared by the present inventor for clarifying problematic points, illustrates a prototype example 1 (reference case). In FIG. 6, the number of data terminals (data terminals connected to the internal data bus 9) is 36, with the burst length BL being 4. In correspondence with BL=4, the read write bus (RWBS) is 4 bits. In correspondence with the 36 data terminals, there are 36×4=144 parallel data lines (IO) lines), such that 144 data are written in or read from the active area. YDEC is a column decoder that decodes the column address of the address signal. It is noted that, in FIG. 6, those elements that are the same as or equivalent to those shown in FIGS. 3 and 4 are depicted by the same reference numerals. The YDEC may, of course, be provided within the memory array basic unit, as shown in FIGS. 3 and 4.

[Patent Document 1] JP Patent Kohyo Publication No. JP-P2008-500668A

SUMMARY

The following is an analysis of related techniques.

It is true that, for a memory, the latency θ is crucial. However, it has come to be required to improve tRC(α) to increase the number of data accesses (efficiency) in writing at a memory cell (efficiency) and to reduce power, that is, to reduce tRC(α) to increase the number of times of data access and to realize low power.

FIGS. 7A and 7B illustrate WRITE and READ operations in the semiconductor memory shown in FIG. 6. Note that FIGS. 7A and 7B are prepared by the present inventor to illustrate problematical points of the prototype example shown in FIG. 6. In FIGS. 7A and 7B, the burst length=4, and BL0 to BL3 are 4-bit data read/written in succession for the four columns (bit lines) (BL0, BL1, BL2 and BL3) by a single access command in correspondence with the burst length=4.

In FIGS. 7A and 7B, CMD are a WRITE command and a READ command, respectively. Note that, in FIGS. 7A and 7B, a bank active command (ACT) or a precharge command (PRE), for example, is omitted. The CMD is specified by the combination of control signals (chip select, write enable, column address strobe or row address strobe). These control signals are supplied to a command decoder, not shown, for decoding. BL0-BL3 data BL0, BL1, BL2 and BL3, corresponding to four columns, a leading column address of which is specified, are written or read for the specified row address in response to the WRITE or READ command received.

In FIG. 7A, four bit serial write data BL0, BL1, BL2 and BL3 are delivered from a single data terminal at a double data rate, that is, at a rate of two bit data for each clock cycle, in synchronization with a falling edge and a rising edge of the memory CLK. The input 4-bit parallel data BL0, BL1, BL2 and BL3, corresponding to the four columns received, are serial-to-parallel converted to four-bit parallel data, which are then transferred in parallel on four data lines of the read write bus RWBS (control delay of γ). The data oncoming to the memory array basic unit 11 from the read write bus RWBS, bit data not specified for data masking, is amplified by a write amplifier, here not shown (WRITE AMP 5 of FIG. 2). The amplified data are transferred, via main IO line (LIOT/B) and local IO line (LIOT/B), to a sense amplifier (Sense Amplifier of FIG. 2) of the bit line (BLT/B) of selected columns (four columns) whose Y switches (Y Switches 4 of FIG. 2) are in an on state. The data are then written in selected cells (cells connecting to the word line set to High level) in the active area (selection time α).

The control delay for the active area 10-1 (FIG. 6) of the memory array basic unit 11 at a remote end from the data control circuit 7 (10-1 control delay) is longer than the control delay for the active area 10-2 (FIG. 6) of the memory array basic unit 11 at a near end from the data control circuit 7 (10-2 control delay). This is shown in FIG. 7A in Case 1 and Case 2. It is noted that BL0 to BL3, shown below the 10-1 and 10-2 control delay, are parallel 4-bit data serial-to-parallel converted from 4-bit data serially delivered from the data terminal. On the other hand, BL0 to BL3, shown below the 10-1 and 10-2 selection time, are parallel 4-bit data transferred to the selected column in the memory array basic unit 11, that is, write data to the four selected columns of the memory cell array (BL0 to BL3).

FIG. 7B is a timing chart illustrating the operation in reading out data from memory cells with a burst length 4. The control delay (10-1 control delay) and the output delay (10-1 output delay) for the active area 10-1 at a remote end from the data control circuit 7 is longer than the control delay (10-2 control delay) and the output delay (10-2 output delay) for the active area 10-2 at a near end from the data control circuit 7. This is shown in FIG. 7B by Case 1 and Case 2. The 4-bit data BL0 to BL3, read from the memory cells during the selection time of FIG. 7B (selection time of the active area 10-1 or 10-2) are transferred via the Y-switch (Y-Switch 4 of FIG. 2) from the local IO line or main IO line to the read write bus (RWBS). The 4-bit data BL0 to BL3 arrive at the data control circuit 7 after an output delay (10-1 output delay or 10-2 output delay). The 4-bit data BL0 to BL3 are serially at a double data rate in two cycles. In the present Example, the cycle time from the input of the CMD (READ) to the output of the first bit data BL2 is 4 (latency θ).

In the WRITE and READ operations of FIGS. 7A and 7B, selection of the remote end memory cell (memory cell of the active area) determines a characteristic. The period from a command (CMD) to the next command (CMD), that is, the CMD-to-CMD period β, is 3 cycles. The selection time α of the active area of the memory cell array is 3 cycles.

In the example of FIG. 5, α>>γ. However, in a high-speed memory, the ratio of γ to α or θ becomes larger.

That is, the data transfer delay, that is, the delay γ on the data bus line (RWBS) or on the control signal line, in a memory access becomes larger.

In particular, in a high-speed memory, in which importance is attached to the cycle α (=tRC) to access a memory, the delay (γ) may appear to be longer than the delay of the memory operation itself, such as delay in selecting a word line, a bit line or a memory cell.

Hence, efficiently transferring data inputted from the data terminal to the read write bus RWBS to access the memory cell for WRITE/READ is to be made compatible with reduction of the power consumption.

FIG. 8 illustrates the prototype example 2 (reference case). FIG. 8 is also prepared by the present inventor to explain problematical points of the prototype example 1. In FIG. 8, four basic units (memory array basic units) 11 are provided. There are provided 36 data terminals, that is, IO terminals connecting to the internal data bus 9, with the burst length BL being 8. The read write bus (RWBS) includes 8-bit data lines (IO lines) in correspondence with a single data terminal, such that the read write bus (RWBS) includes 8×36=288 (288 bit-parallel) data lines.

Reference numerals 10-1 and 10-2 are active areas in the memory array basic unit 11. YDEC is a column decoder that decodes a column address. In FIG. 8, the elements which are the same as or equivalent to those shown in FIG. 6 are indicated by the same reference numerals. The YDEC may, of course, be provided within the memory array basic unit 11, as shown in FIGS. 3 and 4. The active area 10-1 is remoter from, and the active area 10-2 is nearer to, the control circuit (address command and timing controller) 6 and to the data control circuit (data I/O and data mask) 7.

FIGS. 9 and 10 are timing charts for illustrating respectively the WRITE and READ operations in the configuration of FIG. 8. Referring to FIG. 9, in continuous WRITE in which WRITE commands are inputted in succession without intermission, 8-bit data BL0 to BL7, corresponding to 8 columns, are serially supplied to the data terminals in synchronization with rising and falling edges of two clock cycles from the first WRITE command (CMD). After control delay of γ, 8-bit data BL0 to BL7 are transferred as parallel data to the write amplifier (WRITE AMP of FIG. 2) of the memory array basic unit 11 via the read write bus RWBS. During the selection time, following the control delay, the 8-bit data BL0 to BL7 are written in memory cells connecting to the word line selected and to bit lines of the eight columns selected.

In the example of FIG. 9, the selection time α is 3 clock cycles. Following the 8-bit data serially inputted in correspondence with the last WRITE command (CMD), next 8-bit data corresponding to the next WRITE command (CMD) are serially inputted from the data terminals. The control delay for the remote end active area 10-1 is longer than that of the near end active area 10-2. It is noted that a left pipeline 1 (Pipeline1) in FIG. 9 indicates that the processing of the control delay and subsequent selection time is carried out in a single stage pipeline.

Referring to FIG. 10, during the continuous READ time in which the READ commands are entered in succession, without intermission, 8-bit data are output from the data terminals, in synchronization with the rising and falling edges of the clock, after the latency θ from the input of the READ command.

The pipeline 1 (Pipeline1), shown left in FIG. 10, indicates control delay and selection time, and the pipeline 2 (Pipeline2), also shown left in FIG. 10, indicates output delay and outputting of serial bit data. The control delay and the output delay for the remote-end active area 10-1, shown by Case 1, are longer than the control delay and the output delay for the near-end active area 10-2, shown by Case 2.

In Patent Document 1, described above, attention is focused on the delay time of the latency path to read and write data efficiently, such as to reduce an average latency.

However, if simply the average latency is reduced, the cycle of the memory access itself cannot become shorter, while the power may not be reduced sufficiently.

The above mentioned prototype examples do not provide a semiconductor device having a memory cell array which can reduce power and reduce memory access time.

A device according to one aspect of the embodiments may be substantially summarized as follows, but not limited thereto.

There is provided a device including: a memory cell array including a plurality of memory cells for read/write, the memory cell array being made up of a plurality of memory array basic units;

a first bus provided common to the plurality of memory array basic units, the first bus allowing transfer of address/control signals thereon, the first bus including at least one first buffer circuit that operates as a pipeline register;

a second bus provided common to the plurality of memory array basic units, the second bus allowing bidirectional transfer of data thereon, the second bus including at least one second buffer circuit that operates as a pipeline register;

a first control circuit that sequentially sends the address/control signals on the first bus from one end thereof, in a sequence of from the address/control signals destined for the memory array basic unit located at a remote end side with respect to the one end of the first bus, to the address/control signals destined for the memory array basic unit at a near end side with respect to the one end of the first bus; and a second control circuit that in a write access, sends write data on the second bus from one end thereof, sequentially in a sequence of from write data destined for the memory array basic unit located at a remote end side with respect to the one end of the second bus to write data destined for the memory array basic unit at a near end side with respect to the one end of the second bus, the write data transferred from the second bus to each of the memory array basic units being written in each of the memory array basic units, in a read access, read data from a plurality of the memory array basic units being transferred on the second bus to get to the second control circuit, in a sequence of from the read data from the memory array basic unit located at the near end side with respect to the one end of the second bus to the read data from the memory array basic unit located at the remote end side with respect to the one end of the second bus, the second control circuit outputting the arrived read data.

The semiconductor device according to the one aspect is able to maintain data efficiency and to allow power consumption to be reduced.

BRIEF DESCRIPTION OF THE DRAWINGS

FIGS. 28A to 28C are timing diagrams illustrating the design statements for the CMD to CMD period β in a common IO line (CIO line) configuration in the exemplary embodiment 4.

FIGS. 30A to 30C are diagrams illustrating the exemplary embodiment 5.

PREFERRED MODES

Figure 1:
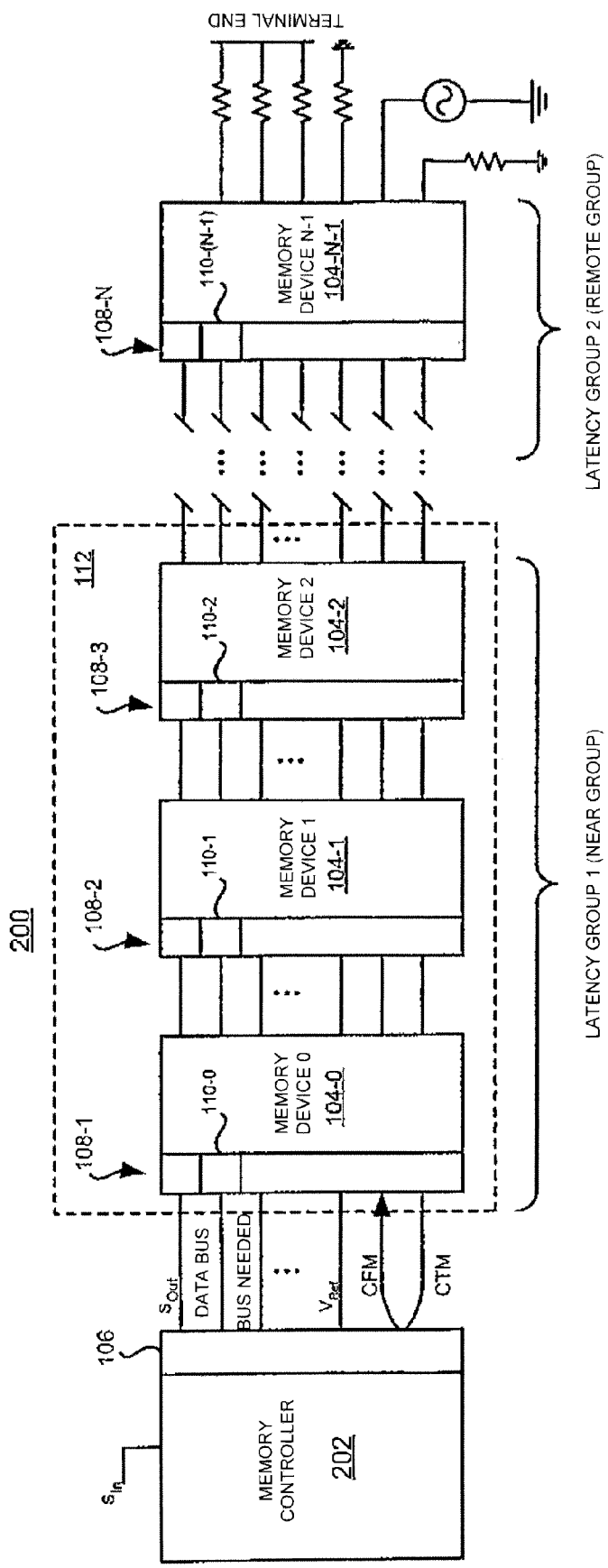
FIG. 1 is a diagram illustrating a configuration of Patent Document 1.
Figure 2:
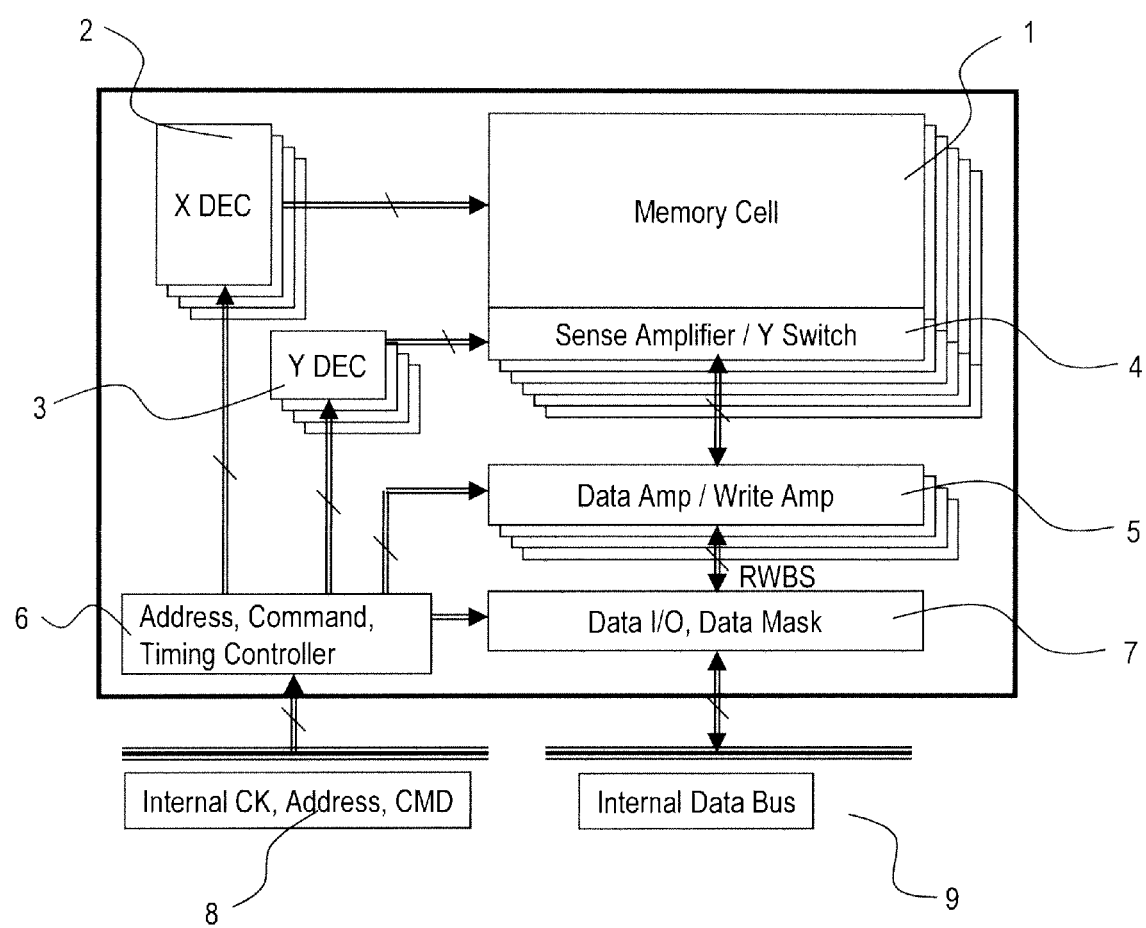
FIG. 2 is a diagram illustrating the configuration of a state-of-the-art memory.
Figure 3:
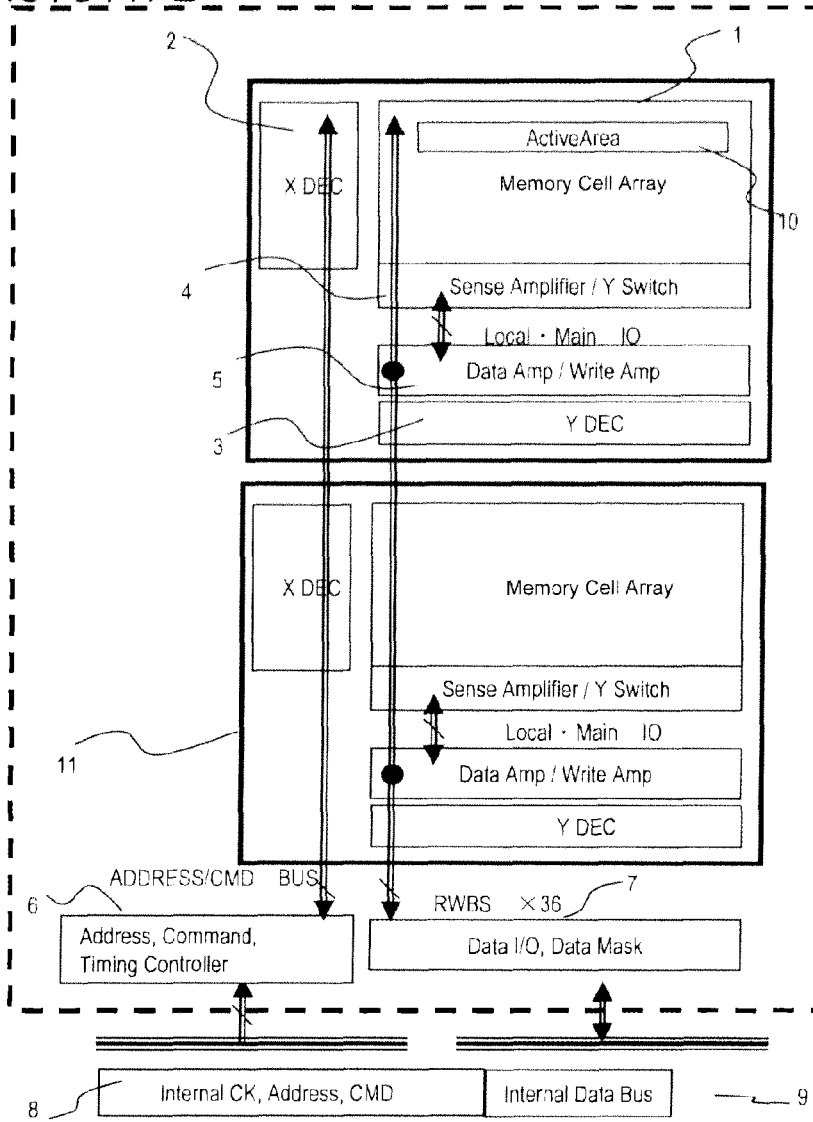
FIG. 3 is a diagram illustrating a prototype example.

The following describes embodiments.

The principal features of the embodiments may substantially be outlined as set out below. It should be noted that the following is not to be construed as restricting the invention.
(1) Pipeline registers are introduced on an address/command bus from an address command control circuit and an IO line (read write bus) from a data control circuit to divide a memory cell array.
(2) The pipeline register being valid/invalid is made to be switched depending on the operation specifications of a memory cell array to enable a basic unit of the memory cell array to be changed.
(3) An access latency and an interval β (tRRD) between command input is to be varied for each of basic units, into which the memory cell array is divided.
(4) For IO lines (RWBS) and control lines (address/command bus), a plurality of active regions in a plurality of basic units can be selected in parallel to perform data inputting/outputting.
(5) The number selections in selecting active regions in the memory cell array in parallel for the IO and control lines is made variable in correspondence with the operation design statements. The address allocation is also made variable.

In a semiconductor device according to one embodiment, there is provided a memory cell array that includes a plurality of memory cells for read/write and is made up of a plurality of basic units (11). A first bus (address/command bus) and a second bus (RWBS) are provided to the plurality of basic units (11) in common. The first bus and the second bus allow transfer of an address signal/a control signal thereon. The first bus includes at least one first buffer circuit (13A) that operates as a pipeline register and the second bus includes at least one second buffer circuit (13B) that operates as a pipeline register. There are provided a first control circuit (6) and a second control circuit (7). The first control circuit (6) sequentially sends out address/control signals, from one end of the first bus (address/command bus), in a sequence of from the address/control signal destined for a basic unit located at a remote end side with respect to the one end to the address/control signal destined for a basic unit at a near end side with respect to the one end. The second control circuit (7) sequentially sends out data signals, at write time, from one end of the second bus (RWBS), in the sequence of from the data signal destined for the remote end side basic unit with respect to the one end to the data signal destined for the near end side basic unit with respect to the one bus end. Write data transferred from the second bus (RWBS) to each of the basic units are written in memory cells in each of the basic units selected. Read data from the basic units at read time get to the second control circuit via the second bus (RWBS) in the order from the data coming from the near end side basic unit to the data from the remote end side basic unit. The second control circuit (7) outputs the arrived read data. In one of the embodiments, at least one first buffer circuit (13A) may be provided on the first bus (address/command bus) between the basic unit located at the near end and the basic unit located at the remote end from the first control circuit (6). In addition, at least one second buffer circuit (13B) may be provided on the second bus (RWBS) between the basic unit located at the remote end and the basic unit located at the near end from the second control circuit (7). The first buffer circuit (13A) may be provided on the first bus (RWBS) between the neighboring basic units, and the second buffer circuit (13B) may be provided on the second bus (RWBS) between the neighboring basic units.

In one embodiment, the memory cell array may include first to Nth basic units (memory array basic units) (11), where N is a pre-set positive integer. The first bus (address/command bus) may include a (N−1)-number of the first buffer circuits (13A), each of which is located respectively between each of (N−1) pairs of neighboring basic units, where N is a positive integer not less than 2. The second bus (RWBS) may include an M-number of parallel data lines per data terminal. The data lines serially input/output M×N bit data corresponding to a burst length M×N, where M is a pre-set positive integer not less than 1. The second bus (RWBS) includes a (N−1) number of the second buffer circuits (13B), each of which is located respectively between each of (N−1) pairs of neighboring basic units. The first control circuit (6) sequentially sends out to the first bus (address/command bus), on a per cycle basis, the address/control signals in the sequence of from the address/control signal destined for the remotest one of the first to Nth basic units to the address/control signal destined for the nearest one. At write time, the second control circuit (7) sends out, in parallel, the M×N bit data, serially inputted from the single data terminal. At data write time, the second control circuit (7) sequentially sends out data in parallel in the sequence of from the data destined for the remotest one of the first to Nth basic units to the data destined for the nearest one, M bits each time, to the M-number of the data lines of the second data line, on a per cycle basis. The M-bit data, transferred to each of the first to Nth basic units (11) from the second bus, are written in each of the M-number of the columns of the first to the Nth basic units. At read time, the M-number of bits of the bit data read from the selected memory cells connected to the M-number of columns of the first to the Nth basic units are transferred on the second bus (RWBS) to sequentially get to the second control circuit in the order of from the M-number of bits of data read from the nearest basic unit to the M-number of bits of data read from the remotest basic unit. The second control circuit (8) serially outputs the M×N numbers of data from the data terminal.

In another embodiment, the pipeline registers may be decimated to provide a configuration optimized for different plural values of burst lengths. The first bus (address/command bus) may include the first buffer circuit (13A) between each of neighboring pair basic units out of a plurality of pair basic units, and the second bus (RWBS) may include the second buffer circuit (13B) between each of neighboring pair basic units out of a plurality of pair basic units. At least one pair of a first buffer circuit and a second buffer circuit out of a plurality pairs of the first buffer circuits and second buffer circuits may operate as a pipeline register, with the pipelining functions of the remaining first and second buffer circuits being invalidated to enable coping with a plurality of different burst lengths.

In one embodiment, the memory cell array may include first to Nth basic units, where N=2^K, K being an integer not less than 2 and ^ being a power operator. The first bus (address/command bus) may include a (N−1) number of first buffer circuits (13A) located respectively between (N−1) pairs of neighboring basic units, and the second bus (RWBS) may include, per data terminal, an M-number of data lines, M being a pre-set positive integer not less than 2, that serially input/output a K-number of bit data corresponding to the burst length. The second bus may include a (N−1) number of second buffer circuits (13B) between the (N−1) pairs of neighboring basic units. In case the burst length is M×N, the (N−1) number of the first buffer circuits and the (N−1) number of the second buffer circuits may operate a pipeline register. In case the burst length is M×(N/(2^L)), where L is a pre-set integer not less than 1 and not more than K and ^ denotes a power operator, a neighboring 2^(K−1) number of basic units may be made a set. The first and second buffer circuits between the neighboring sets may operate as pipeline registers, with the remaining first and second buffer circuits having pipelining functions thereof invalidated.

In one embodiment, there may be provided a plurality of third buffer circuits (13C) provided in association with a plurality of the basic units (11). The third buffer circuit (13C) receives the address/control signal transferred on the first bus and transmit the signal received to the corresponding basic unit.

In one embodiment, a first period corresponding to a control delay, composed of a transfer cycle of an address/command to the first bus (address/command bus) in connection with a write access and a read access and a transfer cycle of write data to the second bus (RWBS) in connection with the write access, may be composed of a plurality of cycles in association with pipeline control, and longer than a second period corresponding to selection time during which writing data in the memory cell selected or reading data from the selected memory cell is made in the basic unit of the memory cell array.

In one embodiment, a third period corresponding to the output delay (γ) during which, in a read access, data read from the basic unit next to the selection time is transferred on the second bus to get to the second control circuit, may be longer than the second period corresponding to the selection time (α).

In one embodiment, the first period and the third period may both be as long as the second period.

In one embodiment, the first and second periods or the first to third periods corresponding to a plurality of commands sequentially made in succession may be taken as a unit of pipeline control between commands.

In one embodiment, in the memory cell array, the basic unit may be a sub-bank, and there is provided a bank (15) composed of a plurality of the sub-banks, which are accessed a plurality of numbers of times.

In one embodiment, the second bus may include a dedicated write bus (WBS: 16) that transfers write data from the second control circuit (7) to the plurality of basic units in the memory cell array, and a dedicated read bus (RBS: 17) that transfers read data from the plurality of basic units in the memory cell array to the second control circuit. The dedicated write bus (WBS: 16) may include at least one second buffer circuit (13B) and the dedicated read bus (RBS: 17) may include at least one second buffer circuit (13B).

The following describes one of the basic principles of the embodiments. To help understand the basic principles of the embodiments, comparison is to be made from time to time to the above mentioned prototype examples (prototype examples) and Patent Document 1.

As described with reference to the prototype examples (prototype examples), due to division of the memory cell array into a plurality of basic units (memory array basic units) and to the increasing storage capacity, the number of memory cell arrays controlled by the control circuit (address command timing controller) or the data control circuit (data I/O, data mask) is increasing. Moreover, the length of the control signal interconnections or that of read write buses for data transfer is also increasing. Thus, granting that attempts are being made to reduce the period of the selection time tRC (α), such is not the case with the period of control delay-output delay (γ). Hence, as the period of α is being reduced in correspondence with the increasing capacity and improvement in performance, the proportion of the period γ is becoming larger.

In short, the proportion of the transfer time of the data signal and the control signal in a memory cell array (delay time γ on the read write bus or on the control signal line) becomes larger.

In particular, in a high-speed memory in which importance is attached to reduction of the memory-accessing ROW cycle time tRC (α) (higher speed), the above mentioned control delay and output delay (γ) may appear to be larger as compared to the delay (α) of the memory operation itself, which is regarded as being predominantly important in a high speed operation, and in which such as selection of word or bit line or selection of a memory cell is performed.

Hence, to transmit data entered from outside efficiently on the read write bus (RWBS) for writing on the memory cell and to transmit read data from the memory cell to the read write bus (RWBS) for efficient read, it is necessary that the high-speed signal transfer is made compatible with reduced power consumption, as described with reference to the prototype examples (prototype examples).

In the embodiments, attention is focused on power delay product (=P·Td). As set out above, the power P is determined by n×c×f×V², where n, c, f and V are the number of elements, capacity, operation frequency and the operating power supply voltage, respectively. However, if the delay is divisionally expressed in association with delay (γ) (=delay 1), such as control delay and output delay, and delay (=delay 2), such as selection time (α), the power delay product P·Td may be represented by the following equation (3):

$$P \times T_d = n_1 \times c_1 \times f_1 \times V_1^2 \times T_{d1} + n_2 \times c_2 \times f_2 \times V_2^2 \times T_{d2} \qquad (3).$$

In the above equation (3), suffixes 1 denote the number of elements n, capacitance c, operating frequency f and the voltage of the operating power supply of the delay 1 (γ of the control delay and output delay), while suffixes 2 denote the number of elements n, capacitance c, operating frequency f and the voltage of the operating power supply V of the delay 2 (selection time α).

It is now considered if any of the items may be compromised for power reduction by way of tradeoff. In light of the data efficiency of the system, the number of data outputted from the memory as well as the number of data supplied to the memory may not be reduced.

For the READ operation, the control delay and the output delay γ are delay from the time of the input of a CMD (Read command) until an address and a command are given to the memory cell array basic unit 11 (control delay), or delay from the time the control circuit that receives parallel data transferred from the memory array basic unit 11 to the read write bus (RWBS) until the control circuit converts the parallel data into serial data to output the serial data at a data terminal (output delay). The number of bit data read from the semiconductor memory corresponds to the burst length and hence remains unchanged.

Figure 9:
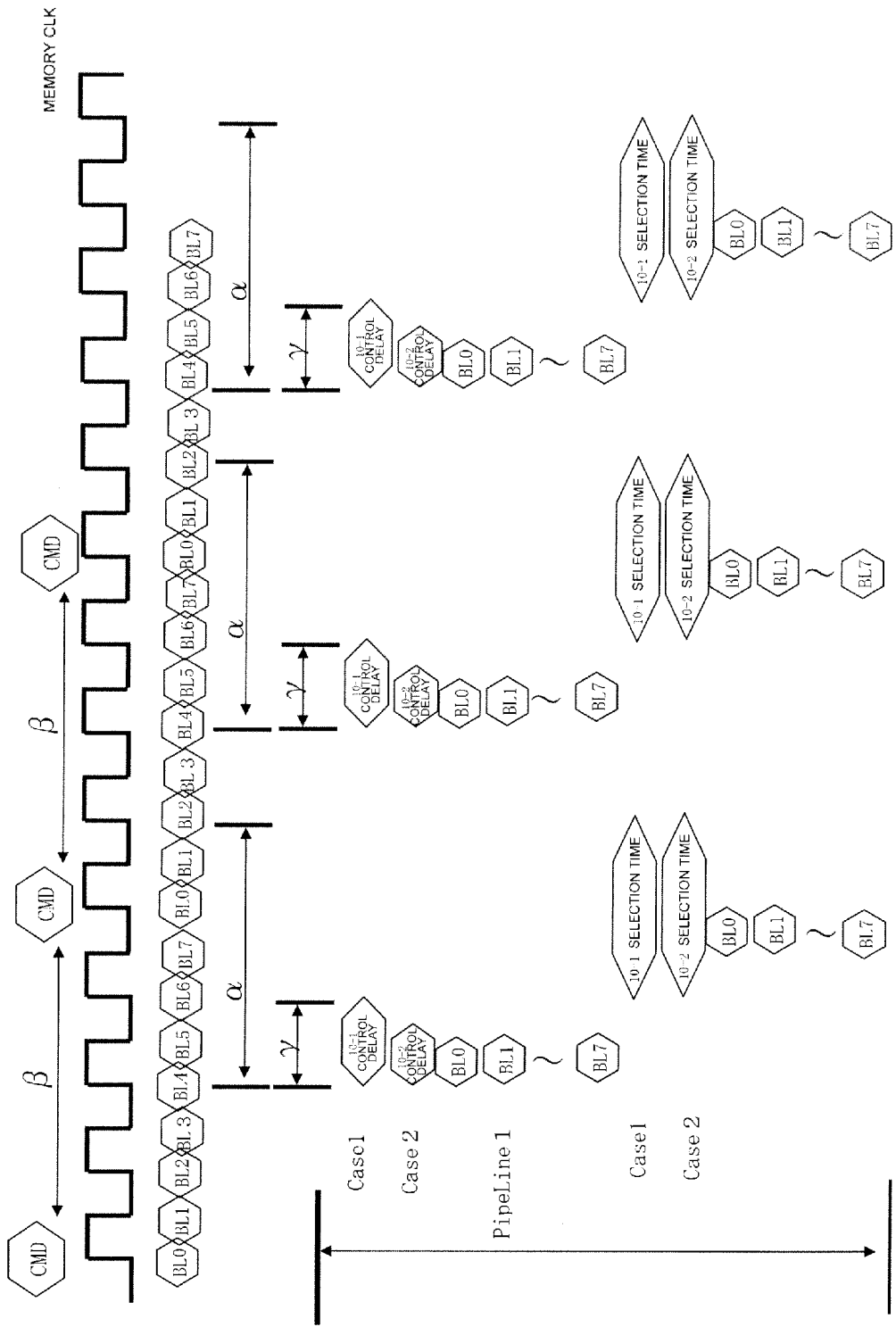
FIG. 9 is a timing chart illustrating the WRITE operation of FIG. 8.

Suppose that data output is started from the semiconductor memory and a data bus outside the semiconductor memory, such as bus 9 of FIG. 9, is filled with data, that is, that consecutive clock cycles on the data bus are filled with data such that there are no clock cycles devoid of data. In such case, the data efficiency, such as data transfer rate, is determined by the cycle $\alpha$.

By allowing the system having an access, such as a READ access, to the semiconductor memory, to ignore the period of the control delay and output delay $\gamma$ which may influence the read latency apparent at the initial access, it becomes possible to exploit the relation of tradeoff for power saving.

That is, in the embodiments, not only the data rate (number of data with respect to the operation frequency) but also the item of power consumption is taken into consideration, and attention is focused on the power delay product P·Td. The relation of tradeoff in the components of the delay 1 which are items of the power consumption and the delay time Td by the control delay and output delay $\gamma$ may be exploited to reduce the power consumption without compromising the data efficiency. Hence, the power may be reduced by decreasing f1 or P1 in the power item $n_1 \times c_1 \times f_1 \times V_1^2$ in connection with the delay 1.

Additionally, the power and delay time Td are items contrary to each other. It is thus necessary to avoid that the delay time Td becomes doubled or even longer in case the power is halved.

On the other hand, the memory cell array is desirably so configured as to render constant or reduce the delay 2 that governs the number of data inputs/outputs of the memory cell (selection time $\alpha$).

Figure 6:
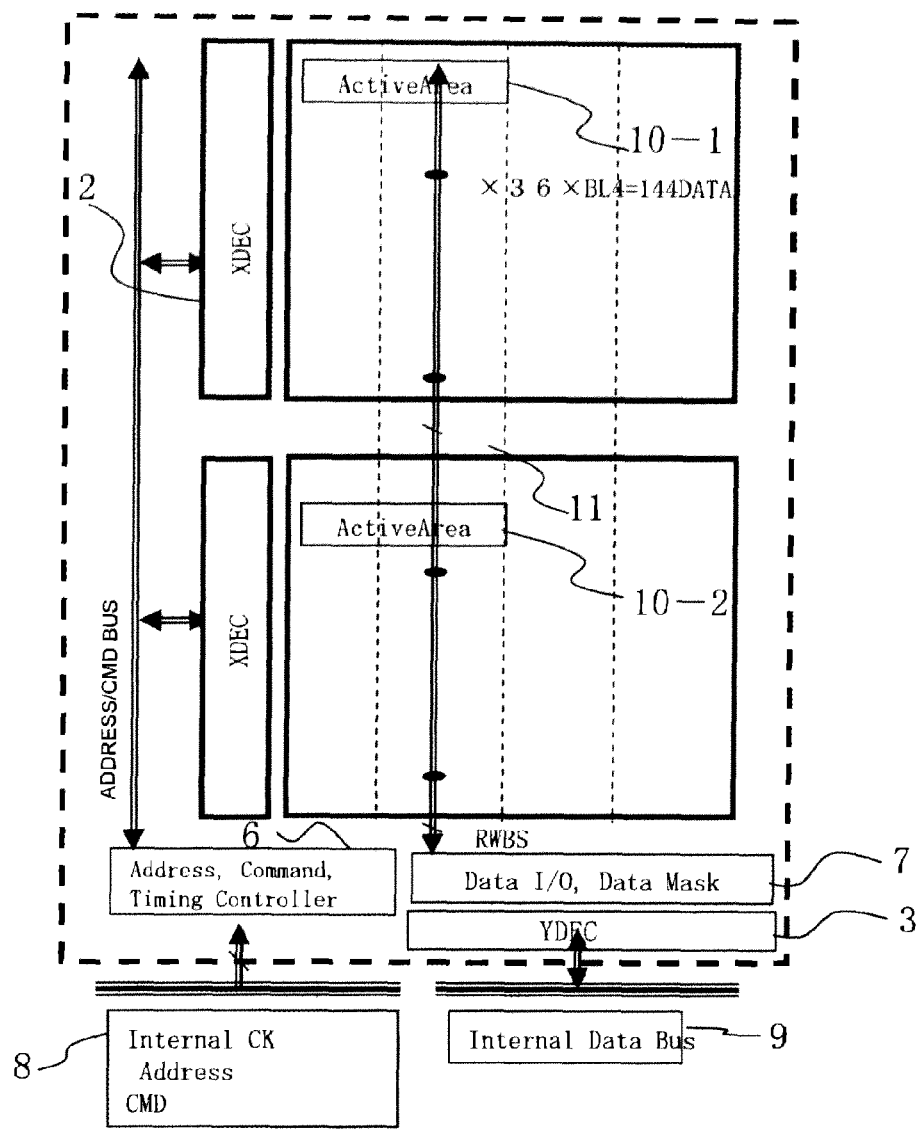
FIG. 6 is a diagram illustrating a prototype example 1 (reference case).
Figure 7:
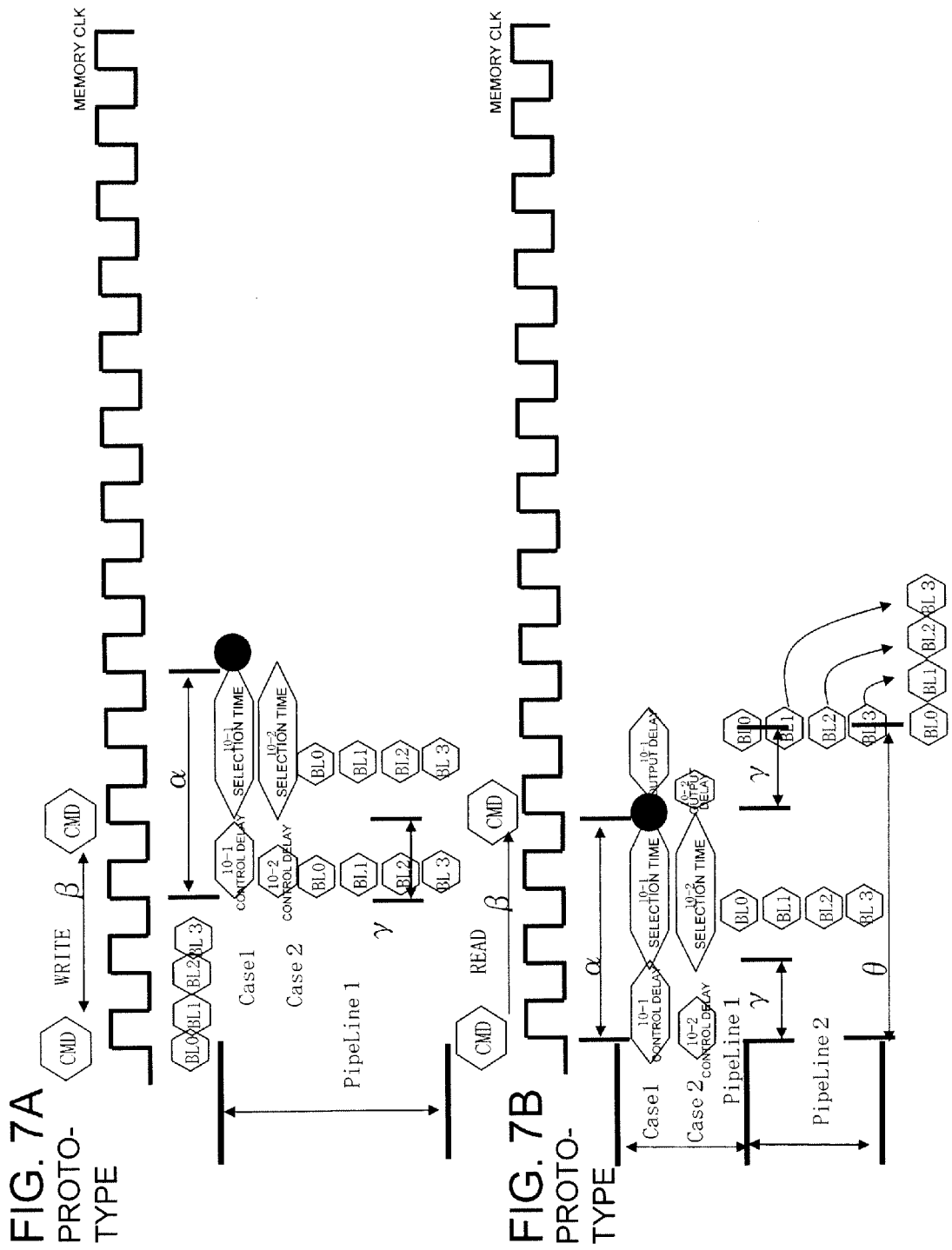
FIGS. 7A and 7B are timing charts for explaining the WRITE and READ operation of FIG. 6.
Figure 8:
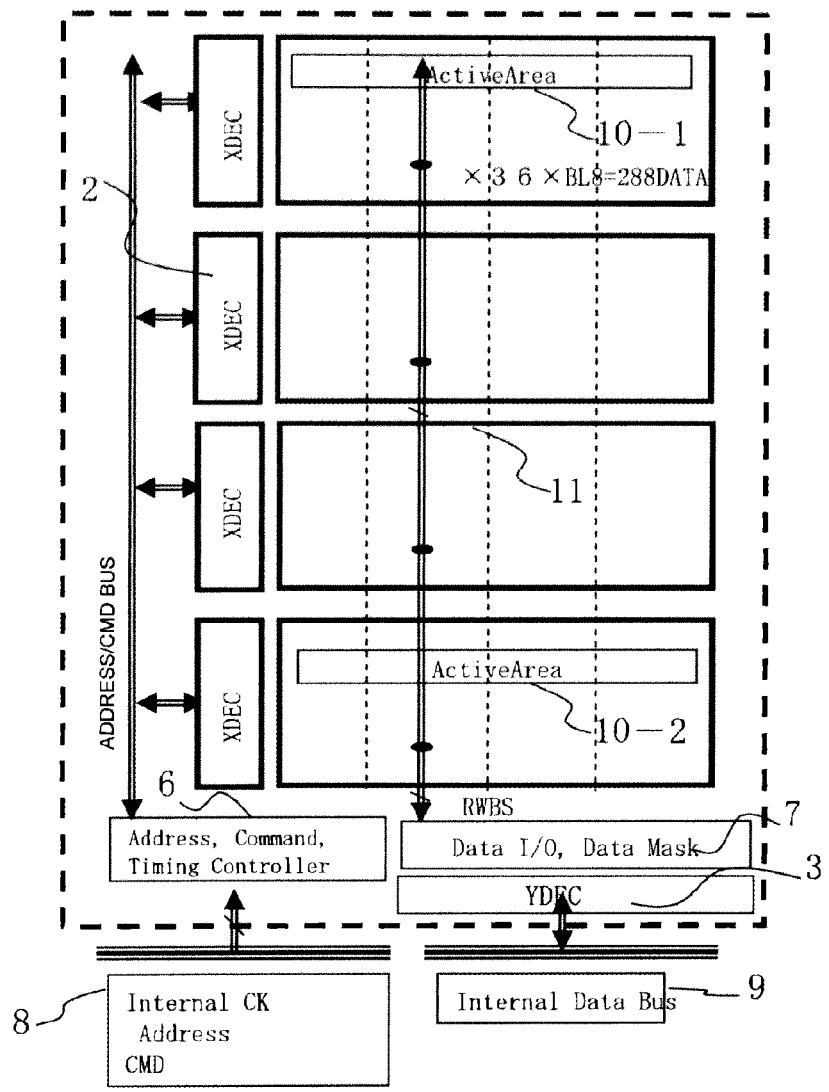
FIG. 8 is a diagram illustrating a prototype example 2 (reference case).
Figure 10:
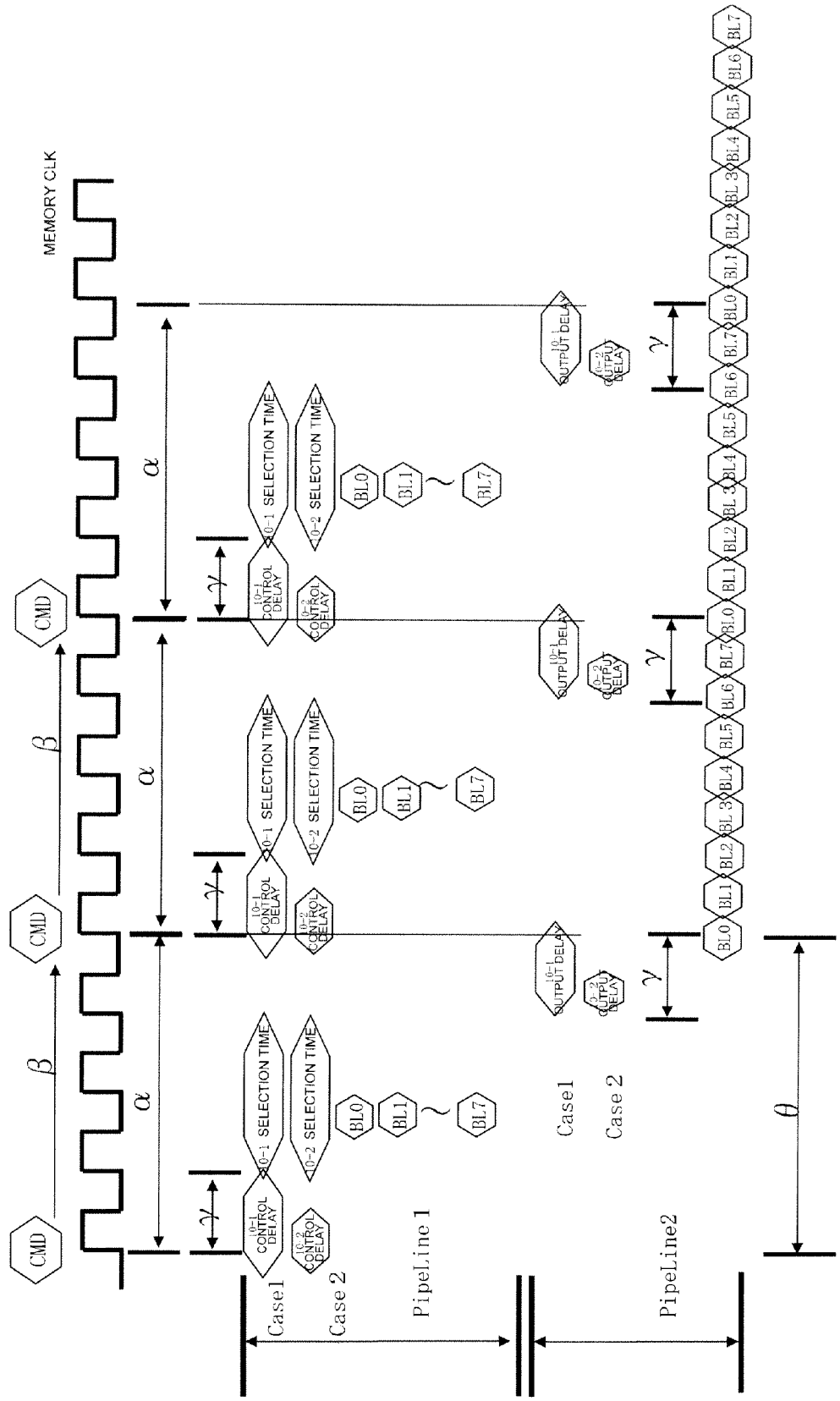
FIG. 10 is a timing chart illustrating the READ operation of FIG. 8.

In the above mentioned prototype examples (prototype examples), for example, in FIGS. 6 and 7, there are shown, as operation design parameters, the configuration of 36 data terminals (DQs) and the burst length BL=4 (total number of data lines=144), and example timing operations. In FIGS. 8 to 10, there are shown the configuration of 36 data terminals (DQs) and the burst length BL=8 (total number of data lines=288), and example timing operations.

In the above mentioned related technique (prototype example) of FIG. 9, a delay time ($\gamma$) of one cycle is consumed to transfer a control signal for WRITE, a data signal and a mask signal, while a delay time of two cycles is consumed as selection time for data write in the active area 10-1 (Case 1) or in the active area 10-2 (Case 2). Three cycles are allotted to $\alpha$ by the control circuits 6 and 7 of FIG. 8. On the other hand, the burst length=8 and four cycles are needed for data input. Hence, $\beta$ is four cycles.

In the above mentioned related technique (prototype example) shown in FIG. 10, one cycle is allocated as the control delay $\gamma$, while one cycle is also allocated to the output delay $\gamma$ for read data output. In this case, $\alpha$, $\beta$ and $\theta$ are all 4 cycles.

The above mentioned Patent Document 1 (JP Patent Kohyo Publication No. JP-P2008-500668A), focuses attention on the delay time on the latency path to effect efficient data read and write, and provides a means to reduce the average latency. However, with the means to reduce the average latency, used alone, the cycle of the memory itself may not be shorter. On the other hand, with the means to reduce the average latency, used alone, the power may not be reduced sufficiently.

In the above mentioned prototype examples, there is no difference between the current consumption of the charging/discharging current on the read write bus (RWBS), as an IO line for data transfer, when accessing the active area at the remote end of the memory cell array, and that when accessing the active area at the near end.

In case a row cycle time tRC (selection time $\alpha$) of the memory cell array is reduced, the number of data that may be read from or written in the memory cell array is increased. However, the ratio of the delay $\gamma$ of the control signal/data signal to $\alpha$ becomes larger, as described above.

According to the one of the examples, the relationship of trade-off between $\alpha$ and $\gamma$ is exploited, and pipeline control is introduced into $\gamma$ delay control. That is, a bus (multiple bits) is divided by a pipeline register(s) and signals on multiple sections resulting from division are transferred on pipelines. In a two-stage pipeline configuration, the bus is divided into a bus section preceding the pipeline register and another bus section succeeding the pipeline register. In a first cycle, a first data group is sent to the preceding side bus and, in the next following second cycle, a second data group is sent out to the preceding side bus. The first data group is transferred to the succeeding side bus section which is an output of the pipeline register. In such configuration, it is possible to alleviate time per pipeline stage (timing allowance) and to reduce the number of data lines for parallel transmission. Hence, there may be provided a memory cell array configuration in which power consumption may be reduced without compromising data efficiency. There may also be provided a memory cell array configuration in which the number of data lines for read/write may be increased. Specifically, according to the embodiments, transfer of a control signal and a data signal to the memory array (control delay $\gamma$) and transfer of the control signal and the data signal from the memory array (output delay $\gamma$) are formed by a plurality of cycles and are pipeline-controlled on a per cycle basis. That is, according to the embodiments, at least one pipeline register (buffer) is provided on each of buses on which transfer the control signal and the data signal. Different data are allowed to co-exist in the same cycle on the preceding side bus arranged on one side of the pipeline register and on the succeeding side bus located on the other side of the pipeline register. As a result, the control signal/data signal transfer efficiency is not lowered and time per pipeline stage (timing allowance) may be alleviated.

Moreover, according to certain embodiments, in the pipelined bus for the control signal and the data signal, a plurality of active areas of the memory array basic units, associated with the pipeline stages, may be selected to cope with increase in the number of data that may be read from or written on the memory cell array.

Conversely, in the prototype examples, the transfer of the control signal/data signal (control delay/output delay $\gamma$) is not pipelined. In the examples of FIGS. 5, 6, 9 and 10, $\gamma$ is one cycle. That is, parallel data are transferred in one clock cycle on the read write bus (RWBS).

It is assumed that the number of data that may be read out and written is the same as that of the prototype examples in which pipelining is not used and read/write data are transferred in parallel on the read write bus (RWBS). In this case, according to embodiments in which pipelining control is introduced, the number of paths on which to transfer data, that is, the number of data lines of the read write bus (RWBS), may be reduced to 1/(the number of pipeline stages). It is thus possible with the embodiments to reduce power consumption without compromising the data efficiency.

In addition, according to the embodiments, γ and a are fully separated from each other to reduce α that governs the memory cycle and hence the cycle. Conversely, with the prototype examples, γ is comprehended in and not separated from a, as shown in FIGS. 5, 7, 9 and 10.

In exemplary embodiments, a plurality of bit data, such as BL0 or BL2, are serially sequentially transferred on a single pipeline-controlled data line on the read write bus (RWBS) which is an IO line used for data transfer. The data BL0, sent out on the read write bus (RWBS) during the previous cycle, arrives at the pipeline register and, during the next cycle, transferred on the data line connected to an output of the pipeline register. On a data line of the preceding side data line of the pipeline register, BL2 as the next data of BL0 is transferred. Similarly, on another data line of the read write bus (RWBS), a plurality of bit data, such as BL1 and BL3, are serially transferred in synchronization with transfer of the data on the above mentioned single data line, such as BL0 and BL2.

In WRITE operation, for example, write data are sequentially pipeline-transferred, on a data line of the read write bus (RWBS), from the access area of the memory array basic unit remotest from the data control circuit to the access area of the nearest memory array basic unit.

For example, data (e.g., BL0) destined for the access area of the remotest memory array basic unit is sent out at an earliest time from the data control circuit on a given single data line. On the other hand, data (e.g., BL2) destined for the access area of the nearest memory array basic unit is sent out last from the data control circuit on the above mentioned data line. On another data line of the read write bus (RWBS), a plurality of bit data, such as BL1, BL3 are serially transferred in synchronization with transfer of the data (e.g., BL0, BL2) on the first-stated data time. During the selection time α, the remote end memory array basic unit writes the data (BL0, BL2) sent out in parallel from the pipeline register on the read write bus (RWBS) in an active area of interest. During the same time α, the near end memory array basic unit writes the data (BL1, BL3) sent out in parallel from the data control circuit on the read write bus (RWBS) in an active area of interest.

In READ operation, on the other hand, read data from the access area of the nearest memory array basic unit are initially transferred on a data line of the read write bus (RWBS) to arrive at the data control circuit at an earliest time. Read data from the access area of the remotest memory array basic unit are transferred on the same data line to arrive at the data control circuit last.

By this configuration of the embodiments, the number of data lines of the read write bus (RWBS) may be reduced. For example, the number of data lines of the read write bus (RWBS) is 36 with the burst length BL=4, for the prototype example (reference case) of FIG. 6, where the number of data lines=36×4=144.

In contrast, in the embodiments, 36×2=72 data lines of the read write bus (RWBS) are needed for a configuration of 36 data terminals and the burst length BL=4. That is, in one embodiment the number of data lines may be halved. By halving the number of the data lines, the power consumption involved in charging/discharging the data lines may be saved.

The same holds for paths on which to transfer the control signal to the memory array basic unit. That is, the paths may be provided with a pipeline register to manage pipeline control.

It is disclosed in Patent Document 1 that the number of data that may be handled is to be increased by reducing the averaged latency, as set out above. That is, the time β since the input of the command (CMD) until the next command (CMD) is reduced by reducing the averaged latency θ.

In contrast, according to certain embodiments, the relation of tradeoff between the latency θ (γ of delay 1) and the power is exploited such as to increase the number of data handled as well as to reduce the power as the number of cycles of the selection time (α) is maintained or reduced. Since data are serially transferred on the read write bus (RWBS) that inputs data to or outputs data from the memory array basic unit, the number of data lines (IO lines) of the read write bus (RWBS) may be reduced without reducing the number of data used for reading/writing data in the memory cell array. If conversely the number of data lines is the same as that of the pre-existing data lines, more data may be written or read. For example, if one of the embodiments is applied to the configuration of FIG. 6 (×36×BL4=144), ×36×BL8=288 data may be written or read.

According to certain embodiments, the charging/discharging current, generated during transfer of data signals in case of accessing the remote end active area and near-end active area, may be reduced to reduce current consumption. This is made possible by the fact that, by providing a pipeline register (buffer) between neighboring memory array basic units on an IO line (data line) on which to transfer data, the data line is divided into a plurality of sections, such that it is sufficient for a driver of the data control circuit to drive one the divided section of the data line. The same holds for the control signal, such as an address/command signal. That is, the control line on which to transfer the control signal includes a pipeline register (buffer) between neighboring memory array basic units and is divided into a plurality of sections.

On the other hand, in the prototype example as shown in FIG. 6, a single driver of the data control circuit drives a data line extending in common from the near end to the remote end, resulting in increased load due to increased memory capacity. It is thus necessary to increase the driver's current driving capability, resulting in increased charging/discharging current generated at the time of transfer of data signals. The same problem persists for control signals, such as address/command signals.

In addition, according to certain embodiments, the driving voltage (amplitude) for the control signal or the data signal, transferred to the memory cell array, is lowered to reduce power consumption. The following describes several exemplary embodiments with reference to drawings.

Exemplary Embodiment 1

Figure 11:
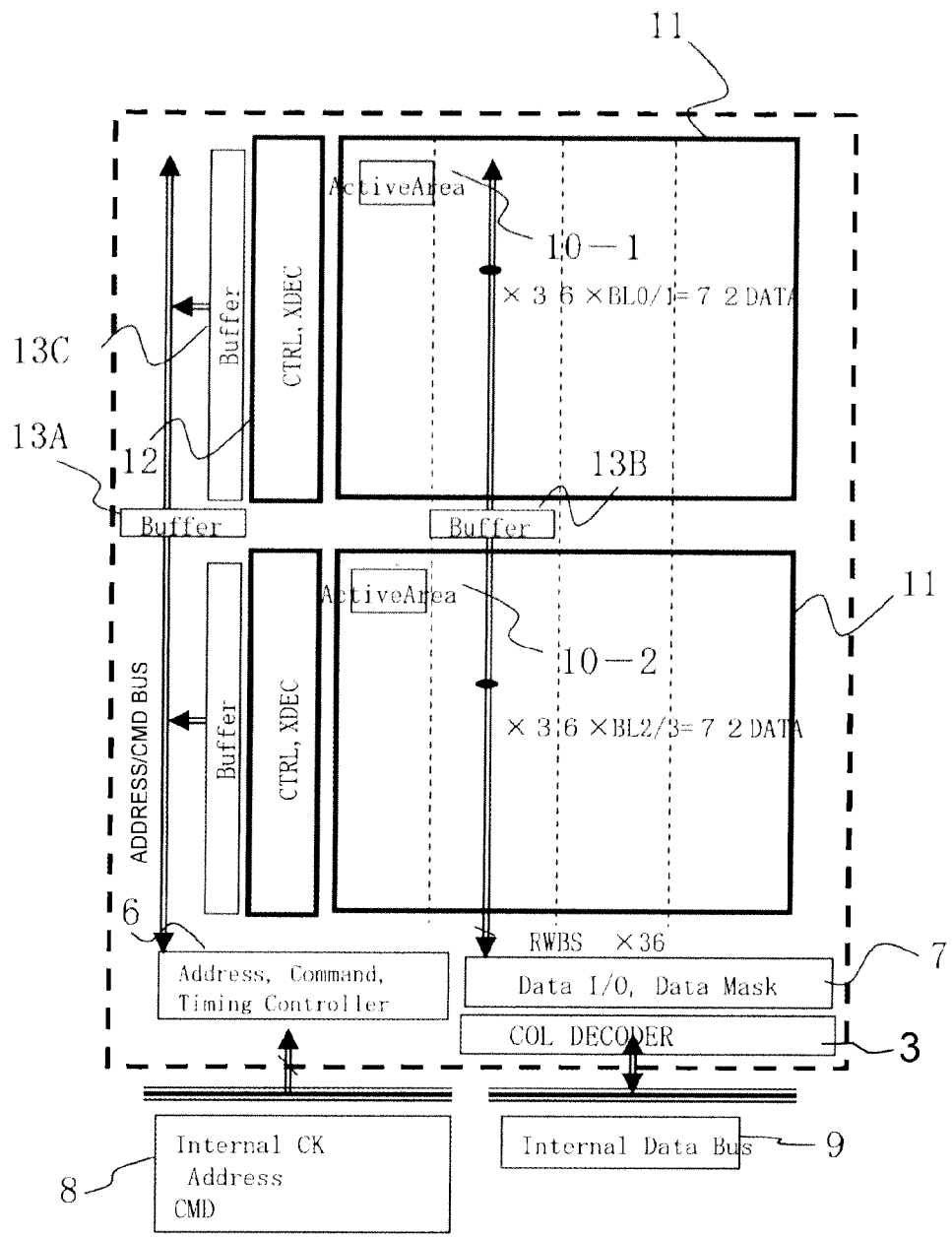
FIG. 11 is a diagram illustrating an exemplary embodiment 1.

FIG. 11 illustrates a configuration of an exemplary embodiment 1. In FIG. 11, the components which are the same as or equivalent to those shown in FIGS. 6 and 8 are denoted by the same reference numerals. The following description is centered on the points of difference from the prototype example of FIG. 6, while the description of the same or equivalent components is omitted.

A memory cell array is divided into a plurality of memory arrays basic units 11 adapted to a pipeline configuration for synchronized operation with a clock signal. Also, control signals, such as address, command or timing signals, and data signals on the read write bus (RWBS), an IO line for data transfer, are divided, with a cycle (period) of a clock signal CLK as reference. The control signals and data signals are thus transferred under pipeline control. Referring to FIG. 11, a bidirectional buffer (address/command buffer) 13C, connected to an address/command bus, and an address/command sub-controller 12, are provided in association with the memory array basic unit 11. The address/command sub-controller 12 receives an output of the address/command buffer 13C to control the memory array basic units 11. There are further provided a buffer 13A and a buffer 13B. The buffer 13A is provided on an address/command bus that transfers control signals, such as address/command, to operate as a pipeline register. The buffer 13B is provided on the read write bus (RWBS) to operate as a pipeline register. The address/command sub-controller 12 receives an address/command, latched by the address/command buffer 13C, to output the address/command received to the memory array basic unit 11. An output of the buffer 13C, an input of which is connected to the address/command bus (ADDRESS/CMD BUS), is connected to the address/command sub-controller 12 to latch the address/command. A control signal and an X-address (row address), output from the address/command sub-controller 12, are supplied to a row controller and an X-coder (CTRL, XDEC). The representation in which the CTRL, XDEC is shown in the same block as the address/command sub-controller 12, is adopted only for the simplification of the drawing.

A control circuit (address command timing controller) 6 receives an address, a command and an internal clock signal from an internal clock/address/command generator 8 to output an address/command/timing signal to the address/command bus, in the same way as in FIGS. 6 and 8. Although each buffer 13 is a bidirectional buffer (see FIG. 31A), it may also be configured as a uni-directional buffer, such as buffer 13C, in which case it may be configured as shown in FIG. 31B.

Figure 31A:
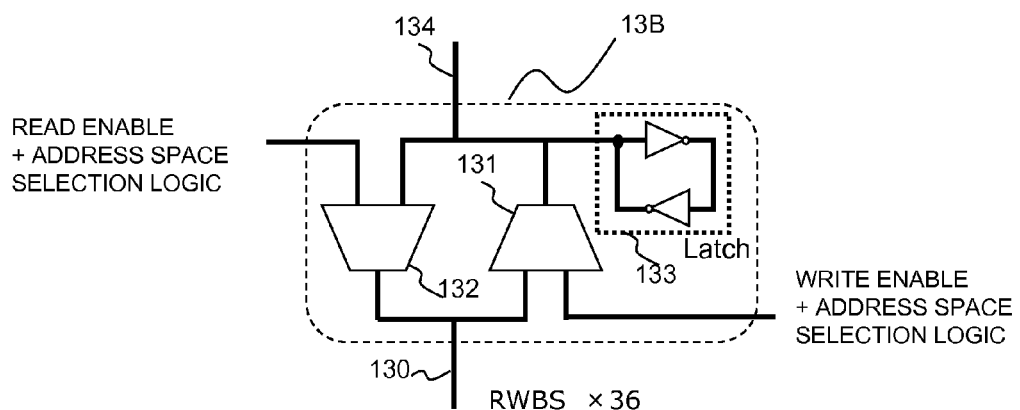
FIGS. 31A, 31B are diagrams illustrating example configurations of a buffer.

Referring to FIG. 31A, the buffer 13B includes, in a bidirectional data buffer 13A, 3-state buffer circuits 131 and 132. The 3-state buffer circuit 131 allows the information of WRITE data of RWBS 130 to pass to RWBS 134 when the WRITE Enable+address space selection logic is in an active state (when WRITE Enable is in active state and the address space selection logic is in active state). The 3-state buffer circuit 131 is in an off-state (in a Hi-Z (high impedance) state) when the WRITE Enable+address space selection logic is in a non-active state (when WRITE Enable is in a non-active state and/or the address space selection logic is in a non-active state). The 3-state buffer circuit 132 allows READ data of RWBS 134 to pass to RWBS 130 when the READ Enable+address space selection logic is in an active state (when READ Enable is in an active state and the address space selection logic is in an active state). The 3-state buffer circuit 131 is in an off-state (in Hi-Z state) when the READ Enable+address space selection logic is in a non-active state (when READ Enable is in a non-active state and/or the address space selection logic is in a non-active state). An output of the buffer circuit 131 is connected to a latch circuit 133. The latch circuit 133 includes two inverters, with an input of one of the two inverters receiving an output of the other inverter and an input of the other inverter receiving an output of the one inverter. WRITE Enable is activated at WRITE time. When an address signal corresponds to the memory array basic unit connected to the RWBS side 134, the address space selection logic is activated. The WRITE Enable or the address space selection logic is activated in synchronization with, for example, a memory clock signal CLK that prescribes a cycle. READ Enable is activated at read time and, when the address signal corresponds to the memory array basic unit connected to the RWBS side 134, the address space selection logic is activated. READ Enable or the address space selection logic is activated in synchronization with the memory clock signal CLK.

Figure 26:
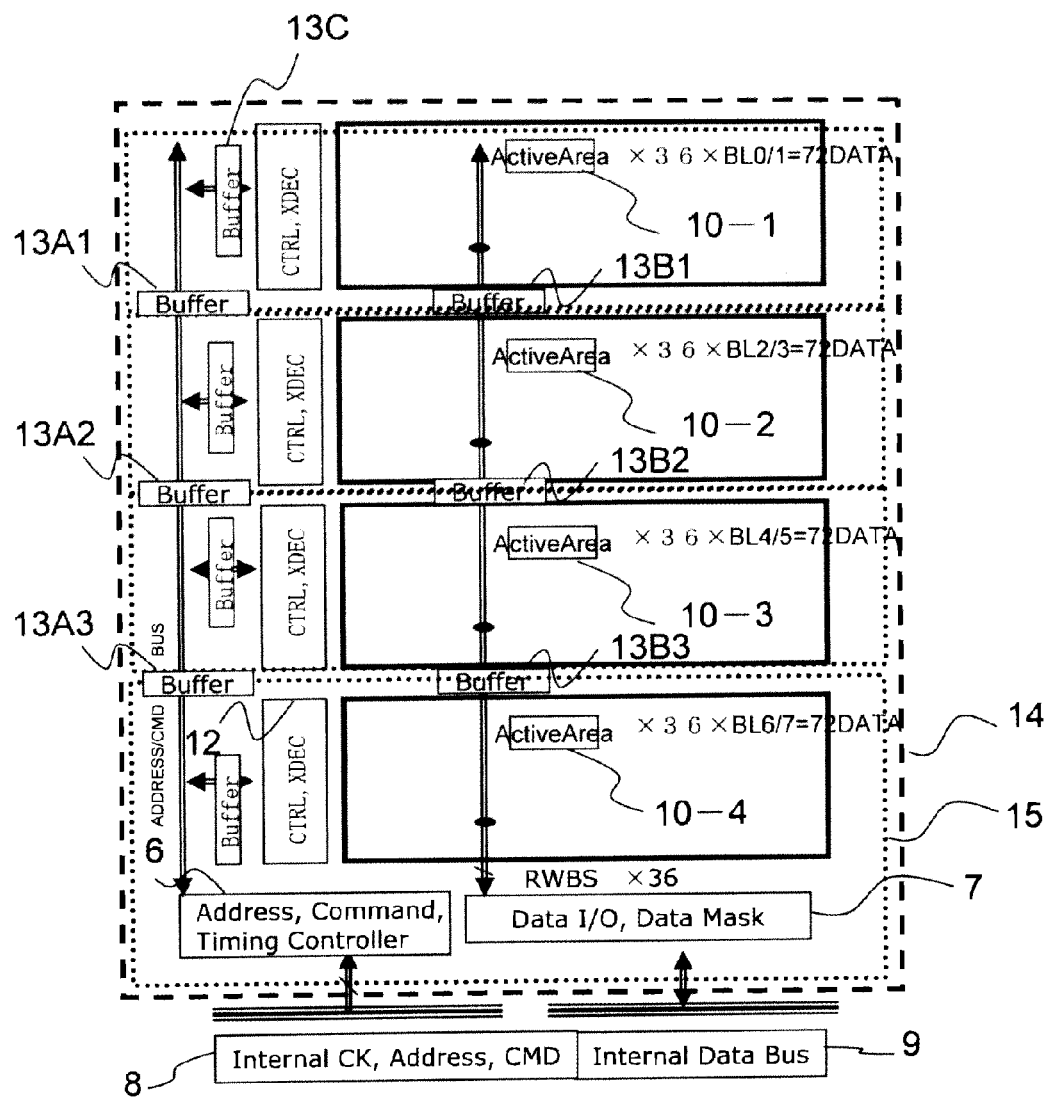
FIG. 26 is a diagram illustrating an exemplary embodiment 4.

In the exemplary embodiment 4 which will be described later with reference to FIG. 26, READ Enable+address space selection logic and WRITE Enable+address space selection logic may be fixed at the non-active state to invalidate the pipeline control (pipeline register) function by the buffers 13A and 13B.

Figure 31B:
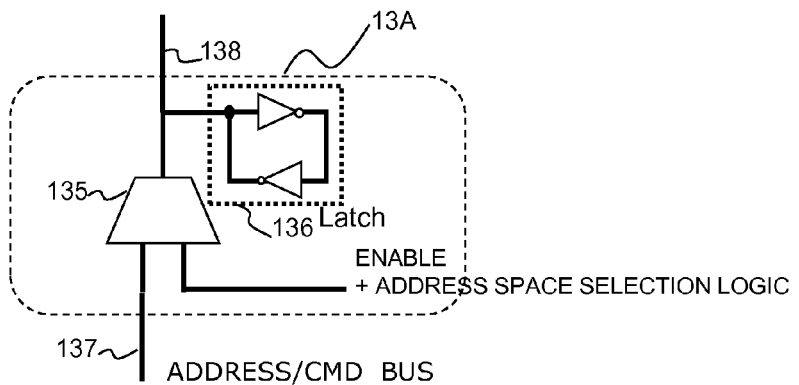

As shown in FIG. 31B, the buffer 13A includes a 3-state buffer circuit 135 that outputs an address command of an ADDRESS/CMD BUS 137 when a signal of Enable+address space selection logic is active and that is in an off-state (in Hi-Z) state when the Enable+address space selection logic is in a non-active state. An output of the buffer circuit 135 is connected to a latch circuit 136. The latch circuit 136 includes two inverters, with an input of one of the two inverters receiving an output of the other inverter and an input of the other inverter receiving an output of the one inverter. Enable is activated at an access time. When the buffer circuit 135 corresponds to the memory array basic unit being accessed, ENABLE+address space selection logic, entered to the buffer circuit 135, is activated.

In FIG. 11, though not limited thereto, it is assumed that the number of data terminals (terminals connected to the internal data bus 9) is 36, and the burst length BL is 4. The read write bus (RWBS) has 36×2=72 bidirectional data lines (IO lines). The read write bus (RWBS), extended through the memory array basic unit 11 shown on a lower side of FIG. 11, is extended through the memory array basic unit 11 shown on an upper side of FIG. 11. 2-bit data BL0 and BL1, out of 4 column data BL0 to BL3, corresponding to the burst length=4, are output in parallel on two data lines of the read write bus (RWBS) from the data control circuit 7, in advance of BL2 and BL3, and latched by the buffer 13B, so as to be then transferred to the active area 10-1. At a timing of latching of the 2-bit data BL0 and BL1 by the buffer 13B, the 2-bit data BL2 and BL3 are output from the data control circuit 7 on the two data lines on which BL0 and BL1 were already transferred, and are transferred to the active area 10-2. It is noted that the data BL2 and BL3, transferred later on 2-bits on the read write bus (RWBS), are not latched on the buffer 13B and are not transferred to the active area 10-1 of the memory array basic unit 11 shown on the upper side of FIG. 11.

Figure 4:
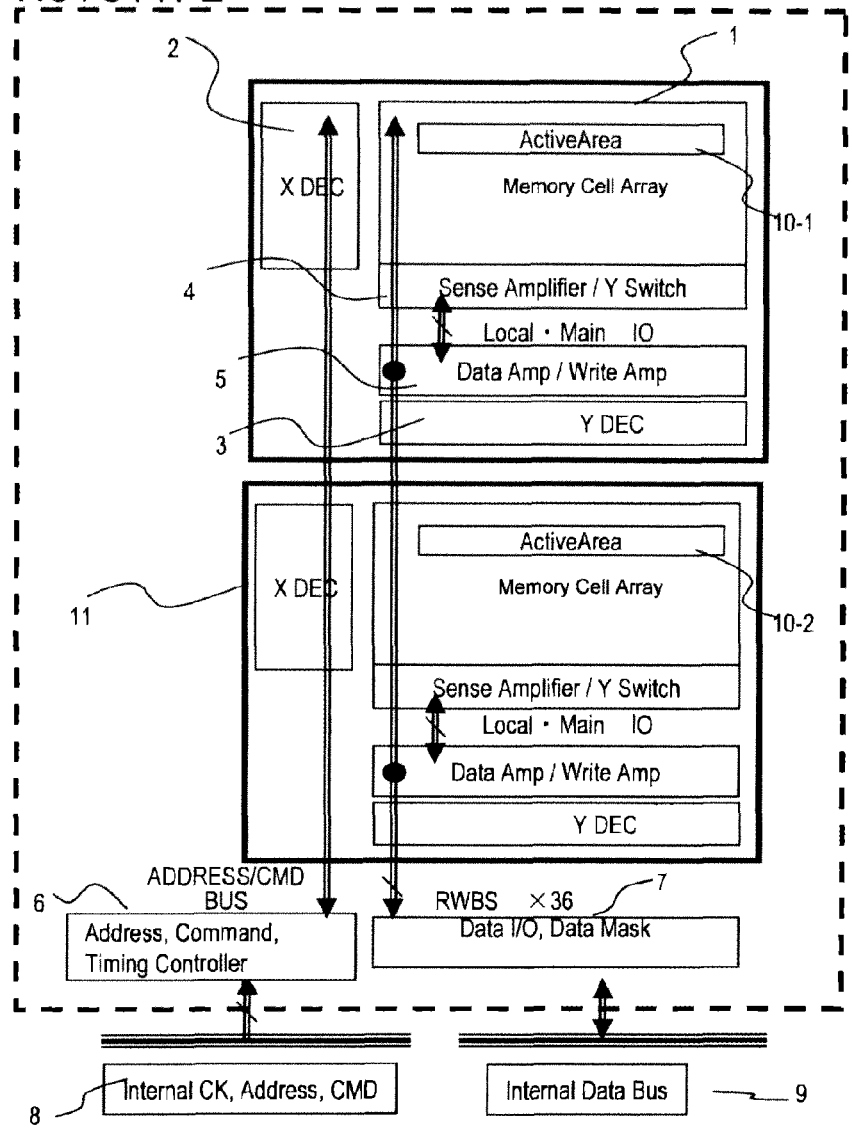
FIG. 4 is a diagram illustrating another prototype example.
Figure 5:
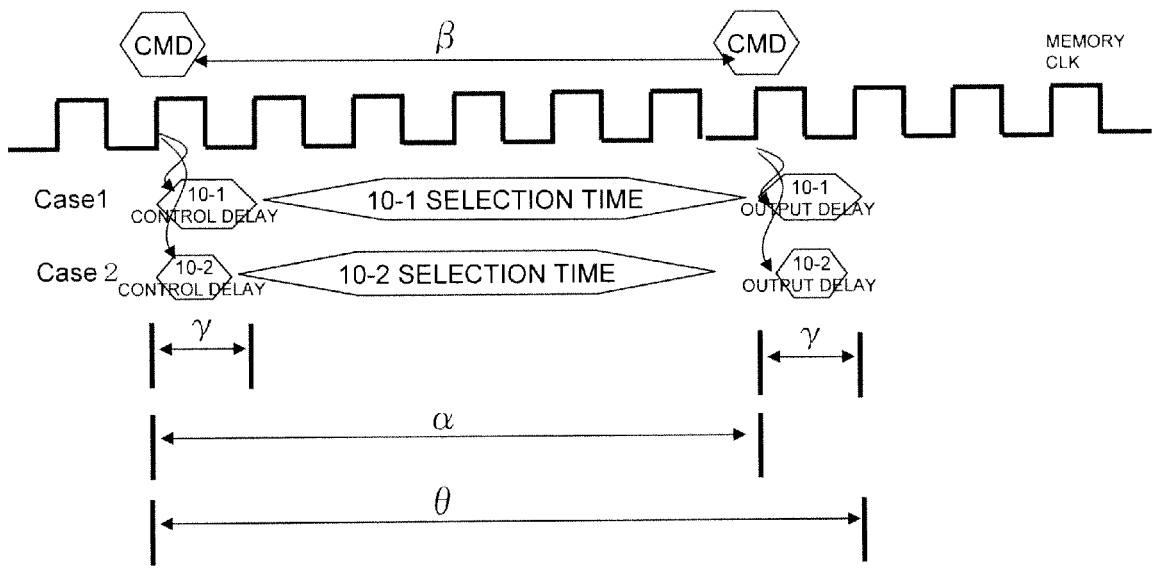
FIG. 5 is a timing chart illustrating operations of the prototype example of FIG. 4.
Figure 35:
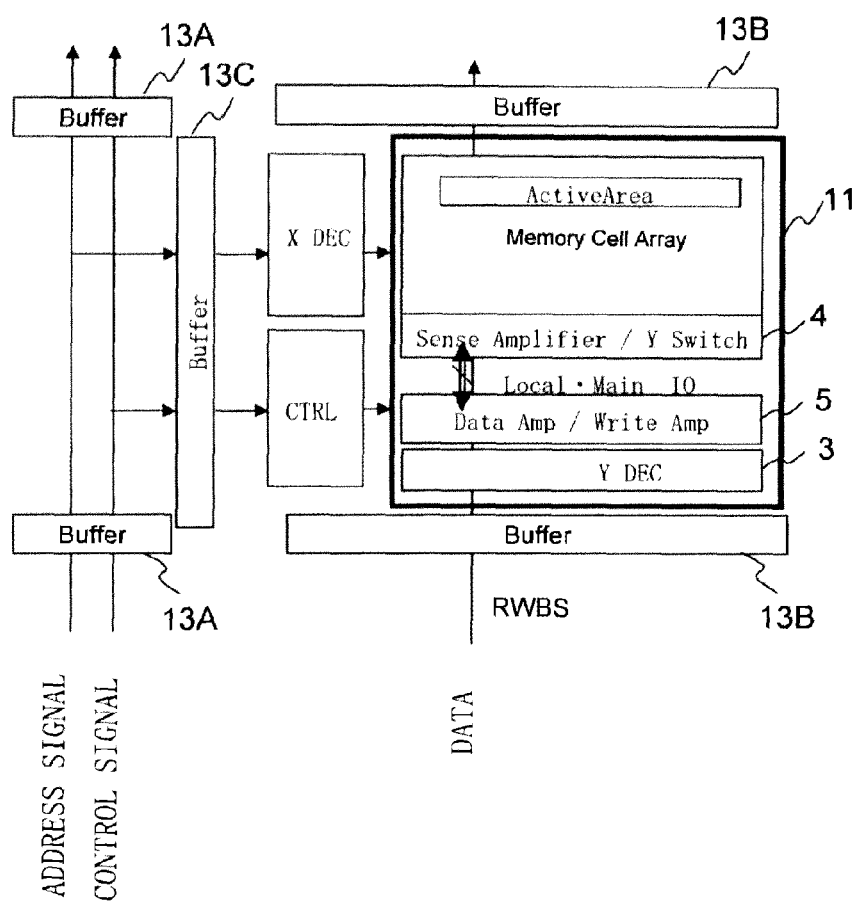
FIG. 35 is a diagram illustrating an example configuration of a buffer and a memory array basic unit in each exemplary embodiment.

FIG. 35 illustrates an example configuration of the buffers 13A and 13B and 13C and the memory array basic unit 11. The memory array basic unit 11 is similar in configuration to that shown in FIG. 4 and includes a column decoder 3. An address signal on the address/command bus is delivered from the buffer 13C to the row decoder (XDEC), while the Y-address is supplied to a column decoder (YDEC). A control signal on the address/command bus (command signal) is delivered from the buffer 13C to the control circuit (CTRL). The read write bus (RWBS) is connected to a data amplifier/write amplifier 5, and is connected to a sense amplifier of a column selected by the Y switch turned on by a column select signal from the YDEC. It is noted that the buffers 13A and 13B, shown lowermost in FIG. 35, act as the control circuit 6 and as the data control circuit 7 for the nearest memory array basic unit 11, while the buffers 13A and 13B shown uppermost in FIG. 35 act as bus termination circuits for the remotest memory array basic unit 11.

Figure 12:
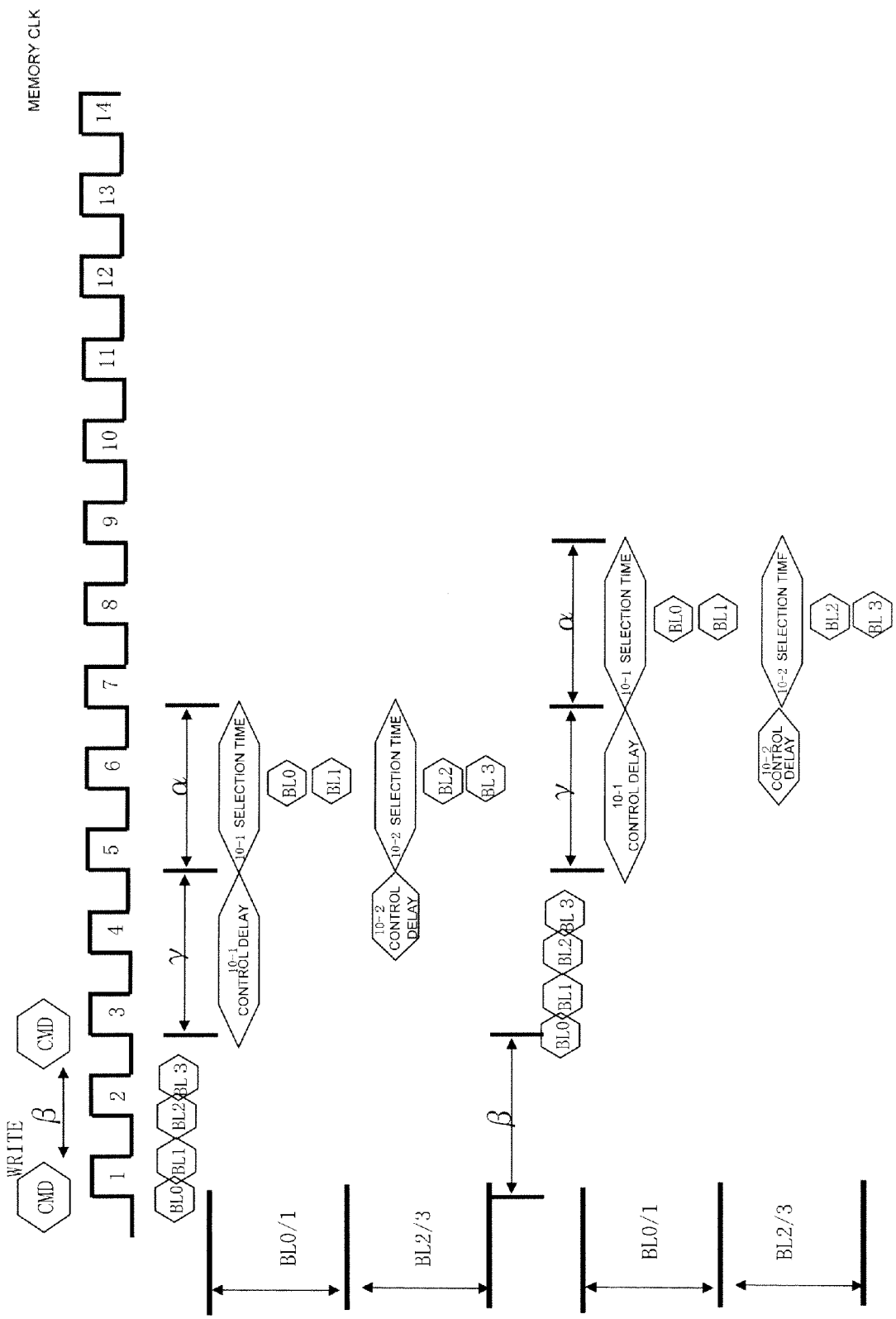
FIG. 12 is a timing chart illustrating the WRITE operation of the exemplary embodiment 1.
Figure 13:
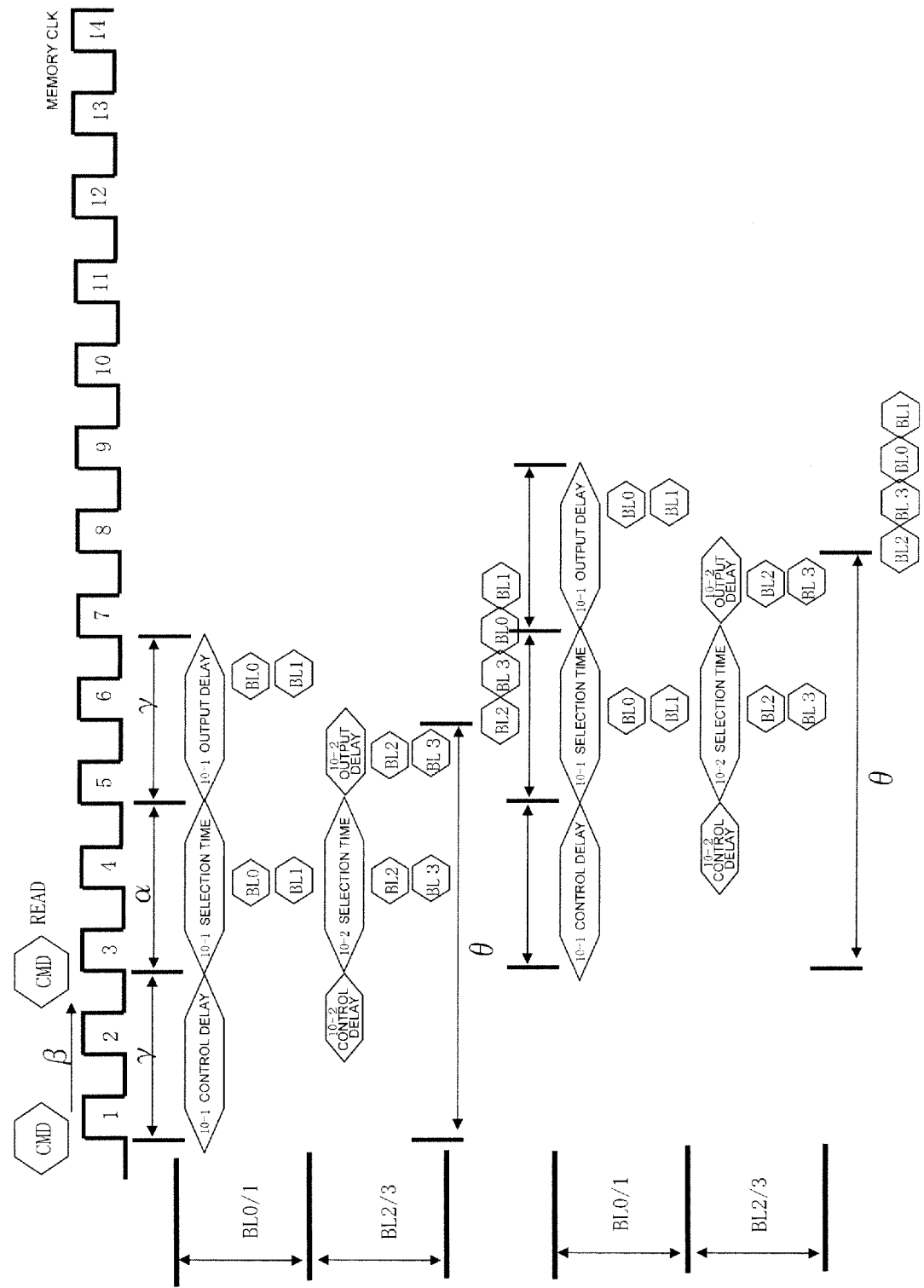
FIG. 13 is a timing chart illustrating the READ operation of the exemplary embodiment 1.

FIG. 12 illustrates the timing operation of the write operation of FIG. 11. FIG. 13 illustrates the read operation of FIG. 11. In this figure, four bit data of BL0 to BL3 are serially delivered at a double data rate to the 36 data terminals (DQ) in correspondence with the burst length of 4.

The address signal, control signal and the timing signal, controlling the active areas 10-1 and 10-2, and the data (BL0/1 and BL2/3), written in the active areas 10-1 and 10-2, are transferred from the control circuits 6 and 7 within two cycles (within the period of γ). Data write allocation is made at this time so that the data BL0 and BL1 will be written in the active area 10-1 and so that the data BL2 and BL3 will be written in the active area 10-2.

The ROW addresses, controlling the active areas 10-1 and 10-2 of the memory array basic unit 11, may or may not be common to the active areas 10-1 and 10-2.

In the prototype examples (FIGS. 7 and 9), the period γ usable for transfer of the control signal or the data signal is 1 cycle. In the present exemplary embodiment, the period γ usable for transfer of the control signal or the data signal is 2 cycles, as shown in FIG. 12. The delay γ of the control signal or the data signal, transferred to the active area 10-1 (10-1 control delay) is 2 cycles, with the delay γ of the control signal or the data signal, transferred to the active area 10-2 (10-2 control delay) being shorter than the 10-1 control delay.

The sub-controller 12 receives the timing signal generated by the control circuit 6 to newly generate or modify the timing signal to generate the period α of the ROW cycle time tRC. Moreover, the information is retained in e.g., the buffer 13C to guarantee the write operation in the memory cells in the memory array basic unit 11.

In the present exemplary embodiment, the data BL0 and BL1, out of the serially delivered write data (4-bit data BL0 to BL3) with the burst length=4, are written in parallel in the active area 10-1, while the data BL2 and BL3 are written in parallel in the active area 10-2, as shown in FIG. 12.

In READ operation, the control delay and the output delay γ in the active area 10-1 are both 2 cycles, with the control delay and the output delay in the active area 10-2 being shorter than those in the active area 10-1, as shown in FIG. 13. The 2-bit data BL0 and BL1 are read from the active area 10-1, while the 2-bit data BL2 and BL3 are read from the active area 10-2, during the selection time α (2 cycles). During the output delay γ, the 2-bit data BL2 and BL3 from the active area 10-2 get to the data control circuit 7 in one cycle. The 2-bit data BL0 and BL1 from the active area 10-1 get to the data control circuit 7 via the buffer 13C in two cycles with a delay with respect to the 2-bit data BL2 and BL3. The data control circuit 7 transforms the parallel 4-bit data of BL2, BL3, BL0 and BL1 into serial 4 bits which are output in 2 cycles (double data rate) from the data terminal. On the whole, serial 4-bit read data are output from the 36 data output terminals. A cycle time since the CMD (READ) is inputted until the first bit data BL2 is outputted is 5 (latency θ).

For both WRITE and READ, the control delay/output delay is determined by the characteristic of the remote end memory cell. The making interval of consecutive commands (CMD to CMD period β) is 2 cycles, while the selection time α of the active area is 2 cycles.

Figure 14:
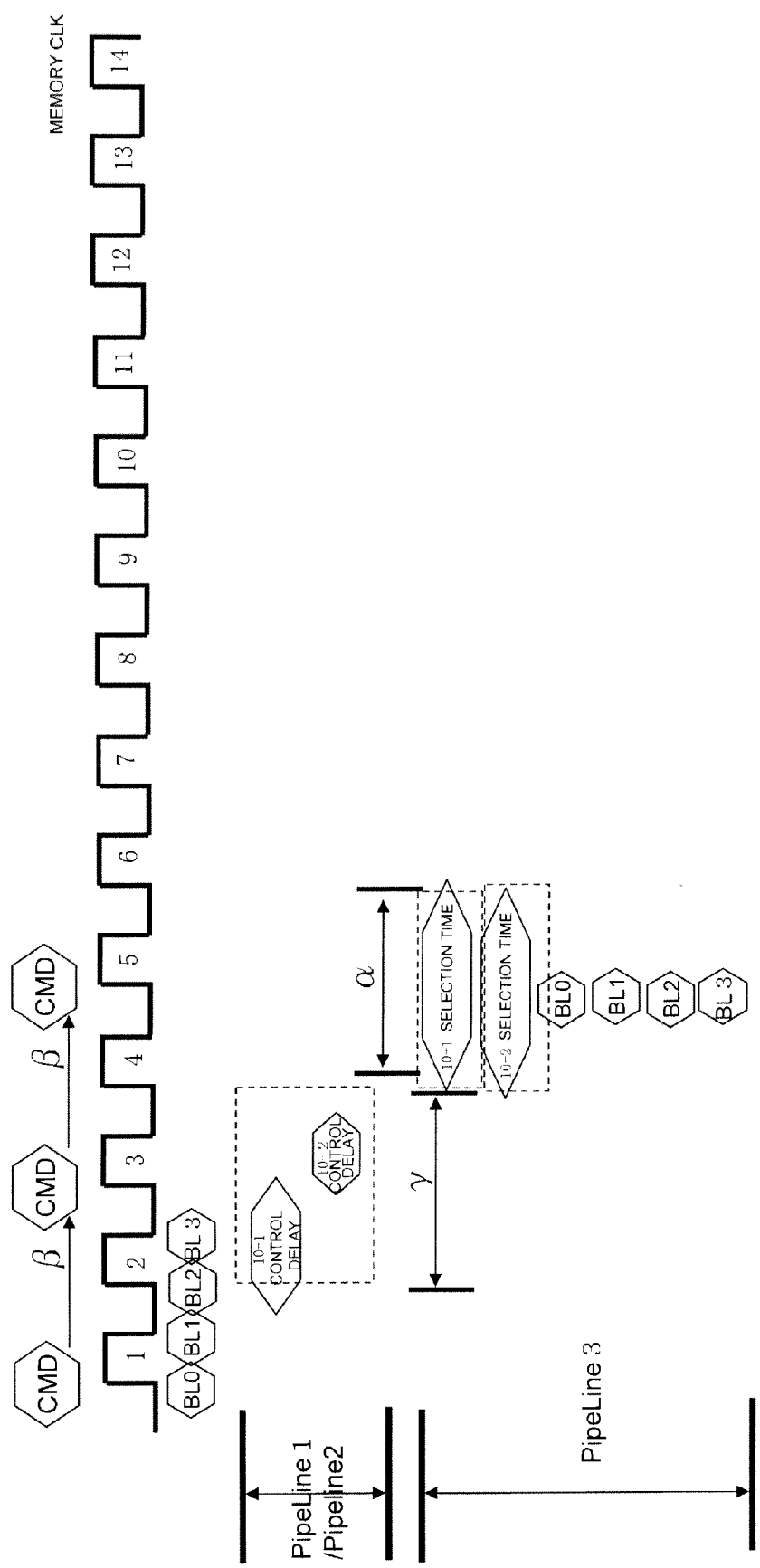
FIG. 14 is a timing chart illustrating the pipeline of the WRITE operation of the exemplary embodiment 1.

FIG. 14 is a timing chart illustrating another example of a write operation in the exemplary embodiment 1 of FIG. 11. In correspondence with the burst length=4, 2 cycles are needed for serially inputting the 4-bit data of the columns BL0 to BL3. When the BL0 and BL1 are prepared, transfer of the control signal and the data signal to the active area 10-1 is started.

The data BL0 and BL1, already prepared, are transferred on the read write bus (RWBS) from the data control circuit 7 via the buffer 13B towards the active area 10-1 in two cycles (2-stage pipeline) (10-1 control delay). When the data BL2 and BL3, serially inputted next to the data BL0 and BL1, are prepared, transfer of the control signal and the data signal to the active area 10-2 is started. The data BL2 and BL3 are transferred from the data control circuit 7 towards the active area 10-2 on the read write bus (RWBS) (10-2 control delay).

During the control delay γ, the control signal and the data signal are transferred through two stages of pipelines (Pipeline1 and Pipeline2).

Outputs from the buffers 13A and 13B and outputs of the control signal and the data signal to the address/command bus and the read write bus (RWBS) from the control circuits 6 and 7 are overlapped temporally. The buffers 13A and 13B receive the control signal and the data signal to the active area 10-1 transferred on the address data bus and the read write bus (RWBS). The control signals, such as address/command, are supplied to the buffer 13C and a control XDEC circuit selects the active area 10-1 or 10-2 of the memory cell array.

The data BL0 and BL1 are transferred to the active area 10-1 through the two stages of pipelines (Pipeline1 and Pipeline 2). On the other hand, the data BL2 and BL3 get to the active area 10-2 through the single stage pipeline (Pipeline2), after which data is actually written in the active areas 10-1 and 10-2 of the memory array basic units (row cycle time tRC: α) through the third stage pipeline (Pipeline3).

Figure 15:
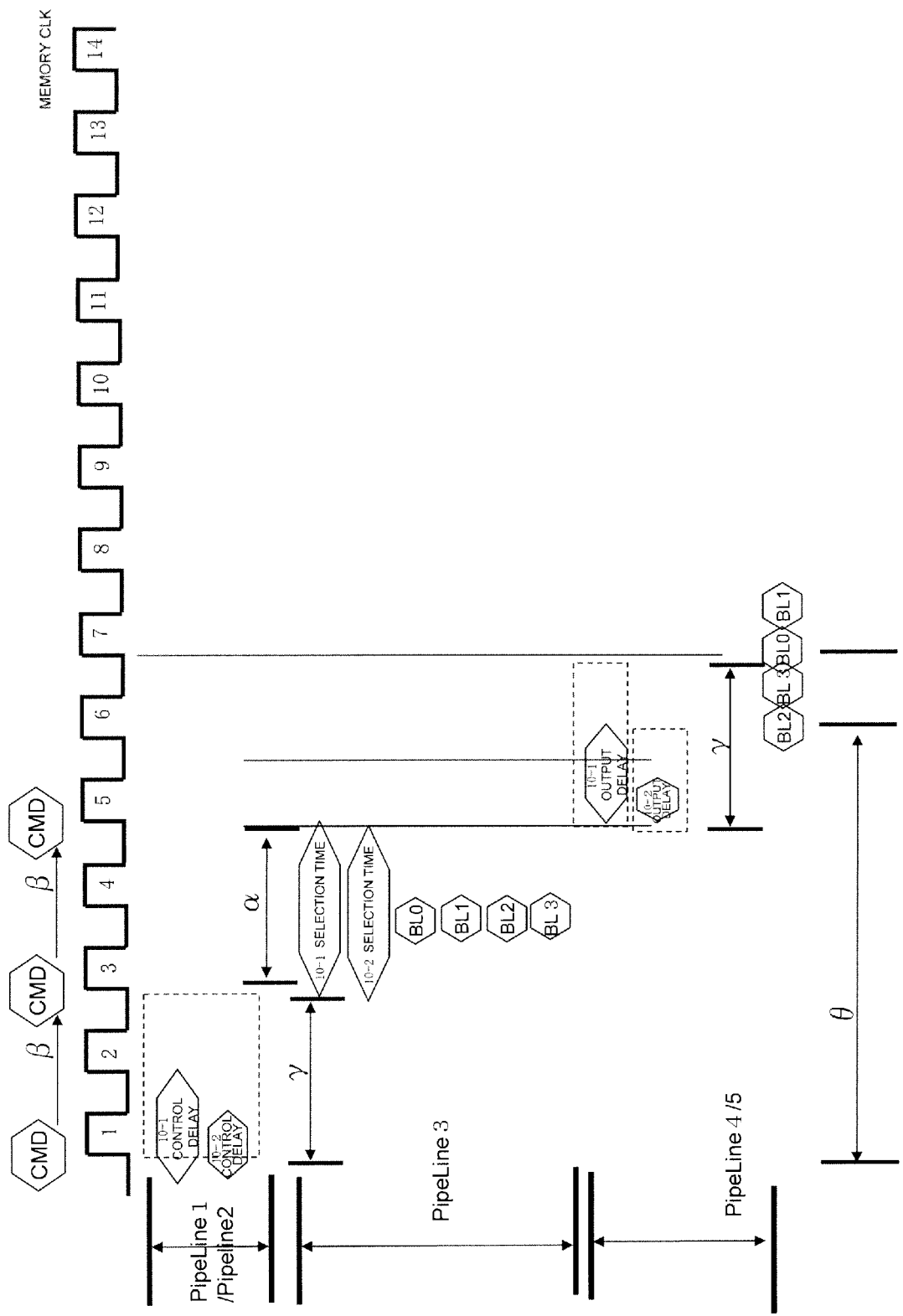
FIG. 15 is a timing chart illustrating the pipeline of the READ operation of the exemplary embodiment 1.

FIG. 15 is a timing chart showing another example read operation of the exemplary embodiment 1 of FIG. 11. When the CMD (READ command) has been delivered, a control signal (command)/address signal from the control circuit 6 is transferred towards the active areas 10-1 and 10-2 via buffer 13A on the address/command bus through the two-stages of pipelines with control delay γ (Pipeline1 and Pipeline 2).

In FIG. 15, the control signal (command)/address signal from the control circuit 6 is expressed as separate signals (10-1 control delay and 10-2 control delay) for the active areas 10-1 and 10-2. However, signals may be transferred as a common signal, in which case higher efficiency may be attained insofar as power consumption is concerned.

In case the control signal (command)/address signal from the control circuit 6 is to be a signal common to the active areas 10-1 and 10-2, the control signal (command)/address signal, outputted during the cycle 1 from the control circuit 6 to the address/command bus, is transferred during the cycle 2 via the buffer 13A to the active area 10-1. During the cycle 2, the control circuit 6 holds the same control signal (command)/address signal as that for the cycle 1 and outputs the signal to the address/command bus. The signal is transferred to the active area 10-2. The same signal is maintained during the cycle 2, that is, in case the signal is High/Low, the same signal High/Low is maintained during the cycle 2. Hence, higher efficiency may be attained because of absence of switching of charging/discharging.

Subsequently, by the third pipeline (Pipeline3), data is read from the memory cell array within the row cycle time α.

In reading the data BL0 to BL3, which have been described in connection with the write operation of FIG. 14, the data BL0 and BL1 are read from the active area 10-1 via the buffer 13B on the read write bus (RWBS) through two-stages of pipelines (Pipeline 4 and Pipeline 5) to the data control circuit 7. The data BL2 and BL3 are read from the active area 10-2 on the read write bus (RWBS) through a single stage pipeline (Pipeline 4) to the data control circuit 7.

The data BL2 and BL3, which arrives first at the data control circuit 7 from the read write bus (RWBS), are serially output in the sequence of BL2 and BL3. Next, the data BL0 and BL1 are serially output in the sequence of BL0 and BL1. The number of cycles since CMD (READ) is inputted until the first data BL2 is outputted is 5 (=latency θ).

The outputting sequence of BL0 to BL3 may be re-arranged at a stage of outputting to the data terminal. Or, instead of re-arranging, the outputting sequence of BL0 to BL3 may be defined by design specifications.

It is noted that, in FIGS. 14 and 15, the internal operations for the second and third ones of consecutive commands (CMD) are omitted, that is, not shown.

Returning to FIGS. 12 and 13, in case of receiving consecutive commands, the apparent cycle of the row cycle time (α: selection time) is reduced by the pipelining of the row cycle time (α) and the control delay (γ) of the control signal and the data signal. That is, in the example shown in FIG. 12, the row cycle time (α: selection time) for the CMD delivered last time is temporally overlapped with the control delay (γ) of the control signal and the data signal for the current CMD, that is, these two co-exist at the same time instant), and a pipelining operation is going on. The output delay (γ) to the CMD delivered last time is temporally overlapped with the row cycle time (α: selection time) for the current CMD, that is, these two co-exist at the same time instant, indicating that a pipelining operation is proceeding.

Specifically, the address/command bus for transferring a control signal, such as an address or a command, and the read write bus (RWBS), an IO line for transferring the data signal, are pipeline-controlled to separate the control delay (γ) of the control signal and the data signal from the row cycle time (α: selection time). The time period γ has multiple cycles in correspondence with the pipeline control (the prototype example: 1 cycle; the present exemplary embodiment: 2 cycles), while the number of cycles of α is reduced to match to that of γ (the prototype example: 3 cycles; present exemplary embodiment: 2 cycles). In this manner, for two commands delivered at an earlier time and at a later time, α for the earlier command is temporally overlapped with the later command, by way of a performing pipelining operation.

In the present exemplary embodiment, the sub-controller 12 operates to cause the control signal and the data signal in the address/command control circuit 6 and the data control circuit 7 in the memory cell array to be pipelined by the buffers (pipeline registers). The sub-controller 12 controls the memory array basic unit nearer to the control circuits 6 and 7 and those remoter from the control circuits 6 and 7 such that they are separated from each other. In this manner, the delay in the control signal and the data signal (control delay and output delay γ) are separated from the ROW cycle tRC (α) and α is reduced to avoid deterioration of the data rate for the inputting/outputting of external data.

Reduction of power consumption by exploiting the trade-off relation will now be described in connection with the read write bus (RWBS) in the memory cell array configuration of the present exemplary embodiment.

Table 1 shows α, γ and θ of the present exemplary embodiment in comparison with those of the prototype example. The parameters of the prototype example shown in FIGS. 7A and 7B, which is used as a reference are as follows:
control delay γ: 1 cycle;
selection time α: 3 cycles;
latency θ: 4 cycles; and
command-to-command interval β: 3 cycles.

In the exemplary embodiment 1,
control delay/output delay: 2 cycles (=2γ),
selection time: 2 cycles (=(2/3)α,
latency=4 cycles (=(5/4)θ); and
command-to-command interval=2 cycles (=(2/3)β).

TABLE 1

|  | Td1 (1/f1) | Td2 (1/f2) | Latency | Command interval |
|---|---|---|---|---|
| Related technique | 1 cycle = 1 γ | 3 cycle = 1 α | 4 cycle = 1 θ | 3 cycle = 1 β |
| Exemplary embodiment | 2 cycle = 2 γ | 2 cycle = (2/3) α | 5 cycle = (5/4) θ | 2 cycle = (2/3) β |

TABLE 1-continued

|  | Td1 (1/f1) | Td2 (1/f2) | Latency | Command interval |
|---|---|---|---|---|
| 1 Modification | 3 cycle = 3 γ | 3 cycle = 1 α | 7.5 cycle = (15/8) θ | 3 cycle = 1 β |

The power of the control delay γ of the prototype example of FIGS. 7A and 7B is taken to be $P=n \times c \times f_1 \times V^2$. In the exemplary embodiment 1, the control delay γ is 2 cycles which is double that of the prototype example. However, the data line of the read write bus (RWBS) is driven with a 1 cycle because of pipeline control. The data line is one-half of that of the prototype example and hence the capacitance C is also one-half of that on the data line of the prototype example. Hence, the frequency is the same as the frequency f1 of the prototype example. In the read write bus (RWBS) in the exemplary embodiment 1, the total number of data lines for parallel transmission of bit data is one-half the number n of the prototype example. The capacitance of the data line is c/2 because of division into two of the data line by the pipeline register. However, due to the two-stage pipeline configuration, the total capacitance is (c/2)×2. Ultimately, the power P1 of the control delay γ of the exemplary embodiment $1=(n/2) \times (c/2) \times 2 \times f_1 \times V^2=P/2$, that is, ½ of that of the prototype example. The delay of the selection time is reduced to (2/3), such that, with a constant power delay product, the power is 3/2-tupled.

In the WRITE operation, from the ratio of the sum of the power of the control delay and the selection time in the exemplary embodiment 1 to that in the prototype example, the ratio of the power of the exemplary embodiment 1 to that of the prototype example may be given approximately by (Exemplary embodiment 1)/(Prototype example)=(½+
3/2)/(1+1)=100%.

In the READ operation, from the ratio of the sum of the power of the control delay, selection time and the output delay in the exemplary embodiment 1 to that in the prototype example, the power ratio is given by (Exemplary embodiment 1)/(Prototype example)=(½+
3/2+½)/(1+1+1)=83.3%.

In the modification of the exemplary embodiment 1, the values for α and β are adapted for comparison under the assumption that the numbers of input data and output data that may be inputted or outputted to or from the semiconductor memory as a system are constant. If the power delay product is the same and if the delay Td1 may be set at 3γ (3 cycles), the power may be reduced to one/third in an ideal case. The power consumption involved in data input/output or the operation of the control circuits 6 and 7 concerning the control delay γ is one-third of that of the prototype example. In the present modification, the ROW cycle time is α and adapted to the memory array operation. Hence, the power consumption is the same as that of the prototype example. If the current consumption in the delay of the control signal and the data signal (control delay γ) is non-negligible as compared to the current consumption during the ROW cycle time, and has become equal to it, the ratio of the power consumption in its entirety, derived from the power delay product=constant, may be given by the following equation for the WRITE operation:

(Modification)/(Prototype example)=(⅓+1)/
(1+1)=66%

In the READ operation:

(Modification)/(Prototype example)=(⅓+1+⅓)/(1+1+1)=55.5%.

The actual circuit design is complex such that power consumption may not be determined by the above mentioned simplified calculations. However, reduction of power consumption in γ alone to one half may reduce the total current consumption to 75%.

By the configuration of the memory cell array of the present exemplary embodiment, it has become possible to reduce power consumption. The meritorious effect of the embodiments may further be enhanced in case current consumption in γ is not negligible against that in α and further the large/small ratio of the (current consumption in γ)>(current consumption in α) increases further.

The data line (IO line) in the read write bus (RWBS) in the memory cell array configuration in the exemplary embodiment 1 will now be described. By allocating BL0/BL1 and BL2/BL3 to the active areas 10-1 and 10-2, respectively, 144 bit data of BL0 to BL3, corresponding to the number of the data terminals×36, with the burst being 4, are made to be inputted/outputted on 72-data data lines (IO lines). In contrast, in the prototype example of FIG. 6, data is inputted/outputted on 144 data lines (IO lines) for 144 bit data from the control circuit 7.

This is made possible in the exemplary embodiment 1 by a memory cell array configuration in which the data lines (IO lines) of the read write bus (RWBS) are pipeline-controlled to enable serial transfer in time-division.

Since data may be inputted/outputted within the memory cell array by 72 out of the total of 144 data lines (IO lines), an area for 72 excess data lines (IO lines) may be exploited as interconnect resources. For example, power supply interconnects may be provided in an area of interconnect resources for the excess data lines (IO lines).

Conversely, in the exemplary embodiment 1, 576 bit data may be inputted/outputted in 288 IO lines in which 288 bit data can be inputted/outputted at the maximum of the IO lines in the prototype example.

Exemplary Embodiment 2

In semiconductor memories, it is a common practice to switch among a plurality of operation specifications within the same chip. As an exemplary embodiment 2, a configuration of 36 data terminals and burst length=8 will be described, and specifications for switching in the inside of the chip from the exemplary embodiment 1 are also described.

Figure 16:
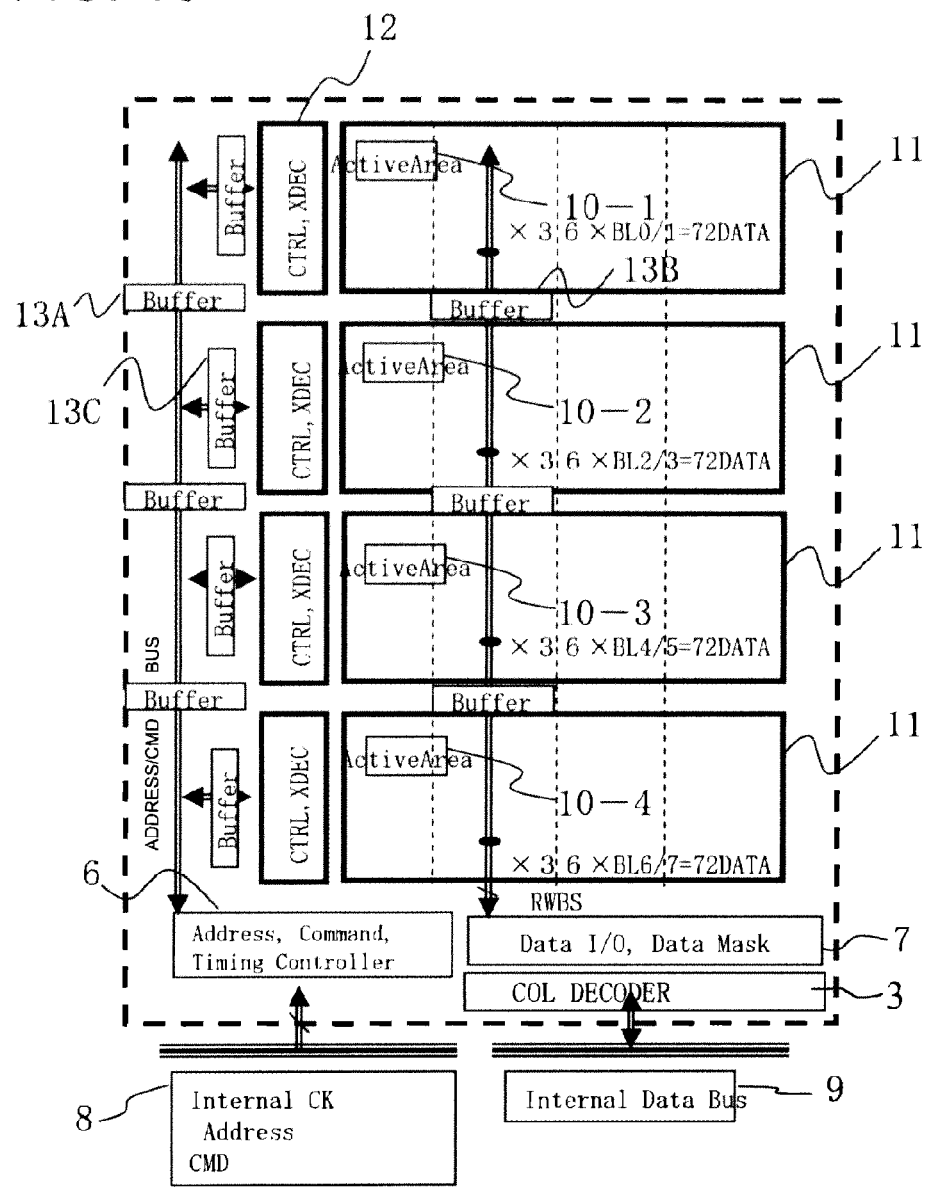
FIG. 16 is a diagram illustrating an exemplary embodiment 2.

FIG. 16 illustrates a configuration example of the exemplary embodiment 2 with the burst length=8. In the exemplary embodiment 1 with the burst length=4, the memory cell array is divided into two basic units 11. In the exemplary embodiment 2, the memory cell array is divided into four memory array basic units 11, as shown in FIG. 16. Columns BL0/BL1, BL2/BL3, BL4/BL5 and BL6/BL7 are respectively allocated to the active areas 10-1, 10-2, 10-3 and 10-4 in the respective four memory array basic units 11. In the exemplary embodiment 2, the total number of the data lines of the read write bus (RWBS), required for the configuration of the burst length=8 and the number of the data terminals=36, is 72. The address/command bus from the control circuit (address, command, timing controller) 6 and the read write buses (RWBS) from the data control circuit 7 includes three buffers (pipeline registers) 13A, 13B and 13C thus forming four-stage pipelines in correspondence with the memory array basic units 11 from the near end to the remote end.

Figure 17:
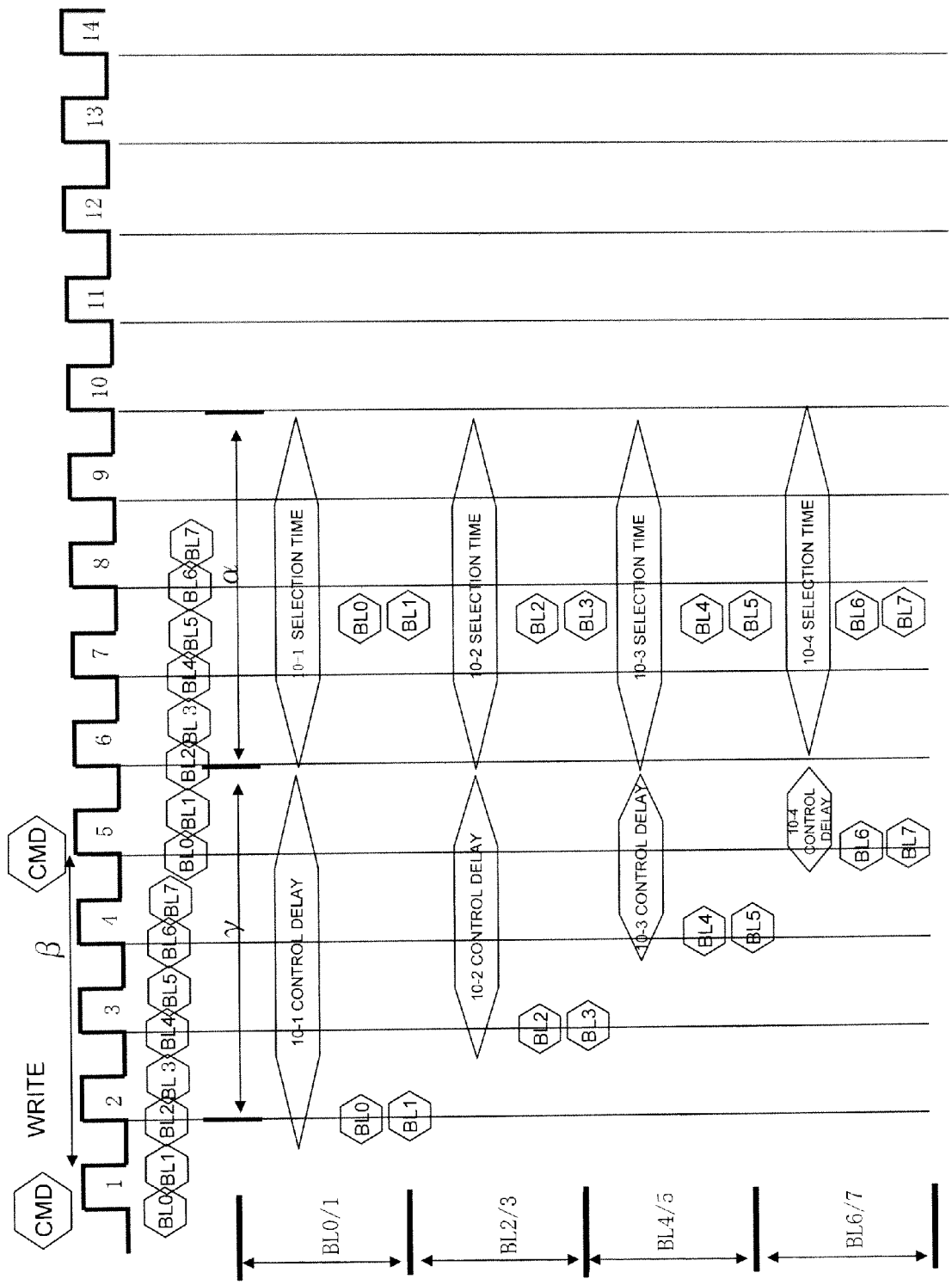
FIG. 17 is a timing chart illustrating the WRITE operation of the exemplary embodiment 2.
Figure 18:
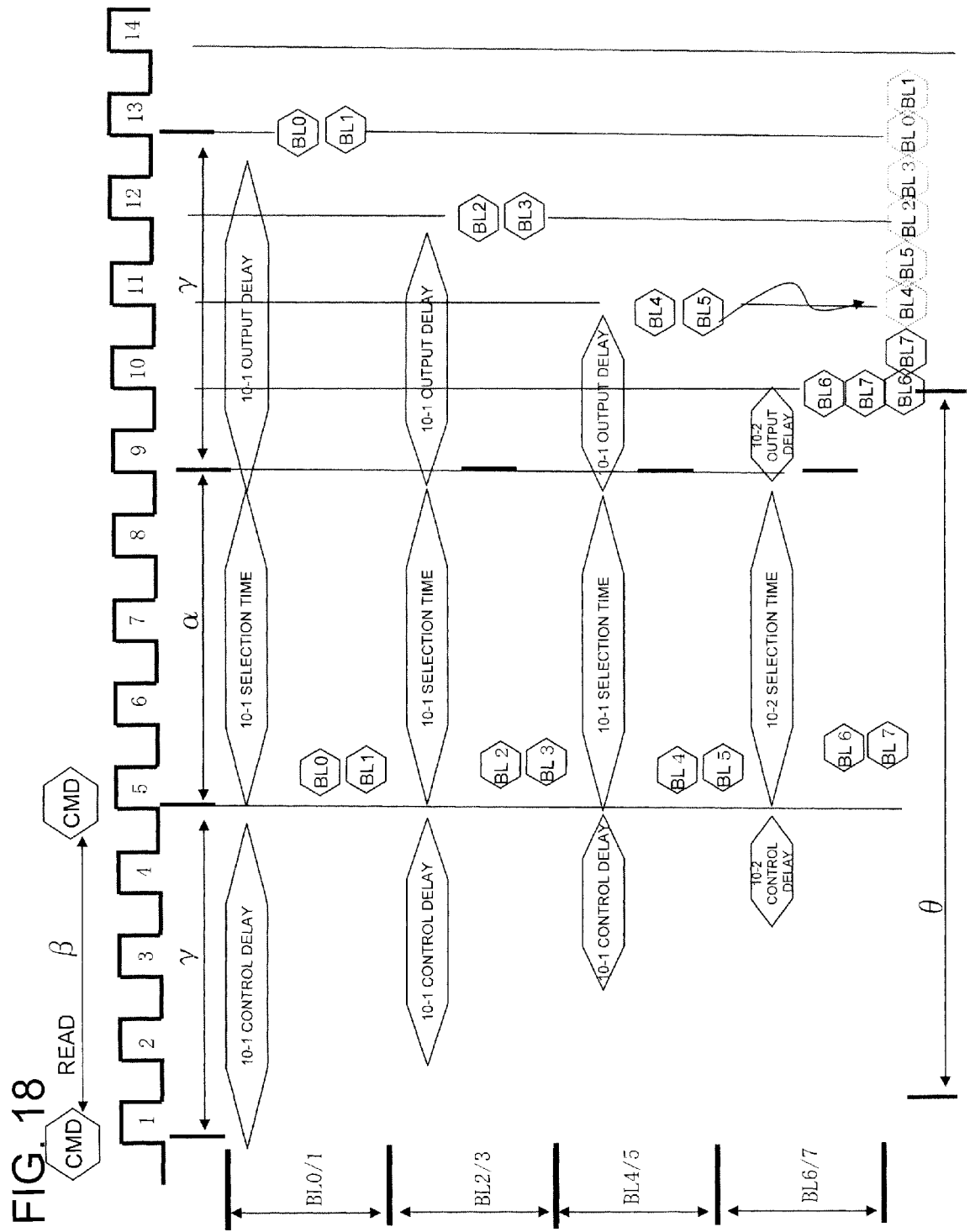
FIG. 18 is a timing chart illustrating the READ operation of the exemplary embodiment 2.

FIG. 17 illustrates the timing chart of the WRITE operation of FIG. 16. FIG. 18 illustrates the timing chart of its READ operation of FIG. 16. In FIG. 16, 8-bit data for 8 columns BL0 to BL7, in which WRITE is in accordance with the burst length=8, are serially delivered at a double data rate (in 4 cycles) to the 36 data terminals (DQ). Four cycles are allocated to the control delay γ in correspondence with the four stage pipelines.

The address signal, command signals and timing signal to control the active area 10-1, and 2 bit data (BL0 and BL1) written in the active area 10-1, are outputted, at the second clock cycle next following the CMD input, from the control circuit 6 and the data control circuit 7 to the sections of the address/command bus and the read write bus (RWBS) corresponding to the first memory array basic unit. The signals and the data BL0 and BL1 are then sequentially transferred at the third, fourth and fifth clock cycles from the first, second and third stages of the buffers 13A and 13B to the sections of the address/command bus and the read write bus (RWBS) corresponding to the second, third and fourth memory array basic units. It is noted that the 10-1 control delay is 4 cycles of from the second to the fifth cycles.

The address signal, control signals, and timing signal to control the active area 10-2 and 2 bit data (BL2 and BL3) written in the active area 10-2 are outputted at the third clock cycle from the control circuit (address, command, timing controller) 6 and the data control circuit 7 to the sections of the address/command bus and the read write bus (RWBS) corresponding to the first memory array basic unit. The signals and the data BL2 and BL3 are then sequentially transferred at the fourth and fifth clock cycles from the first and second stages of the buffers 13A and 13B to the sections of the address/command bus and the read write bus (RWBS) corresponding to the second and third memory array basic units. It is noted that the 10-2 control delay is 3 cycles of from the third to the fifth cycles.

The address signal, control signals, and timing signal to control the active area 10-3 and 2 bit data (BL4 and BL5) written in the active area 10-3 are outputted at the fourth clock cycles from the control circuit 6 and the data control circuit 7 to the sections of the address/command bus and the read write bus (RWBS) corresponding to the first memory array basic unit. The signals and the data are then transferred at the fourth clock cycle from the first stages of the buffers 13A and 13B to the sections of the address/command bus and the read write bus (RWBS) corresponding to the second memory array basic unit. It is noted that the 10-3 control delay is 2 cycles of from the fourth to the fifth cycles.

The address signal, control signals, and the timing signal to control the active area 10-4 and 2 bit data (BL6 and BL7) written in the active area 10-4 are outputted at the fifth clock cycle from the control circuit 6 and the data control circuit 7 to the sections of the address/command bus and the read write bus (RWBS) corresponding to the first memory array basic unit. The 10-4 control delay is just one cycle, that is, the fifth clock cycle.

The 4 cycles of from the sixth to the ninth clock cycles represent the selection time α, and parallel 2 bits data BL0/BL1, BL2/BL3, BL4/BL5, BL6/BL7 are written in the active areas 10-1 to 10-4 of the four memory array basic units. The CMD to CMD period β is 4 cycles. At the fifth clock cycle, leading 2-bits BL0 and BL1 of the 8-bit serial data BL0-BL7, corresponding to the next CMD, are serially entered. The ROW addresses, controlling, for example, the active areas 10-1 and 10-2 of the memory array basic units 11, may be common to the active areas 10-1 and 10-2, or may differ from each other.

In the prototype example (FIGS. 7 and 9), the period γ usable for transfer of the control signal or the data signal, is 1 cycle. In the present exemplary embodiment, the period γ usable for transfer of the control signal or the data signal is 4 cycles, as shown in FIG. 17. The delays (10-1 control delay, 10-2 control delay, 10-3 control delay, and 10-4 control delay) of the control signals and the data signals transferred to the active areas 10-1 to 10-4, corresponds to 4, 3, 2 and 1 cycles, respectively.

In the present exemplary embodiment, the timing signal, generated by the control circuit 6, is received by the sub-controller 12. The sub-controller 12 then newly generates or corrects the timing signal to generate a period α of ROW cycle time tRC. Also, the information is latched by the buffer 13C to guarantee the write operation to the memory cell in the memory array basic unit 11.

In READ operation, in the present exemplary embodiment, the address, control signal and timing signal to the active area 10-1 are outputted from the control circuit 6 to the address/command bus at the first clock, and transferred over 4 cycles to the active area 10-1 via three stages of the buffers 13A. The address signal and the command signal to the active area 10-2 are outputted from the control circuit 6 to the address/command bus at the second clock, and transferred from the control circuit 6 over 3 cycles to the active area 10-2 via two stages of the buffers 13A. The address signal and the command signal to the active area 10-3 are outputted from the control circuit 6 to the address/command bus at the third clock, and transferred from the control circuit 6 over 2 cycles to the active area 10-3 via three stages of the buffers 13A. The address signal and the command signal to the active area 10-4 are outputted from the control circuit 6 to the address/command bus at the fourth clock and thence supplied to the active area 10-4.

BL0 to BL7 are read from the active areas 10-1 to 10-4 during the four cycles of from the fifth to the eighth cycles.

At the ninth clock cycle, the read data BL6 and BL7 from the active area 10-4 get to the data control circuit 7 in parallel, and are read as 2-bit serial data at the tenth clock cycle in the order of BL6-BL7. The data BL4 and BL5, read from the active area 10-3, get to the data control circuit 7 in parallel, via the buffer 13B, at the tenth clock cycle, and are read as 2-bit serial data at the 11th clock cycle in the order of BL4 and BL5. The data BL2 and BL3, read from the active area 10-2, get to the data control circuit 7 in parallel, via two-stage buffer 13B, at the 11th clock cycle, and are read as 2-bit serial data at the 12th clock cycle in the order of BL2 and BL3. The data BL0 and BL1, read from the active area 10-1, get to the data control circuit 7 in parallel, via three-stage buffer 13B, at the 12th clock cycle, and are read as 2-bit serial data at the 13th clock cycle in the order of BL0 and BL1. On the whole, serial 8-bit read data are outputted from the 36 data terminals. The number of cycles from the input of CMD (READ) until the first bit data BL6 is outputted is 9 (latency θ=9).

For both WRITE and READ operations, the control delay/output delay is determined by the characteristic of the remote end memory cell. The interval between consecutive commands (period β between neighboring CMDs) is 4 cycles, the control delay/output delay is 4 cycles, and the active area selection time α is 4 cycles.

Figure 19:
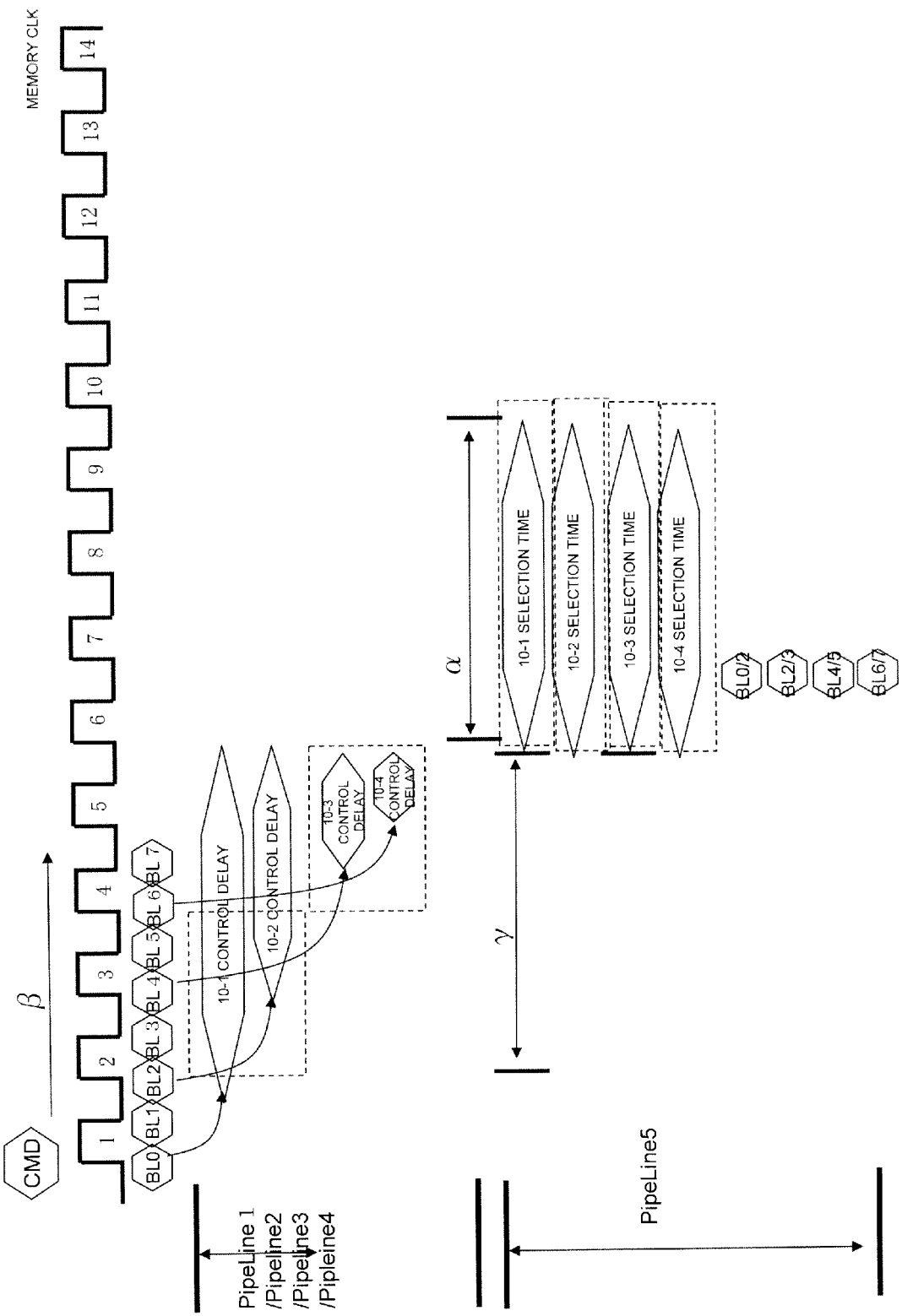
FIG. 19 is a timing chart illustrating the pipeline of the WRITE operation of the exemplary embodiment 2.

FIG. 19 illustrates the write operation of FIG. 17 in terms of pipelines. The control delay of 2-bit parallel transmission on the read write bus (RWBS) to the active area 10-1 of serially inputted BL0 and BL1, out of BL0 to BL7, serially inputted as 8-bit serial data in correspondence with the burst length=8 (10-1 control delay), corresponds to four-stage pipelines of clock cycles 2-5 (Pipeline1-Pipeline 4). The control delay of 2-bit parallel transmission on the read write bus (RWBS) to the active area 10-2 of serially inputted BL2 and BL3 (10-2 control delay) corresponds to three-stage pipelines of clock cycles 3-5 (Pipeline2-Pipeline 4). The control delay of 2-bit parallel transmission on the read write bus (RWBS) to the active area 10-3 of serially inputted BL4 and BL5 (10-3 control delay) corresponds to two-stage pipelines of clock cycles 4-5 (Pipeline3-Pipeline 4). The control delay of 2-bit parallel transmission on the read write bus (RWBS) to the active area 10-4 of serially inputted BL6 and BL7 (10-4 control delay) corresponds to a single-stage pipeline of clock cycle 5 (Pipeline 4).

The write in the active areas 10-1 to 10-4 (ROW cycle (a)) is done in a fifth stage pipeline (Pipeline5), with a being 4 cycles.

Figure 20:
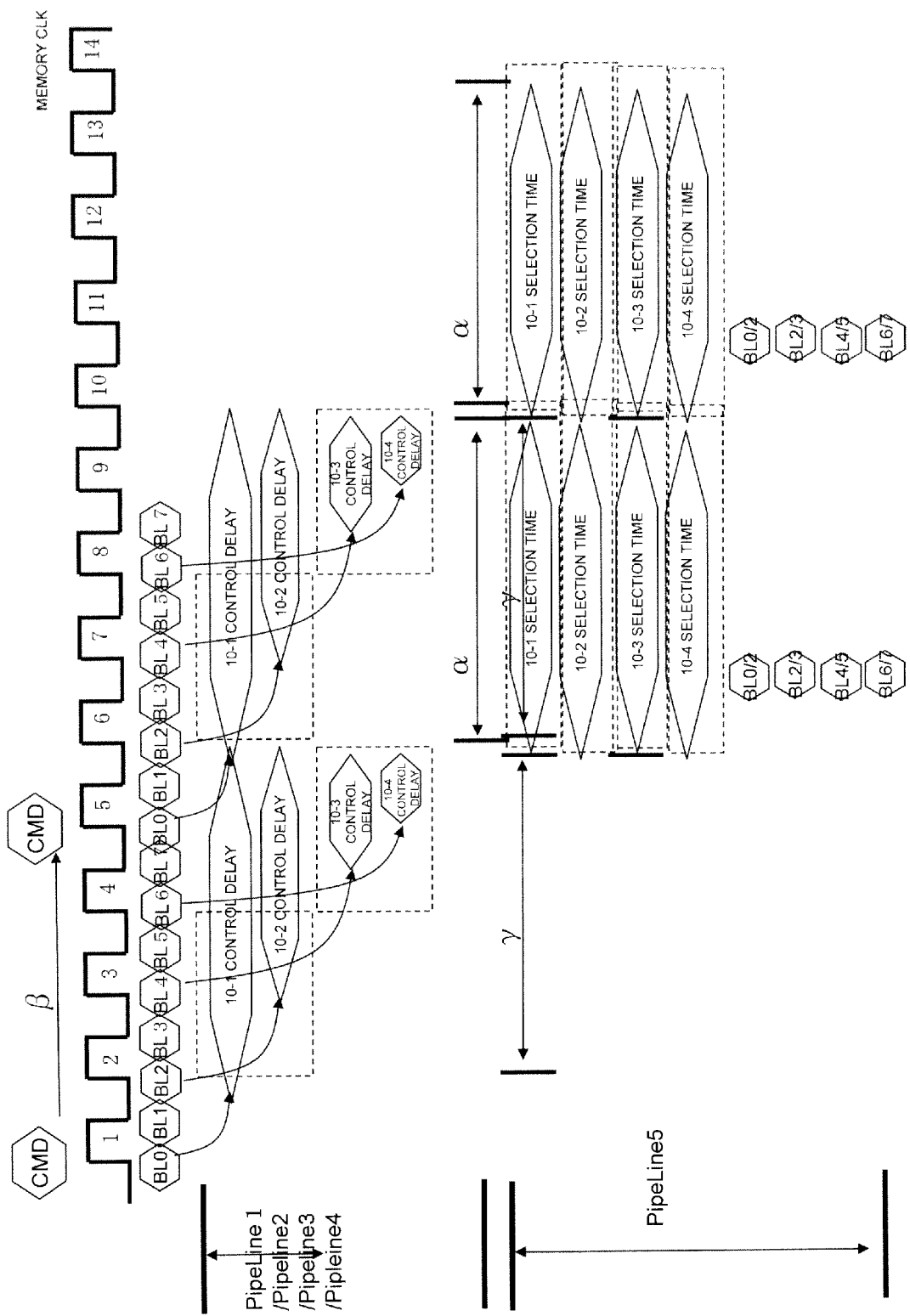
FIG. 20 is a timing chart illustrating the pipeline of the continuous WRITE operations of the exemplary embodiment 2.

FIG. 20 illustrates the consecutive write operations of FIG. 17 in terms of pipelines. The CMD to CMD period β is four cycles. The four cycles of from a clock cycle 6 next following the clock cycle 5 when the control delay γ of a previous CMD (WRITE command) ends to the clock cycle 9 represent the control delay γ of the next CMD (WRITE command). The control delay γ of the next CMD (WRITE command) is temporally overlapped with the selection time of 10-1 to 10-4 of the previous inputted command.

Figure 21:
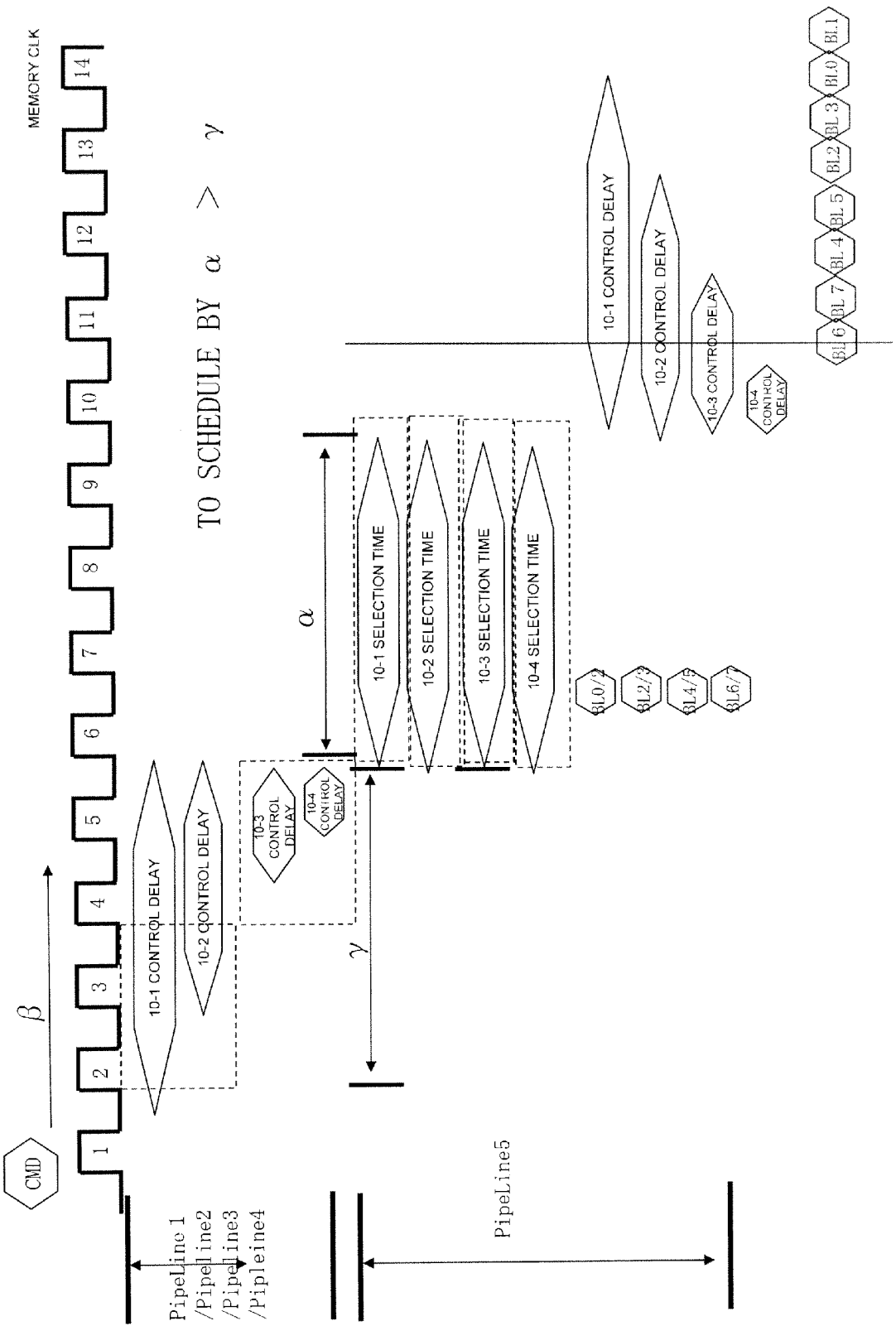
FIG. 21 is a timing chart illustrating the pipeline of the READ operation of the exemplary embodiment 2.

FIG. 21 illustrates the consecutive READ operations of FIG. 18 in terms of pipelines. The control delay in transferring the address and the command to the active area 10-1 to the address/command bus (10-1 control delay) corresponds to four-stage pipelines (Pipeline1 to Pipeline4) of clock cycles 2-5. The control delay in transferring the address and the command to the active area 10-2 to the address/command bus (10-2 control delay) corresponds to three-stage pipelines (Pipeline2 to Pipeline4) of clock cycles 3-5. The control delay in transferring the address and the command to the active area 10-3 to the address/command bus (10-3 control delay) corresponds to two-stage pipelines (Pipeline3 to Pipeline4) of clock cycles 4-5. The control delay in transferring the address and the command to the active area 10-4 to the address/command bus (10-4 control delay) corresponds to a single-stage pipeline (Pipeline4) of a clock cycle 5. During the clock cycles 6-9, 2-bit data are read from the active areas 10-1 to 10-4.

The 2-bit data BL6 and BL7, read from the active area 10-4, are delivered during the clock cycle 10 via the read write bus (RWBS) to the data control circuit 7 and are serially outputted at the clock cycle 11 in the order of BL6 and BL7. The 2-bit data BL4 and BL5, read from the active area 10-3, are delivered during the clock cycle 10 to the read write bus (RWBS) so as to be delivered via a single stage of the buffer 13B to the data control circuit 7 and output at the clock cycle 12 in the order of BL4 and BL5. The 2-bit data BL2 and BL3, read from the active area 10-2, are outputted during the clock cycle 10 to the read write bus (RWBS), then supplied via two stages of the buffers 13B to the control circuit 7 at the clock cycle 11 and serially outputted at the clock cycle 12 in the order of BL2 and BL3. The 2-bit data BL0 and BL1, read from the active area 10-1, are outputted during the clock cycle 10 to the read write bus (RWBS), then supplied via three stages of the buffers 13B to the data control circuit 7 at the clock cycle 11 and serially outputted at the clock cycle 14 in the order of BL0 and BL1.

Figure 22:
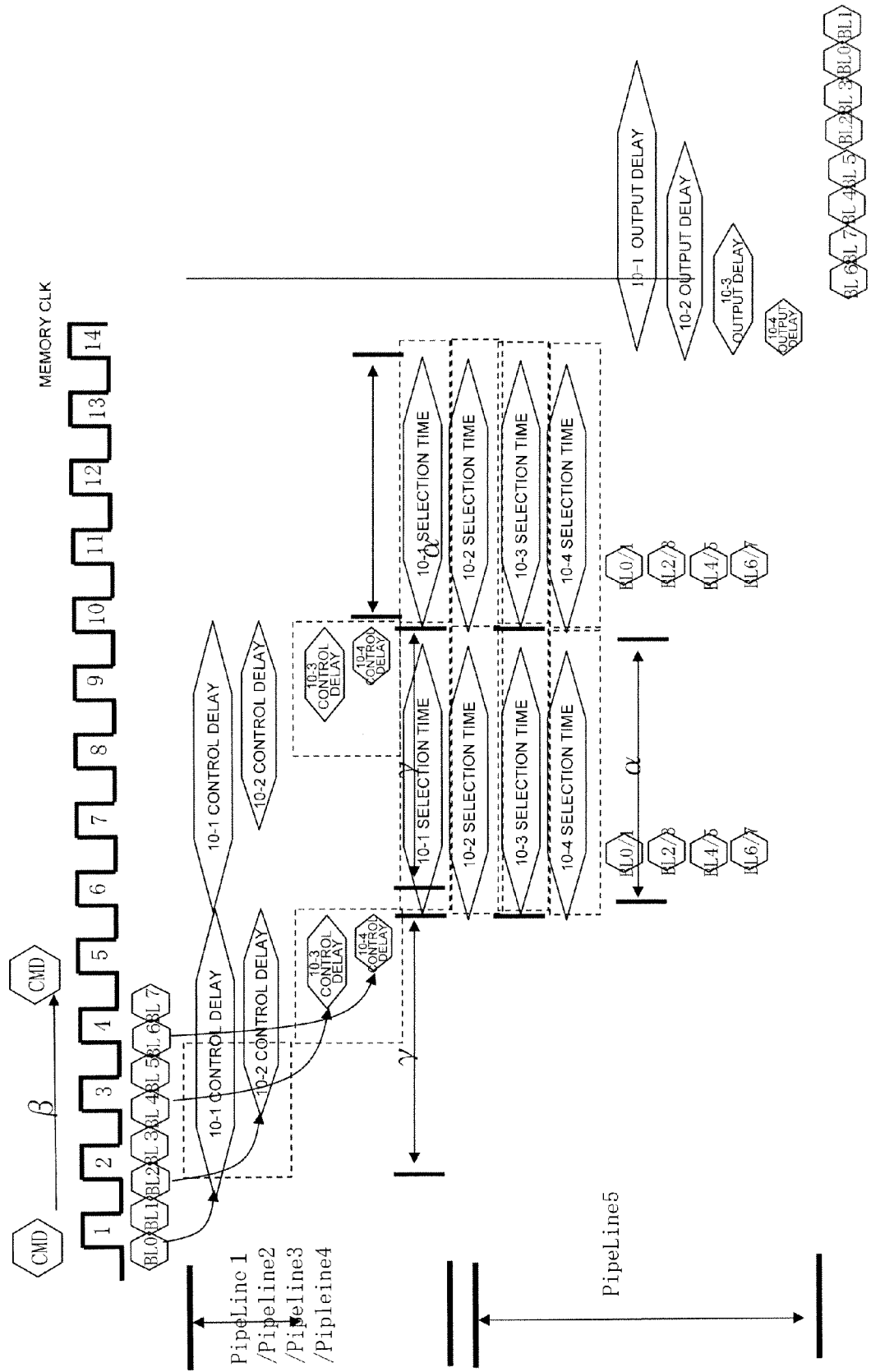
FIG. 22 is a timing chart illustrating the pipeline of the WRITE to READ operation of the exemplary embodiment 2.

FIG. 22 is a timing diagram illustrating an example operation of WRITE to READ. The CMD interval is 4 cycles. The clock cycles 2-5 are the WRITE command control delay. At the clock cycle 5, the next CMD (READ) is delivered. During the clock cycles 6-9, the READ control delay is temporally overlapped with the WRITE selection time. The cock cycles 10-13 are the READ selection time. The cock cycles 10-13 are the READ output time. During the clock cycles 15-18, the 8-bit serial bits BL6, BL7, BL4, BL5, BL2, BL3, BL0 and BL1 are outputted.

Figure 23:
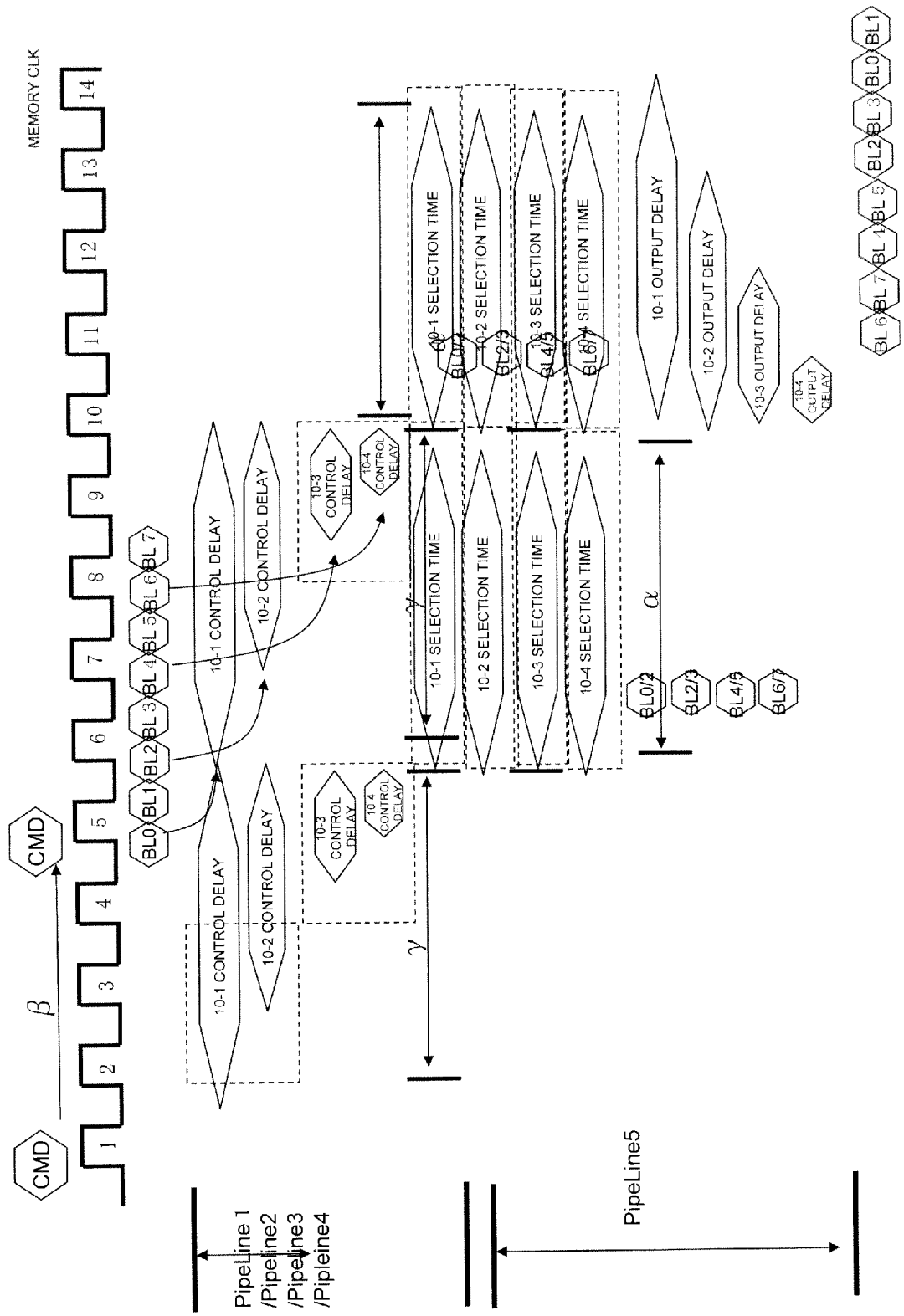
FIG. 23 is a timing chart illustrating the pipeline of the READ to WRITE operation of the exemplary embodiment 2.

FIG. 23 is a timing diagram illustrating an example operation of READ to WRITE. The CMD interval is 4 cycles. The clock cycles 2-5 are READ command control delay. At the clock cycle 5, the next CMD (WRITE) is delivered. 8-bit serial data are delivered during 4 cycles of the clock cycles 5-8. During the clock cycles 6-9, the READ control delay temporally overlaps with the WRITE selection time. The clock cycles 10-13 are the READ selection time, and the clock cycles 10-13 are the WRITE output time and the READ output delay. During the clock cycles 11-14, the 8-bit serial bits BL6, BL7, BL4, BL5, BL2, BL3, BL0 and BL1 are output.

In the exemplary embodiment 2, the burst length=8. The control delay $\gamma$=4 cycles and the selection time $\alpha$=4 cycles. The command interval=4 cycles and the latency at read time=9.

In the exemplary embodiment 2, as in the exemplary embodiment 1, the control delay or output delay $\gamma$ may be extended to achieve the reduction of power consumption. In contrast to 288 IO lines, 72 IO lines suffice for the 36×8 number of bit data, so that interconnect resources may be exploited. If larger numbers of data are to be handled, as in the embodiment 1, 1152 number of bit data at the maximum can be processed with 288 IO lines in the exemplary embodiment in which read and write may be quadrupled.

Exemplary Embodiment 3

Figure 24:
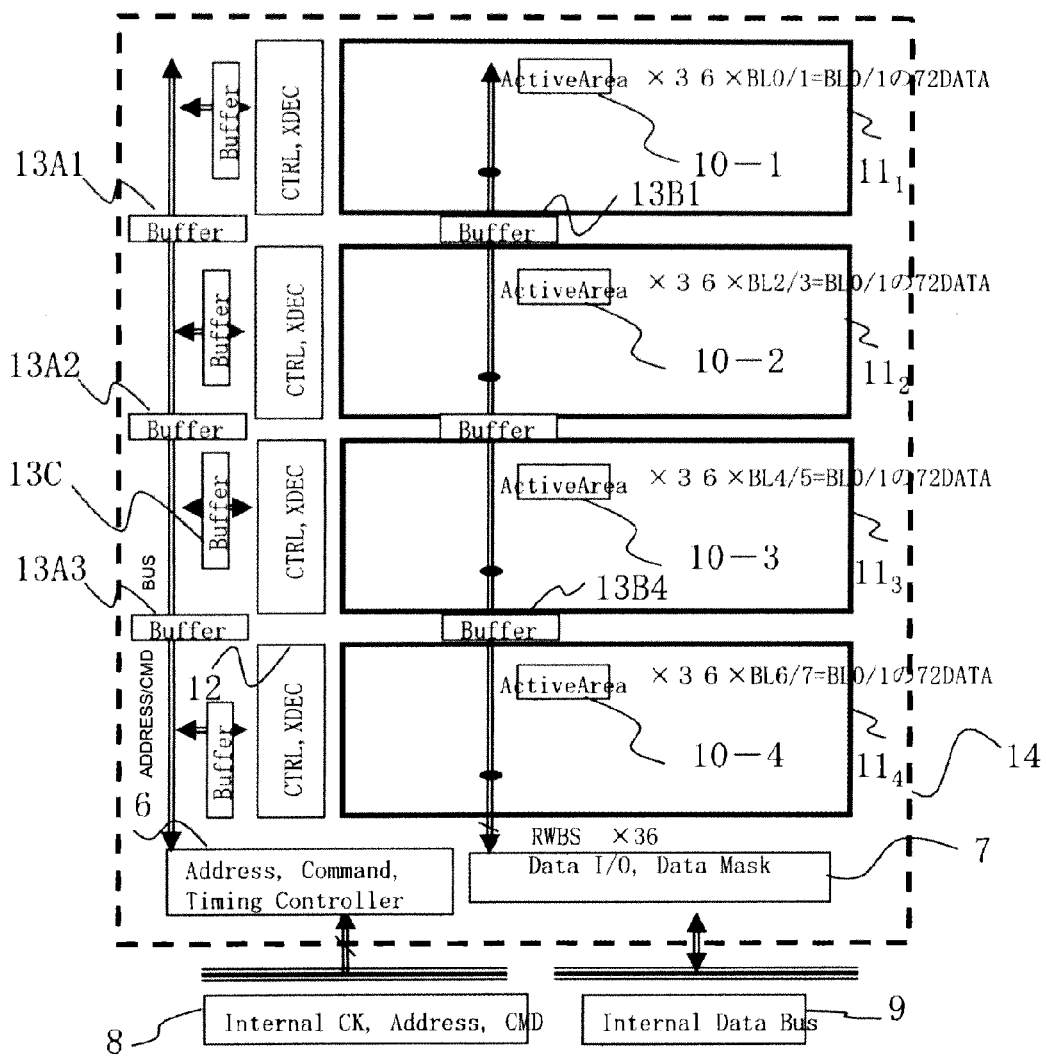
FIG. 24 is a diagram illustrating an exemplary embodiment 3.

FIG. 24 is a diagram illustrating the switching of the burst length according to an exemplary embodiment 3. The number of data terminals is 36, and the burst length is 8. 8-bit data, serially inputted at one terminal, are written in eight columns BL0-BL7 in the active area and 8-bit data read from the/8 columns BL0-BL7 in parallel are serially outputted at the one terminal. In correspondence with the 36 data terminals provided in the semiconductor device, 36×8=288 data are read/written. The operation in this case is the same as that of the exemplary embodiment 2.

If the burst length is changed from 8 to 4 (4 bit data BL0-BL3 is inputted/outputted), the operation is similar to that of the exemplary embodiment 1 provided that the pipeline control by the buffers 13A1 and 13B1 arranged between the active area 10-1 and the active area 10-2 and that by the buffers 13A3 and 13B3 arranged between the active area 10-3 and the active area 10-4 are invalidated (pipeline deactivation). In case the pipeline control of the buffer, that is, the pipeline register function, is to be invalidated, the buffers 13A1, 13B1, 13A3 and 13B3 do not perform a latch operation and output the input signal through. For example, if the buffers (13A1, 13B1, 13A3, and 13B3) are made up of a switch and a flip-flop and include a latch controlled to a through state or to a hold state by e.g., a clock signal (D latch), the switch is fixed at on such as to output an input through at all times. If the buffers are to be run as pipeline registers, the switch may, for example, be controlled to be turned on/off to capture and hold the input on a per cycle basis.

With the number of data terminals=36 and the burst length=2 (BL0, BL1), the pipeline control by the buffers 13A2 and 13B2 between the active area 10-2 and the active area 10-3 is invalidated, at the same time as pipeline control by the buffers (13A1, 13B1, 13A3, 13B3) is invalidated.

In the present exemplary embodiment, it is possible to use such a mode in which the latency $\theta$ and the CMD to CMD period $\beta$ are made variable depending on the remoteness/closeness of an access path. In case the active area is of ×36×2 bits=72 IOs, the memory cell array of a burst length=8 (BL0-7) (buffers 13A1-13A3, and buffers 13B1-13B3 being activated) is switched to a burst length=2 (BL0-BL1) (only buffers 13A2 and 13B2 being activated, with buffers 13A1, 13A3, 13B1, and 13B3 being deactivated), just one of the active areas 10-1, 10-2, 10-3 and 10-4 to be accessed suffices, depending on the address selected. The CMD to CMD period $\beta$ is made variable with the active areas 10-1, 10-2, 10-3 or 10-4 accessed.

FIG. 25A to 25D are timing charts illustrating switching of the burst lengths for READ operation in the exemplary embodiment 3.

Figure 25A:
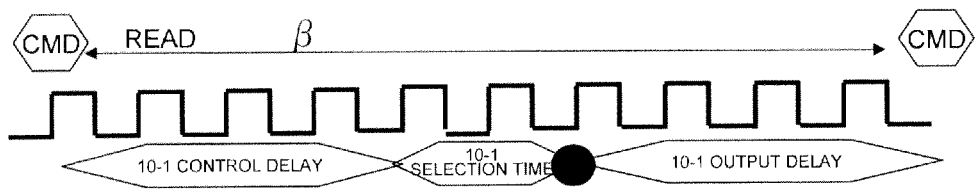
FIGS. 25A to 25D are timing diagrams illustrating burst switching in the exemplary embodiment 3.
Figure 25B:
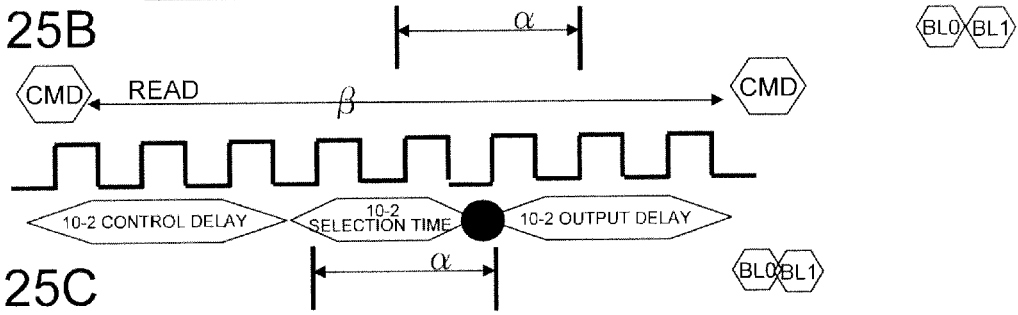
Figure 25C:
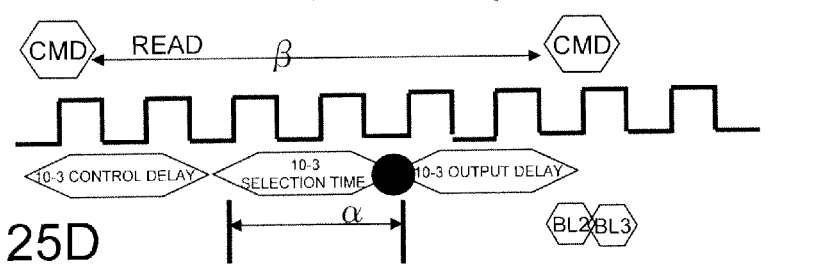
Figure 25D:
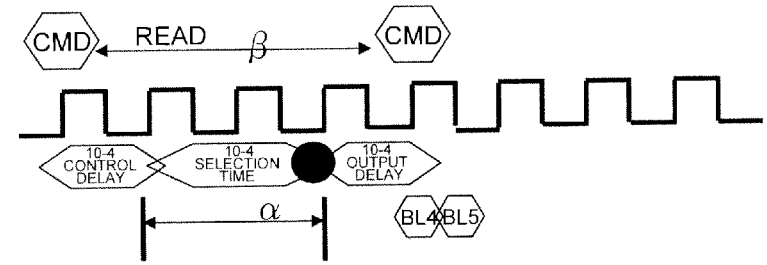

The following described switching of the burst length from 8 to 2. In this case, the CMD to CMD period $\beta$ is varied in the active areas 10-1, 10-2, 10-3 and 10-4 to be accessed. Referring to FIG. 25A, to read (READ) BL0 and BL1 from the active area 10-1, the 10-1 control delay is 4 cycles, 10-1 selection time=2 cycles and 10-1 output delay=4 cycles, and the latency $\theta$=10. The CMD to CMD period $\beta$ is 10. Referring to FIG. 25B, to read (READ) BL2 and BL3 from the active area 10-2, the 10-2 control delay is 3 cycles, 10-2 selection time=2 cycles and 10-3 output delay=3 cycles, with the latency $\theta$=8. Referring to FIG. 25C, to READ BL4 and BL5 from the active area 10-3, the 10-2 control delay is 2 cycles, 10-2 selection time=2 cycles and 10-2 output delay=2 cycles, with the latency $\theta$=6. The CMD to CMD period $\beta$ is 6. Referring to FIG. 25D, to read BL6 and BL7 from the active area 10-4, the 10-4 control delay is 1 cycle, 10-4 selection time=2 cycles and 10-4 output delay=2 cycles, with the latency $\theta$=4. The CMD to CMD period $\beta$ is 4. In the active areas 10-1, 10-2, 10-3 and 10-4, the CMD to CMD period $\beta$ and the latency $\theta$ are varied.

Exemplary Embodiment 4

Since the memory array basic unit 11 includes a sub-controller 12, each active area may be configured as a sub-bank. FIG. 26 illustrates an exemplary embodiment 4. In FIG. 26, four sub-banks 15 are provided per bank 14. An address/command bus and a read write bus (RWBS) are provided respectively with three stages of buffers (13A1 and 13B1; 13A2 and 13B2; and 13A3 and 13B3), each of the buffers operating as pipeline registers. With the burst length=8, a single data terminal serially inputs/outputs 8-bit data BL0-BL7 associated with eight columns (BL0-7). For the 36 data terminals, the read write bus includes 36×2 data lines. Out of BL0-BL7 for the burst length=8, BL0 and BL1 are transferred via three stages of the buffers 13B on the read write bus so as to be written in/read from the active area 10-1. BL2 and BL3 are transferred via two buffers 13B on the read write bus so as to be written in/read from the active area 10-2. BL4 and BL5 are transferred via a single buffer 13B on the read write bus so as to be written in/read from the active area 10-3. BL6 and BL7 are transferred on the read write bus so as to be written in/read from the active area 10-4.

When the array for the burst length=8 is switched to the burst length=2, such an operation mode (specification) in which the CMD to CMD period is varied from $\beta$-1 through to $\beta$-4 for the active areas 10-1 to 10-4 is possible. Additionally, the bank 14 is divided into 15 sub-banks for control. For the multiple active areas 10-1 to 10-4 in each bank 14, a plurality of access areas may be accessed by sub-bank control. In this case, there may occasionally be such a timing, when a signal crash occurs on the transfer path on the address/command bus or on the transfer path on the read write bus. The timing when the signal crash occurs is defined as a timing when a command input is inhibited. In accessing the multiple active areas 10-1 to 10-4 in the bank 14, not making a command input, taken as inhibit input, is a prerequisite to avoid the occurrence of malfunction.

Figures 27A, 27B, 27C, 27D:
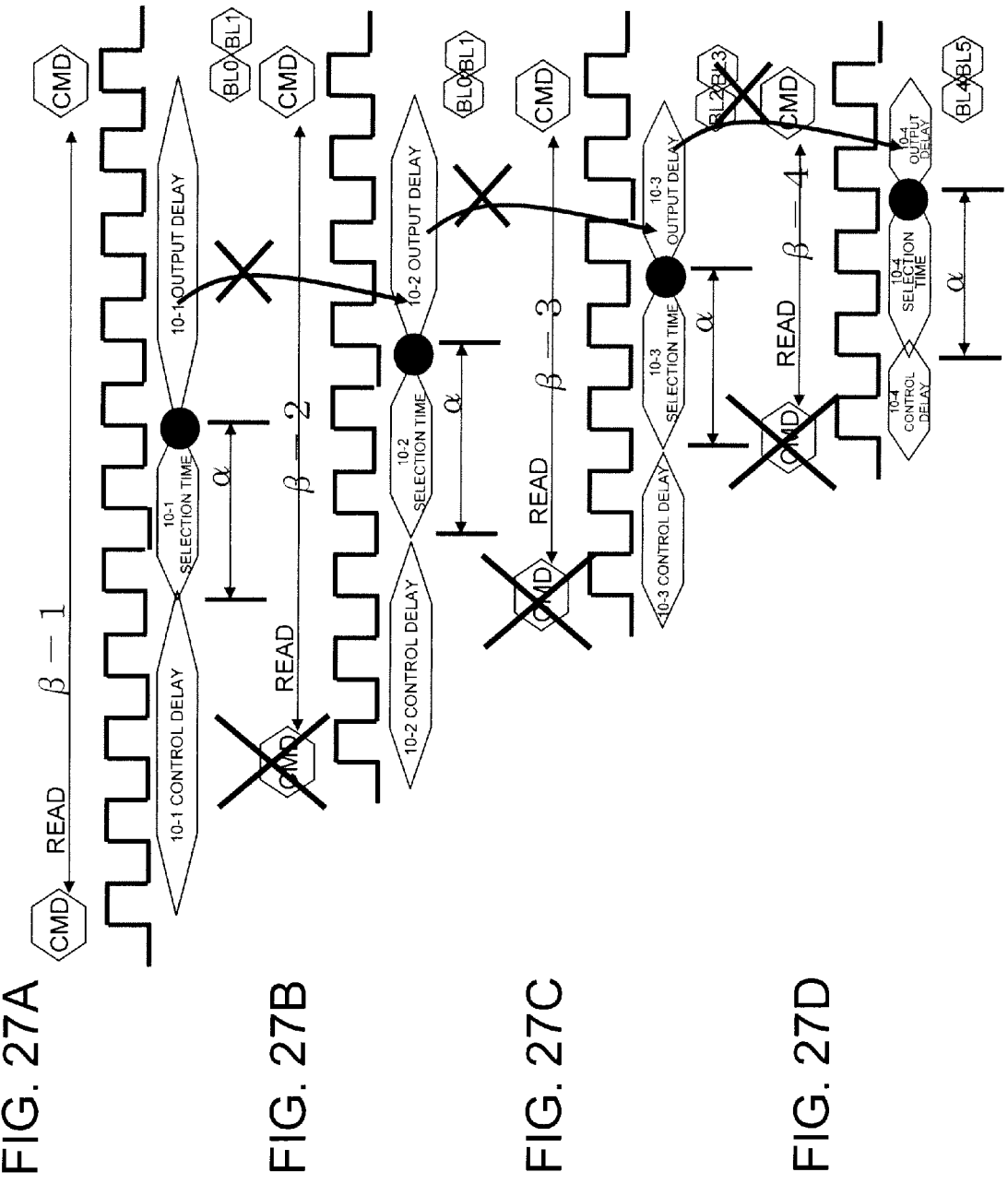
FIGS. 27A to 27D are timing diagrams illustrating burst switching inhibit rule in the exemplary embodiment 4.

FIG. 27A to 27C illustrate examples of command inhibit inputs, and specifically illustrate a command (CMD) inhibit rule between different sub-banks, that is, a sub-band to subband command inhibit rule. In a memory cell array with a plurality of banks, it is possible to simultaneously have accesses to access areas of different sub-banks. In FIG. 27A, the command to command interval (interval between READ commands) in the same sub-bank is β-1. The command to command intervals in FIGS. 27B to 27D are β-2, β-3 and β-4, respectively. For these, the burst length=2. The output delays overlap with one another between the different sub-banks and hence, the command inputs between the different sub-banks are inhibited.

FIG. 28A to 28C illustrates timing charts for the READ and WRITE operations using the common IO line (Common IO or CIO). FIG. 28A shows that, in the case of READ to WRITE (a WRITE command is inputted in succession to a READ command), the IO line (read write bus) is occupied by READ, and hence extension of γ directly brings about extension of the CMD to CMD period β. If the read write bus (RWBS) is not the common IO but is a separate IO (SIO) in which I and O are separated from each other, β=α.

In the case of READ to READ (READ commands are inputted in succession), as shown in FIG. 28B, β=α=2 cycles and, in the case of WRITE to WRITE (WRITE commands are inputted in succession), as shown in FIG. 28C, β=α=2 cycles. In the cases of WRITE to READ (a READ command is inputted in succession to a WRITE command), REF to * (where * is WRITE/READ/REF) (a WRITE/READ/REF command is inputted in succession to a REF (refresh) command) and * to REF (a REF (refresh) command is inputted in succession to a WRITE/READ/REF command), β=α.

Exemplary Embodiment 5

Figure 29:
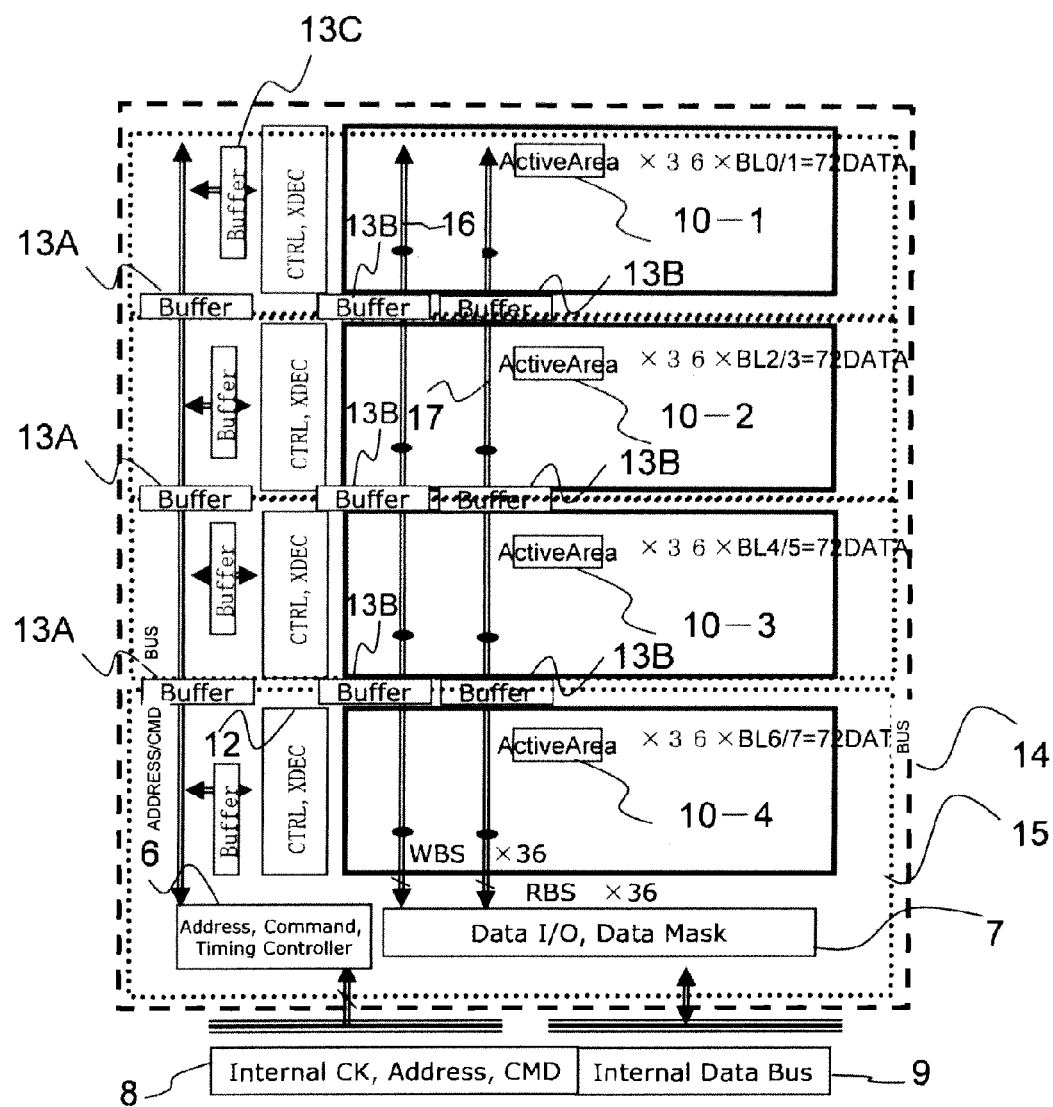
FIG. 29 is a diagram illustrating an exemplary embodiment 5.

FIG. 29 illustrates a configuration of an exemplary embodiment 5. The read write bus (RWBS) is configured as a separate IO (SIO) in which data lines are separated into data lines for WRITE and data lines for READ. That is, a dedicated WRITE bus (WBS) 16 and a dedicated READ bus (RBS) 17 are provided. Each of the buses 16 and 17 includes a buffer 13 between neighboring active areas. Write data from the data control circuit 7 to the active area in the memory array basic unit 11 are transferred on the dedicated WRITE bus (WBS) 16 under pipeline control. Read data from the active area 10 are transferred on the dedicated READ bus (RBS) 17 to the data control circuit 7.

With the burst length=8, 8-bit data BL0 to BL7, associated with the 8 columns (BL0-BL7), are serially inputted/outputted to/from a single data terminal. For 36 data terminals, the number of data lines of the dedicated WRITE bus (WBS) 16 is 36×2=72, and the number of data lines of the dedicated READ bus (RBS) 17 is 36×2=72.

Out of 8-bit data BL0-BL7, corresponding to the burst length=8, 2-bit data BL0 and BL1 are transferred from the data control circuit 7 via three stages of buffers 13B on the dedicated WRITE bus (WBS) 16 and written in the active area 10-1. 2-bit data BL2 and BL3 are transferred from the data control circuit 7 via two stages of the buffers 13B on the dedicated WRITE bus (WBS) 16 and written in the active area 10-2. 2-bit data BL4 and BL5 are transferred from the data control circuit 7 via a single stage of the buffer 13B to the dedicated WRITE bus (WBS) 16 and written in the active area 10-3. 2-bit data BL6 and BL7 are transferred from the data control circuit 7 to the dedicated WRITE bus (WBS) 16 and written in the active area 10-4. It is noted that the BL6 and BL7 are not transferred beyond the buffer 13B.

2-bit data B6 and BL7, read from the active area 10-4, arrive at the data control circuit 7 from the dedicated READ bus (RBS) 17 within one cycle. 2-bit data BL4 and BL5, read from the active area 10-3, are transferred via a single stage of the buffer 13B on the dedicated READ bus (RBS) 17, and arrive at the data control circuit 7 within two cycles. 2-bit data BL2 and BL3, read from the active area 10-2, are transferred via two stages of the buffers 13B on the dedicated READ bus (RBS) 17, and arrive at the data control circuit 7 within three cycles. 2-bit data BL0 and BL1, read from the active area 10-1, are transferred via three stages of the buffers 13B on the dedicated READ bus (RBS) 17, and arrive at the data control circuit 7 within four cycles.

FIG. 30A to 30C are timing charts illustrating the operation of the exemplary embodiment 5 of FIG. 29. FIG. 30A is a timing chart for READ to WRITE (a WRITE command is inputted in succession to a READ command), with β=α. FIGS. 30B and 30C are similar to FIGS. 29B and 29C; in READ to READ (READ commands are inputted in succession), β=α=2 cycles, and in WRITE to WRITE (WRITE commands are inputted in succession), β=α=2 cycles. In WRITE to READ (a READ command is inputted in succession to a WRITE command), REF to * (where * is WRITE/READ/REF, a WRITE/READ/REF command is inputted in succession to a REF (refresh) command), and in * to REF (a REF (refresh) command is inputted in succession to a WRITE/READ/REF command), β=α.

Exemplary Embodiment 6

Figure 32:
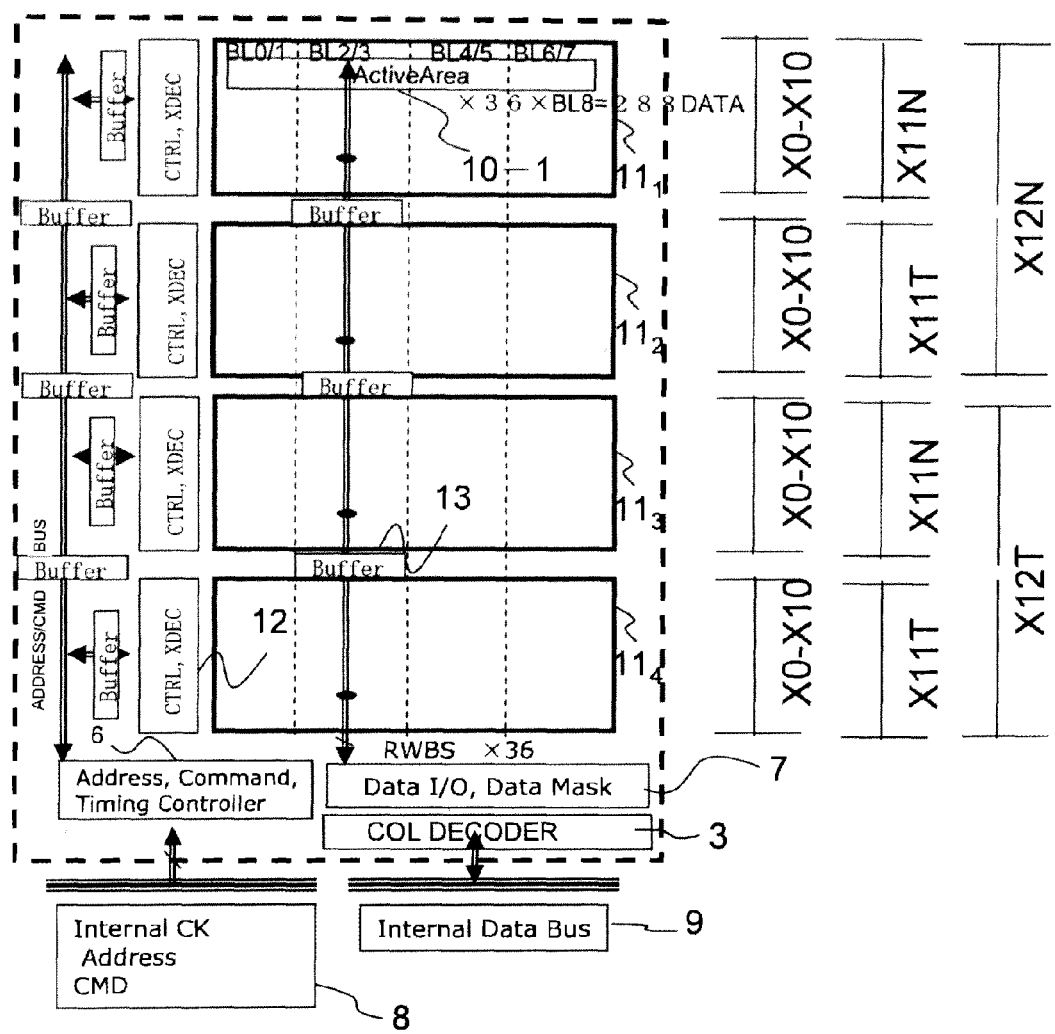
FIG. 32 is a diagram illustrating address allocation in an exemplary embodiment 6.

An exemplary embodiment 6 will now be described. FIG. 32 illustrates an example of address allocation, that is, an example of selecting the memory array basic unit 11 with X11 and X12 of the X-address. In the exemplary embodiment 6, the burst length is 8 and there are 8 read write buses (RWBS) for a single data terminal, such that, for 36 data terminals, the active area 10-1 associated with 288 IO lines is selected. A memory array basic unit 11$_1$ is selected for (X11, X12)=(0,0), a memory array basic unit 11$_2$ is selected for (X11, X12)=(1, 0), a memory array basic unit 11$_3$ is selected for (X11, X12)=(0,1) and a memory array basic unit 11$_4$ is selected for (X11, X12)=(1,1). A row (word line) in the memory array basic unit 11 is selected by 11 bits of X0 to X10.

Figure 33:
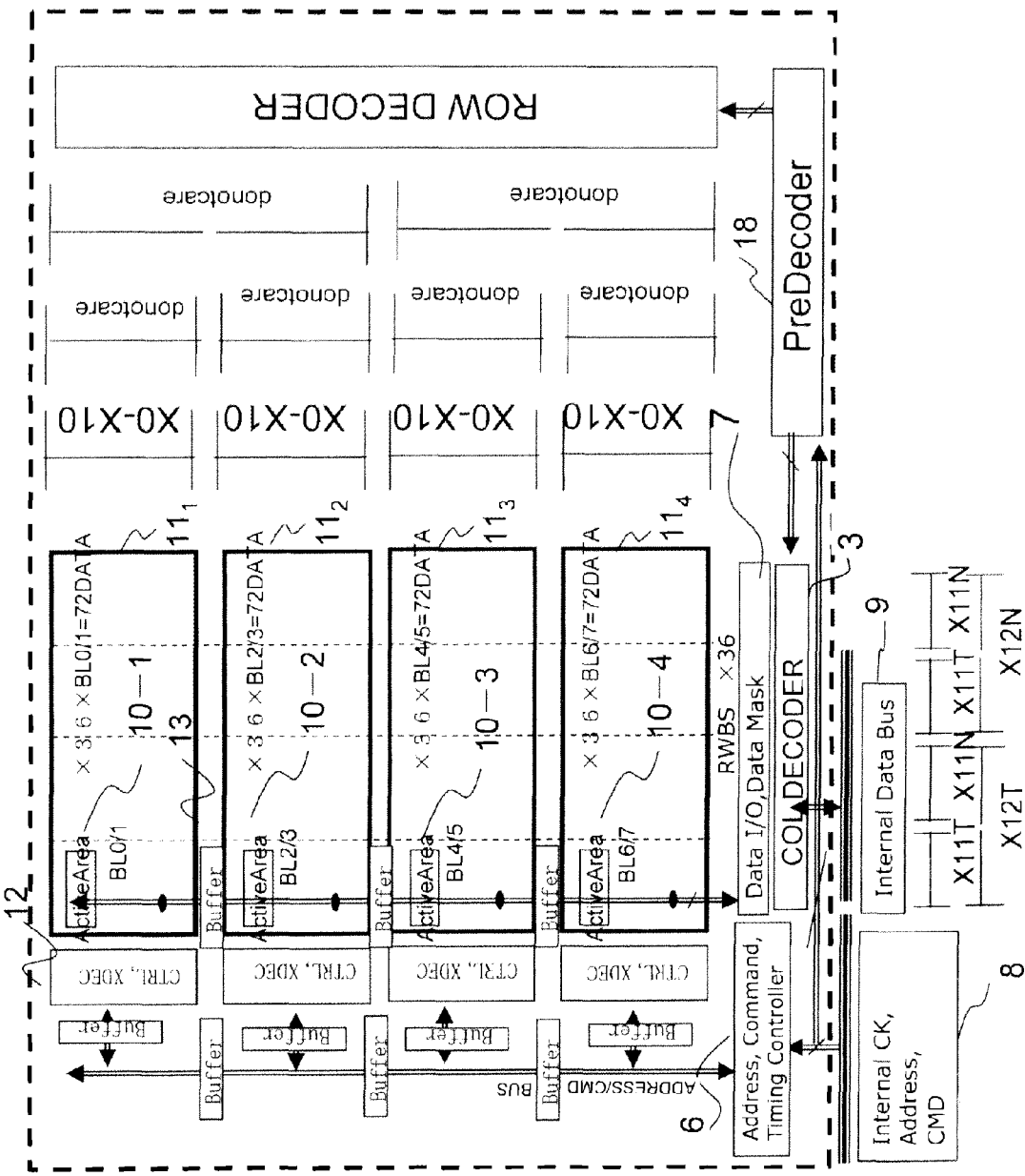
FIG. 33 is a diagram illustrating a first example address allocation in the exemplary embodiment 6.

FIG. 33 illustrates, in the exemplary embodiment 6, an example of selecting an active area in parallel for the control line (address/command bus) and the IO line (read write bus). X11 and X12 in FIG. 32 are invalid (don't care), such that, the column decoder (COL DECODER) selects the active area using two bits X11 and X12 of the X-address. Out of the data of columns BL0-BL7, corresponding to the burst length=8, input/output at the single data terminal, BL0 and BL1 are selected, if (X11, X12)=(0,0),
BL2 and BL3 are selected, if (X11, X12)=(1,0),
BL4 and BL5 are selected, if (X11, X12)=(0,1), and
BL6 and BL7 are selected, if (X11, X12)=(1,1).

The rows in each memory array basic unit are selected by X0-X10. The row decoder (ROW DECODER) is made up of four XDECs shown on the left side in FIG. 33. A pre-decoder 18 switches between a row and a column. In FIG. 33, the pre-decoder 18 may be changed over on setting at the time of manufacture, or a test mode. In case the column decoder selects an active area using X11 and X12 of the X-address, the row decoder (ROW DECODER) does not decode X11 and X12.

Figure 34:
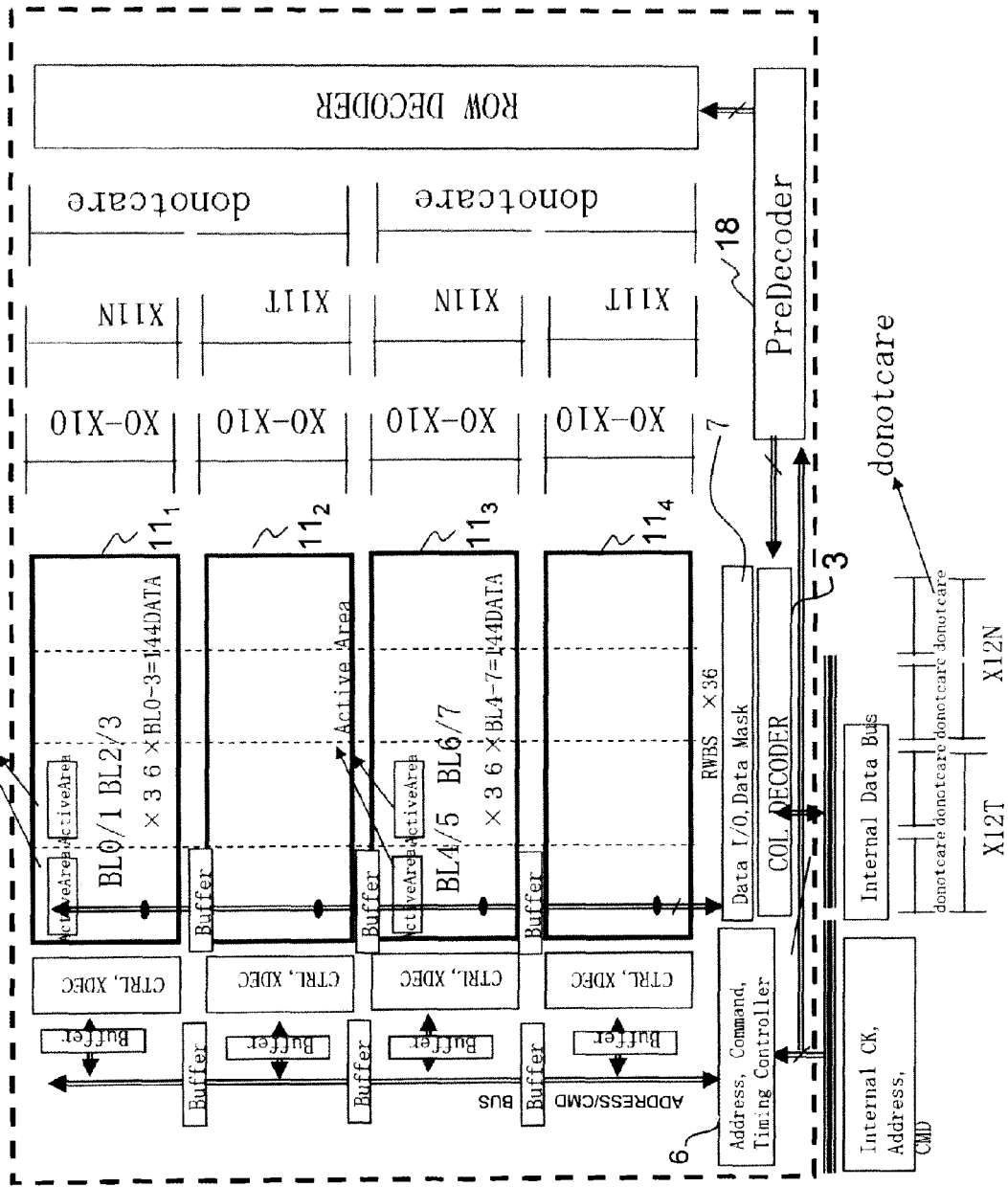
FIG. 34 is a diagram illustrating a second example address allocation in the exemplary embodiment 6n.

FIG. 34 illustrates a modification of the present exemplary embodiment. X11 of the X-address is decoded by the row decoder. In the row decoder, X12 is invalid (don't care). X12 is decoded by the column decoder. In the column decoder, X11 is invalid (don't care). Out of the data of the columns BL0-BL7, corresponding to the burst length=8, input/output on the single data terminal, BL0/BL1 and BL2/BL3 are selected for X12=0 and BL4/BL5 and BL6/B7 are selected for X12=1. The read write bus (RWBS) includes four data lines (IO lines) for a single data terminal, and 144 data lines (IO lines) for 36 data terminals. The row decoder selects memory array basic units $11_1$ and $11_3$, if X11=0, while selecting memory array basic units $11_2$ and $11_4$, if X11=1. The row decoder selects a row in the memory array basic unit for X0-X10 of the X address.

BL0-BL3 of the memory array basic unit $11_1$ are selected, if (X11, X12)=(0,0), BL0-BL3 of the memory array basic unit $11_2$ are selected, if (X11, X12)=(1,0), BL4-BL7 of the memory array basic unit $11_3$ are selected, if (X11, X12)=(0,1), and BL4-BL7 of the memory array basic unit $11_2$ are selected, if (X11, X12)=(1,1).

For X0-X10, the row in each memory array basic unit is selected. A pre-decoder 18 is provided to switch the address for the row and the column for the selection of the active region. The switching may be made in accordance with the operation specifications of the semiconductor memory (that is, fixed in product shipment), or in accordance with a test mode.

A variety of modifications may be derived from the exemplary embodiments 1 and 2, as described above.

By pipelining the access latency to the memory cells, such a memory cell array configuration may be provided in which the number of cycles is able to be reduced to make efficient use of the IO line resources in the memory cell array, even though the latency becomes longer. Thus, power consumption may be reduced by exploiting the relationship of trade-off for $\theta$ and $\gamma$, as $\alpha$ and $\beta$ are improved or maintained. Additionally, IO line resources may be exploited as a result of division of active areas in the memory cell array.

In the above mentioned prototype examples, the access time is considered in relation to remoteness/closeness of an access path. According to the embodiments, in order to reduce power consumption and to improve a ROW cycle, there is provided a memory cell array configuration in which, as an attention is focused on a bus structure or IO lines in a memory cell array which are made up of a plurality of memory array basic units, there is provided a pipeline architecture on the bus, and which makes such an operation possible in which the relationship of trade-off between the power and the delay is exploited.

In particular, a plurality of active areas split into a plurality of portions, are activated simultaneously and hence it becomes possible to control data transfer on the bus (IO lines) to the plurality of active areas, in distinction from an access pattern which depends on large/small relation of the data transfer distance via the IO lines, such as accessing a memory cell remote from or close to the control circuits 6 and 7.

The memory cell array speed has to be increased by reducing the length of the WORD line or the BIT line and by splitting the memory array basic unit. This raises the speed by reducing the row cycle $\alpha$. However, the delay in the signal of a control circuit that controls the memory cell array or the IO line can hardly be ignored. In the present memory cell array configuration, the power consumption is reduced and IO line resources may be efficiently exploited as the ROW cycle is maintained or reduced. This is made possible by sub-dividing the control line or the IO line and by exploiting the relationship of trade-off between the power and the delay in the control signal or the IO line signal.

The particular exemplary embodiments or examples may be modified or adjusted within the scope of the entire disclosure of the present invention, inclusive of claims, based on the fundamental technical concept of the invention. In addition, a variety of combinations or selection of elements disclosed herein may be made within the context of the claims. That is, the present invention may cover a wide variety of modifications or corrections that may occur to those skilled in the art in accordance with the entire disclosure of the present invention, inclusive of claims, and the technical concept of the present invention.

What is claimed is:

1. A semiconductor device comprising:
   a memory cell array including a plurality of memory array basic units, each including a plurality of memory cells for write and read operations;
   a first bus coupled to said plurality of memory array basic units, said first bus configured to allow transfer of address/control signals thereon, said first bus including at least one first buffer circuit configured to operate as a pipeline register;
   a second bus coupled to said plurality of memory array basic units, said second bus configured to allow bidirectional transfer of data thereon, said second bus including at least one second buffer circuit configured to operate as a pipeline register;
   a first control circuit configured to send said address/control signals on said first bus from one end thereof, sequentially in a sequence of from said address/control signals destined for said memory array basic unit located at a remote end side with respect to said one end of said first bus, to said address/control signals destined for said memory array basic unit at a near end side with respect to said one end of said first bus; and
   a second control circuit that in a write access, is configured to send write data on said second bus from one end thereof, sequentially in a sequence of from write data destined for said memory array basic unit located at a remote end side with respect to said one end of said second bus to write data destined for said memory array basic unit at a near end side with respect to said one end of said second bus,
   said write data transferred from said second bus to each of said memory array basic units being written in each of said memory array basic units,
   in a read access, read data from a plurality of said memory array basic units being transferred on said second bus to arrive at said second control circuit, in a sequence of from said read data from said memory array basic unit located at said near end side with respect to said one end of said second bus to said read data from said memory array basic unit located at said remote end side with respect to said one end of said second bus, said second control circuit configured to output said arrived read data.

2. The semiconductor device according to claim 1, wherein said memory cell array includes first to Nth memory array basic units, where N is a pre-set positive integer not less than 2, said first bus including a (N−1)-number of said first buffer circuits arranged between (N−1) pairs of neighboring memory array basic units, respectively, said second bus including a M-number of parallel data lines per data terminal configured to serially input/output M×N bit data corresponding to a burst length M×N, where M is a pre-set positive integer not less than 1, said second bus including (N−1) number of said second buffer circuits arranged between (N−1) pairs of neighboring memory array basic units, respectively, wherein said first control circuit is configured to sequentially send to said first bus, on a per cycle basis, said address/control signals in a sequence of from said address/control signals destined for a remotest one of said first to Nth memory array basic units with respect to said one end of said first bus to said address/control signals destined for a nearest one of said first to Nth memory array basic units with respect to said one end of said first bus, in the write access, said second control circuit is configured to receive M×N bit data serially inputted from said data terminal, said second control circuit configured to sequentially send said M×N bit data, M bits each time, in parallel, to said M-number of data lines of said second bus, on a per cycle basis, N times, in a sequence of from said data destined for said remotest one of said first to Nth memory array basic units to said data destined for said nearest one of said first to Nth memory array basic units, said M bit data, transferred to each of said first to Nth memory array basic units from said second bus being written in each of said M-number of said columns of said first to said Nth memory array basic units, wherein in the read access, M bits data read from a M-number of columns of each of said first to said Nth memory array basic units are transferred on said second bus to sequentially arrive at said second control circuit in a sequence of from said NI bit data read from said nearest one of said first to Nth memory array basic units to said M-number of bits of data read from said remotest one of said first to Nth memory array basic units, said second control circuit configured to serially output said M×N bit data from said data terminal.

3. The semiconductor device according to claim 1, wherein said first bus includes:
said first buffer circuit between each pair of a plurality of pairs of neighboring memory array basic units, and
said second bus includes
said second buffer circuit between each pair of a plurality of pairs of neighboring memory array basic units,
at least one pair of said first buffer circuit and said second buffer circuit out of said a plurality of first buffer circuits and a plurality of said second buffer circuits each configured to operate as a pipeline register, pipelining function of said remaining first and second buffer circuits being invalidated to cope with changing over a burst length value for different values of burst lengths.

4. The semiconductor device according to claim 3, wherein said memory array includes first to Nth memory array basic units, where N=2^K, K being a preset positive integer not less than 2 and ^ being a power operator,
said first bus including a (N−1) number of said first buffer circuits arranged between (N−1) of neighboring memory array basic units, respectively,
said second bus including, per data terminal, a M-number of data lines, M being a pre-set positive integer not less than 2, said data terminal serially inputting/outputting a K-number of bit data corresponding to said burst length,
said second bus including a (N−1) number of said second buffer circuits between (N−1) pairs of neighboring memory array basic units, in case said burst length is M×N, said (N−1) number of said first buffer circuits and said (N−1) number of said second buffer circuits configured to operate as pipeline registers,
in case said burst length is M×(N/(2^L)), where L is a pre-set integer not less than 1 and not more than K,
a 2^(K−1) number of neighboring memory array basic units being made a set,
said first buffer circuit and said second buffer circuit arranged between said neighboring sets configured to operate as pipeline registers, said remaining first and second buffer circuits having pipelining functions thereof invalidated.

5. The semiconductor device according to claim 1, further comprising
a plurality of third buffer circuits provided in association with a plurality of said memory array basic units, each of said third buffer circuits configured to receive said address/control signals transferred on said first bus to transmit said address/control signals received to associated ones of said memory array basic units.

6. The semiconductor device according to claim 5, wherein said third buffer circuit includes:
a three state buffer configured to receive address/control signals from said first bus and controls transmission/non-transmission to a succeeding side of said first bus in accordance with an enable signal and an address space selection logic; and
a latch circuit configured to latch an output of said third three-state buffer.

7. The semiconductor device according to claim 5, further comprising
a sub-controller provided between said third buffer circuit and said memory array basic unit, said sub-controller configured to receive said address/control signals from said third buffer circuit to control said memory array basic unit.

8. The semiconductor device according to claim 1, wherein a first period corresponding to a control delay composed of a transfer cycle of an address/command to said first bus in a write access and a read access and a transfer cycle of write data to said second bus in a write access includes
a plurality of cycles in association with pipeline control performed, said first period being longer than a second period corresponding to a selection time during which data writing in said memory cell selected and/or data reading from said selected memory cell is made in said memory array basic unit of said memory array.

9. The semiconductor device according to claim 8, wherein a third period corresponding to an output delay during which, in the read access, data read from said memory array basic unit is transferred on said second bus to get to said second control circuit next to said selection time is longer than said second period corresponding to said selection time.

10. The semiconductor device according to claim 9, wherein said first period, said second period and said third period have an identical period length.

11. The semiconductor device according to claim 10, wherein said first and second periods or said first to third periods, corresponding to a plurality of commands sequentially inputted in succession are taken as a unit of pipeline control between said commands.

12. The semiconductor device according to claim 1, wherein said memory array basic unit comprises a sub-bank, a plurality of said sub-banks comprises a bank, a plurality of accesses being made to said plurality of sub-banks.

13. The semiconductor device according to claim 1, wherein said second bus includes:
   a dedicated write bus configured to transfer said write data from said second control circuit to said plurality of said memory array basic units; and
   a dedicated read bus configured to transfer said read data from said plurality of memory array basic units to said second control circuit,
   said dedicated write bus including at least one said second buffer circuit,
   said dedicated read bus including at least one said second buffer circuit.

14. The semiconductor device according to claim 1, wherein said memory array includes
   first to Nth memory array basic units, where N=2^K, K being a pre-set positive integer not less than 2 and ^ being a power operator,
   a row of said memory array basic unit being selected by a lower-side first bit group of an X address,
   one of said first to Nth memory array basic units being selected by a second bit group comprised of a K-number of bits, said second bit group being higher in order than said first bit group.

15. The semiconductor device according to claim 1, wherein said memory array includes
   first to Nth memory array basic units, where N=2^K, K being a pre-set positive integer not less than 2, said semiconductor device including:
   a row decoder configured to decode a lower-side first bit group of an X address to select a row of said memory array basic unit; and
   a column decoder configured to decode a second bit group composed of K bits to select active areas of said first to Nth memory array basic units, said second bit group being higher in order than said first bit group.

16. The semiconductor device according to claim 1, wherein said memory array includes
   first to Nth memory array basic units, where N=2^K, K being a pre-set positive integer not less than 2, said device including:
   a row decoder configured to decode a lower-side first bit group of an X address to select a row of said memory array basic unit; and
   a column decoder,
   said column decoder and said row decoder configured to decode a fraction of K bits higher in order than the lower order bit group and remaining fraction thereof to select access areas of said first to Nth memory array basic units.

17. The semiconductor device according to claim 1, wherein said first buffer circuit includes:
   a first three-state buffer configured to receive said address/control signals from said first bus to control transmission/non-transmission to a succeeding side of said first bus to which an output of said first three-state buffer is coupled to, in accordance with an enable control signal supplied and an address space selection logic signal; and
   a latch circuit configured to latch the output of said first three-state buffer.

18. The semiconductor device according to claim 1, wherein said second buffer circuit includes:
   a first three-state buffer configured to receive said write data from said second bus to control transmission/non-transmission to a succeeding side of said second bus to which an output of said first three-state buffer is coupled to, in accordance with a write enable control signal and an address space selection logic;
   a second three-state buffer configured to receive said read data from said succeeding side of said second bus to which the output of said first three-state buffer is coupled to, said second three-state buffer controlling transmission/non-transmission to a preceding side of said second bus in accordance with a read enable control signal and an address space selection logic signal; and
   a latch circuit configured to latch the output of said first three-state buffer.

* * * * *